(12) United States Patent
Xu et al.

(10) Patent No.: US 12,424,172 B2
(45) Date of Patent: Sep. 23, 2025

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Guanghua Xu, Beijing (CN); Lu Bai, Beijing (CN); Xiaodong Chu, Beijing (CN); Shihsyong Huang, Beijing (CN); Yulong Wei, Beijing (CN); Daiying Zhang, Beijing (CN); Taofeng Xie, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/558,748

(22) PCT Filed: Dec. 21, 2022

(86) PCT No.: PCT/CN2022/140692
§ 371 (c)(1),
(2) Date: Nov. 3, 2023

(87) PCT Pub. No.: WO2024/130591
PCT Pub. Date: Jun. 27, 2024

(65) Prior Publication Data
US 2025/0104645 A1 Mar. 27, 2025

(51) Int. Cl.
*G09G 3/32* (2016.01)
*G09G 3/3266* (2016.01)

(52) U.S. Cl.
CPC ... *G09G 3/3266* (2013.01); *G09G 2300/0404* (2013.01); *G09G 2300/0426* (2013.01);
(Continued)

(58) Field of Classification Search
CPC ......... G09G 3/3266; G09G 2310/0286; G09G 2310/0281; G09G 2300/0404;
(Continued)

(56) References Cited

U.S. PATENT DOCUMENTS 11,900,884 B2 * 2/2024 Zeng ................... H10K 71/00
11,915,657 B2 * 2/2024 Li ........................... G11C 19/28
(Continued)

FOREIGN PATENT DOCUMENTS

CN 108761941 A 11/2018
CN 109148479 A 1/2019
(Continued)

OTHER PUBLICATIONS

Qing Chang, "Study on Key Technologies of Mobile Phone Display Screen with TFT-LCD Narrow Boarder", cnki.net, Issue 4, 2020.

*Primary Examiner* — Liliana Cerullo
(74) *Attorney, Agent, or Firm* — Ling Wu; Stephen Yang; Ling and Yang Intellectual Property

(57) ABSTRACT

A display substrate and a display apparatus. The display substrate includes a base substrate and a drive circuit layer provided on the base substrate. The base substrate includes a display region (100) and a non-display region (200), the drive circuit layer includes a pixel drive circuit (PE) located in the display region, a gate drive circuit located in the non-display region and at least one initial power supply line extending at least partially in a first direction (D1). The gate drive circuit is configured to provide a drive signal to the pixel drive circuit, and the initial power supply line is configured to provide an initial signal to the pixel drive circuit. An orthographic projection of at least one of the at least one initial power supply line on the base substrate is at least partially overlapped with an orthographic projection of the gate drive circuit on the base substrate.

19 Claims, 27 Drawing Sheets

(52) U.S. Cl.
CPC ............... *G09G 2300/0439* (2013.01); *G09G 2300/0809* (2013.01); *G09G 2310/0281* (2013.01); *G09G 2310/0286* (2013.01)

(58) Field of Classification Search
CPC ... G09G 2300/0426; G09G 2300/0439; G09G 2300/0809
See application file for complete search history.

(56) References Cited

U.S. PATENT DOCUMENTS

| | | | |
|---|---|---|---|
| 2020/0052005 A1* | 2/2020 | Yoshida | H01L 23/522 |
| 2022/0262309 A1 | 8/2022 | Zhang et al. | |
| 2022/0319422 A1 | 10/2022 | Li | |
| 2023/0141543 A1 | 5/2023 | Gu et al. | |
| 2024/0153460 A1* | 5/2024 | Park | H10K 59/351 |
| 2024/0185776 A1* | 6/2024 | Chen | G09G 3/3266 |

FOREIGN PATENT DOCUMENTS

| | | |
|---|---|---|
| CN | 111489698 A | 8/2020 |
| CN | 113362770 A | 9/2021 |
| CN | 113410277 A | 9/2021 |
| CN | 114005411 A | 2/2022 |
| CN | 114026629 A | 2/2022 |
| CN | 114420049 A | 4/2022 |
| JP | 2004-287345 A | 10/2004 |

\* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2022/140692 having an international filing date of Dec. 21, 2022, the content of which is hereby incorporated by reference in its entirety.

TECHNICAL FIELD

The present disclosure relates to, but is not limited to, the field of display technologies, in particular to a display substrate and a display apparatus.

BACKGROUND

An Organic Light Emitting Diode (OLED) and a Quantum-dot Light Emitting Diode (QLED) are active light emitting display devices and have advantages such as self-luminescence, a wide viewing angle, a high contrast, low power consumption, an extremely high response speed, lightness and thinness, flexibility, and a low cost. With constant development of display technology, a flexible display apparatus (Flexible Display) in which an OLED or a QLED is used as a light emitting device and signal control is performed through a Thin Film Transistor (TFT) has become a mainstream product in the field of display at present.

SUMMARY

The following is a summary of subject matter described herein in detail. The summary is not intended to limit the protection scope of claims.

In a first aspect, the present disclosure provides a display substrate, including a base substrate and a drive circuit layer arranged on the base substrate, wherein the base substrate includes a display region and a non-display region, and the drive circuit layer includes a pixel drive circuit located in the display region, a gate drive circuit located in the non-display region, and at least one initial power supply line which extends at least partially along a first direction.

The gate drive circuit is configured to provide a drive signal to the pixel drive circuit, and the initial power supply line is configured to provide an initial signal to the pixel drive circuit.

An orthographic projection of at least one of the at least one initial power supply line on the base substrate is at least partially overlapped with an orthographic projection of the gate drive circuit on the base substrate.

In an exemplary implementation, the gate drive circuit includes a plurality of drive circuits arranged along a second direction, and the first direction intersects with the second direction.

An orthographic projection of the at least one initial power supply line on the base substrate is at least partially overlapped with an orthographic projection of a drive circuit, close to the display region, of a plurality of drive circuits on the base substrate.

In an exemplary implementation, the pixel drive circuit includes a light emitting transistor and a writing transistor, and the plurality of drive circuits includes a light emitting drive circuit and a scan drive circuit, wherein the light emitting drive circuit is electrically connected to the light emitting transistor, and the scan drive circuit is electrically connected to the writing transistor and is located on a side of the light emitting drive circuit close to the display region. An orthographic projection of the at least one initial power supply line on the base substrate is at least partially overlapped with an orthographic projection of the scan drive circuit on the base substrate.

In an exemplary implementation, the pixel drive circuit includes a light emitting transistor, a writing transistor, and a control transistor, and the plurality of drive circuits include a light emitting drive circuit, a scan drive circuit, and a control drive circuit, wherein the light emitting drive circuit is electrically connected to the light emitting transistor, the scan drive circuit is electrically connected to the writing transistor, the control drive circuit is electrically connected to the control transistor, and the writing transistor and the control transistor have opposite transistor types; and the light emitting drive circuit and the control drive circuit are located on a side of the scan drive circuit away from the display region. An orthographic projection of the at least one initial power supply line on the base substrate is at least partially overlapped with an orthographic projection of the scan drive circuit on the base substrate.

In an exemplary implementation, at least one initial power supply line includes a first initial power supply line to an N-th initial power supply line, where N is a positive integer greater than or equal to 1. When N is greater than or equal to 2, N initial power supply lines are arranged along the second direction, and an orthographic projection of K adjacent initial power supply lines away from the display region on the base substrate is at least partially overlapped with an orthographic projection of the scan drive circuit on the base substrate, wherein K is a positive integer less than or equal to N.

In an exemplary implementation, the drive circuit layer further includes a first clock signal line, a second clock signal line, a first initial signal line, a first power supply line, and a second power supply line, which are located in the non-display region, wherein the first clock signal line, the second clock signal line, the first initial signal line, the first power supply line, and the second power supply line extend at least partially along the first direction.

The scan drive circuit is electrically connected with the first clock signal line, the second clock signal line, the first power supply line, the second power supply line and the first initial signal line, respectively.

The second clock signal line is located on a side of the first clock signal line away from the display region, the second power supply line is located on a side of the first clock signal line close to the display region, the first initial signal line is located on a side of the second power supply line close to the display region, the first power supply line is located on a side of the first initial signal line close to the display region, and the at least one initial power supply line is located on a side of the first power supply line close to the display region.

In an exemplary implementation, the drive circuit layer further includes a second initial signal line located in the non-display region, and the second initial signal line extends at least partially along the first direction.

The light emitting drive circuit is electrically connected with the second initial signal line, and the second initial signal line is located between the second power supply line and the first initial signal line.

In an exemplary implementation, the drive circuit layer further includes a first output signal line and a second output signal line which are located in the non-display region, and the first output signal line and the second output signal line extend at least partially along the second direction.

The first output signal line is located on a side of the scan drive circuit close to the display region and is electrically connected with the scan drive circuit and the pixel drive circuit, respectively.

The second output signal line passes through the scan drive circuit, and is electrically connected to the pixel drive circuit and one of the light emitting drive circuit and the control drive circuit, respectively.

In an exemplary implementation, the drive circuit layer further includes a first output connection line and a second output connection line located in the display region and the non-display region, and the first output connection line and the second output connection line extend at least partially along the second direction.

The first output connection line is electrically connected with the first output signal line and the pixel drive circuit, respectively.

The second output connection line is electrically connected with the second output signal line and the pixel drive circuit, respectively.

In an exemplary implementation, when N=2, the drive circuit layer further includes a third output connection line and a fourth output connection line, and the third output connection line and the fourth output connection line extend at least partially along the second direction.

The third output connection line is electrically connected with the first initial power supply line and the pixel drive circuit, respectively.

The fourth output connection line is electrically connected with a second initial power supply line and the pixel drive circuit, respectively.

In an exemplary implementation, a boundary of the display region includes an arc-shaped boundary, and a non-display region located outside the arc-shaped boundary is referred to as a rounded corner region.

The scan drive circuit includes a plurality of scan shift registers and a plurality of dummy scan shift registers, wherein the plurality of scan shift registers are cascaded, and the plurality of dummy scan shift registers are interspersed between the plurality of scan shift registers.

At least a part of the plurality of dummy scan shift registers are located in the rounded corner region.

In an exemplary implementation, the scan shift register may include a plurality of transistors and a plurality of capacitors.

An orthographic projection of the initial supply line, which is overlapped with the scan drive circuit, on the base substrate is at least partially overlapped with an orthographic projection of the plurality of capacitors on the base substrate.

In an exemplary implementation, a distance between a boundary of an initial power supply line, which is overlapped with the scan drive circuit, away from the display region and the display region is less than a distance between a boundary of at least one of the plurality of capacitors away from the display region and the display region.

In an exemplary implementation, a number of transistors in the dummy scan shift register is less than or equal to a number of transistors in the scan shift register; and a width of the dummy scan shift register is less than or equal to a width of the scan shift register.

In an exemplary implementation, a distance between a boundary of the second clock signal line, located on a side of the dummy scan shift register, away from the display region and a boundary, close to the display region, of an initial power supply line, close to the display region, of the at least one initial power supply line is less than a distance between a boundary of the second clock signal line, located on a side of the scan shift register, away from the display region and a boundary, close to the display region, of the initial power supply line, close to the display region, of the at least one initial power supply line.

In an exemplary implementation, the drive circuit layer includes a semiconductor layer, a first conductive layer, a second conductive layer, a third conductive layer, and a fourth conductive layer that are sequentially stacked.

The semiconductor layer at least includes active layers of a plurality of transistors.

The first conductive layer at least includes control electrodes of the plurality of transistors and first electrode plates of a plurality of capacitors.

The second conductive layer at least includes second electrode plates of the plurality of capacitors, a first output signal line and a third output signal line.

The third conductive layer at least includes a second power supply line, a first electrode and second electrode of at least one transistor, and a fourth output signal line.

The fourth conductive layer at least includes the first initial signal line, a second initial signal line, and the first power supply line.

In an exemplary implementation, the drive circuit layer further includes a fifth conductive layer located on a side of the fourth conductive layer away from the base substrate.

The fifth conductive layer at least includes a first output connection line, a second output connection line, a third output connection line and a fourth output connection line.

In an exemplary implementation, the initial power supply line is of a single-layer structure, and the initial power supply line is located in the fourth conductive layer.

In an exemplary implementation, the initial power supply line includes a first initial sub-segment and a second initial sub-segment connected to each other, and an orthographic projection of the first initial sub-segment on the base substrate is at least partially overlapped with an orthographic projection of the second initial sub-segment on the base substrate.

The first initial sub-segment is located in the third conductive layer, and the second initial sub-segment is located in the fourth conductive layer.

In an exemplary implementation, the first clock signal line and the second clock signal line are of a single-layer structure, and the first clock signal line and the second clock signal line are located in the fourth conductive layer.

In an exemplary implementation, a clock signal line includes a first clock sub-segment and a second clock sub-segment connected to each other, wherein the clock signal line includes a first clock signal line and a second clock signal line, and an orthographic projection of the first clock sub-segment on the base substrate is at least partially overlapped with an orthographic projection of the second clock sub-segment on the base substrate.

The first clock sub-segment is located in the third conductive layer, and the second clock sub-segment is located at a side of the fourth conductive layer close to the base substrate.

In an exemplary implementation, the second output signal line is of a single-layer structure, and the second output signal line is located in the second conductive layer.

In an exemplary implementation, the drive circuit layer further includes a sixth conductive layer between the second conductive layer and the third conductive layer.

The second output signal line includes a plurality of first output sub-segments and a plurality of second output sub-segments, wherein adjacent first output sub-segments are electrically connected through a second output sub-segment, adjacent second output sub-segments are electrically connected through the first output sub-segment, an orthographic projection of a second output sub-segment on the base substrate is at least partially overlapped with an orthographic projection of a first output sub-segment connected electrically to the second output sub-segment on the base substrate, and an orthographic projection of a first output sub-segment on the base substrate is at least partially overlapped with an orthographic projection of a second output sub-segment connected electrically to the second output sub-segment on the base substrate.

The first output sub-segments are located in the second conductive layer, and the second output sub-segments are located in the sixth conductive layer.

In a second aspect, the present disclosure also provides a display apparatus, including the above display substrate.

Other aspects may be understood upon the drawings and detailed description are read and understood.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure, but do not constitute limitations on the technical solutions of the present disclosure. Shapes and sizes of various components in the drawings do not reflect actual scales, but are only intended to schematically illustrate contents of the present disclosure.

DETAILED DESCRIPTION

Figure 1A:
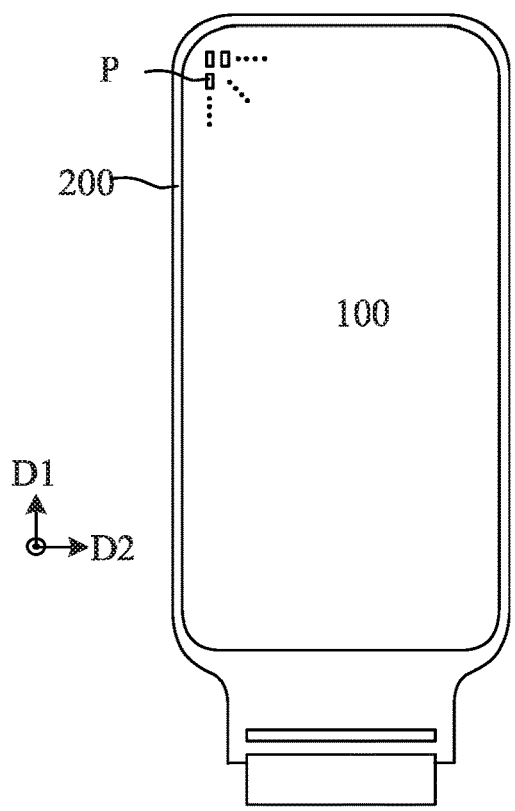
FIG. 1A is a schematic diagram of a structure of a display substrate.

To make objectives, technical solutions, and advantages of the present disclosure clearer, embodiments of the present disclosure will be described in detail with reference to the accompanying drawings. It is to be noted that implementations may be practiced in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict. In order to keep the following description of the embodiments of the present disclosure clear and concise, detailed descriptions of part of known functions and known components are omitted in the present disclosure. The drawings in the embodiments of the present disclosure relate only to the structures involved in the embodiments of the present disclosure, and other structures may be described with reference to conventional designs.

Scales of the drawings in the present disclosure may be used as a reference in actual processes, but are not limited thereto. For example, a width-length ratio of a channel, thicknesses and spacings of various film layers, and widths and spacings of various signal lines may be adjusted according to actual needs. The number of pixels in the display substrate and the number of sub-pixels in each pixel are not limited to the numbers shown in the drawings. The drawings described in the present disclosure are schematic structural diagrams only, and one implementation of the present disclosure is not limited to the shapes, numerical values or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection; it may be a mechanical connection or an electrical connection; and it may be a direct mutual connection, or an indirect connection through middleware, or an internal communication between two elements. Those of ordinary skills in the art may understand specific meanings of these terms in the present disclosure according to specific situations.

In the specification, a transistor refers to an element which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode; or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchanged. Therefore, the "source electrode" and the "drain electrode" are interchangeable in the specification.

In the specification, "electrical connection" includes a case in which constituent elements are connected together through an element with a certain electrical effect. The "element with a certain electrical effect" is not particularly limited as long as electrical signals may be sent and received between the connected constituent elements. Examples of the "element with a certain electrical effect" not only include electrodes and wirings, but also include switch elements such as transistors, resistors, inductors, capacitors, other elements with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

In this specification, "being arranged in a same layer" refers to a structure formed by patterning two (or more than two) structures through a same patterning process, and their materials may be the same or different. For example, materials of precursors forming a plurality of structures arranged in a same layer are the same, and resultant materials may be the same or different.

In the present disclosure, "about" refers to that a boundary is defined not so strictly and numerical values within process and measurement error ranges are allowed.

A display substrate has advantages of a high resolution, a high reaction speed, high brightness, and a high aperture ratio, etc., and has a wide application prospect. In order to obtain a better visual experience, a narrow bezel is a main development direction of display. A drive circuit is arranged in the display substrate to drive a pixel drive circuit to emit light, thereby achieving display. For the display substrate, a narrow bezel cannot be achieved.

Figure 1B:
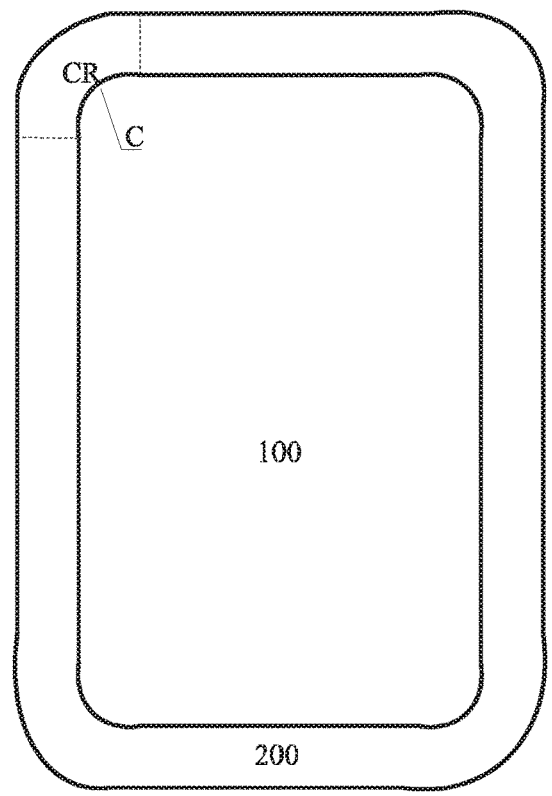
FIG. 1B is a schematic diagram of a region division of a display substrate.
Figure 2:
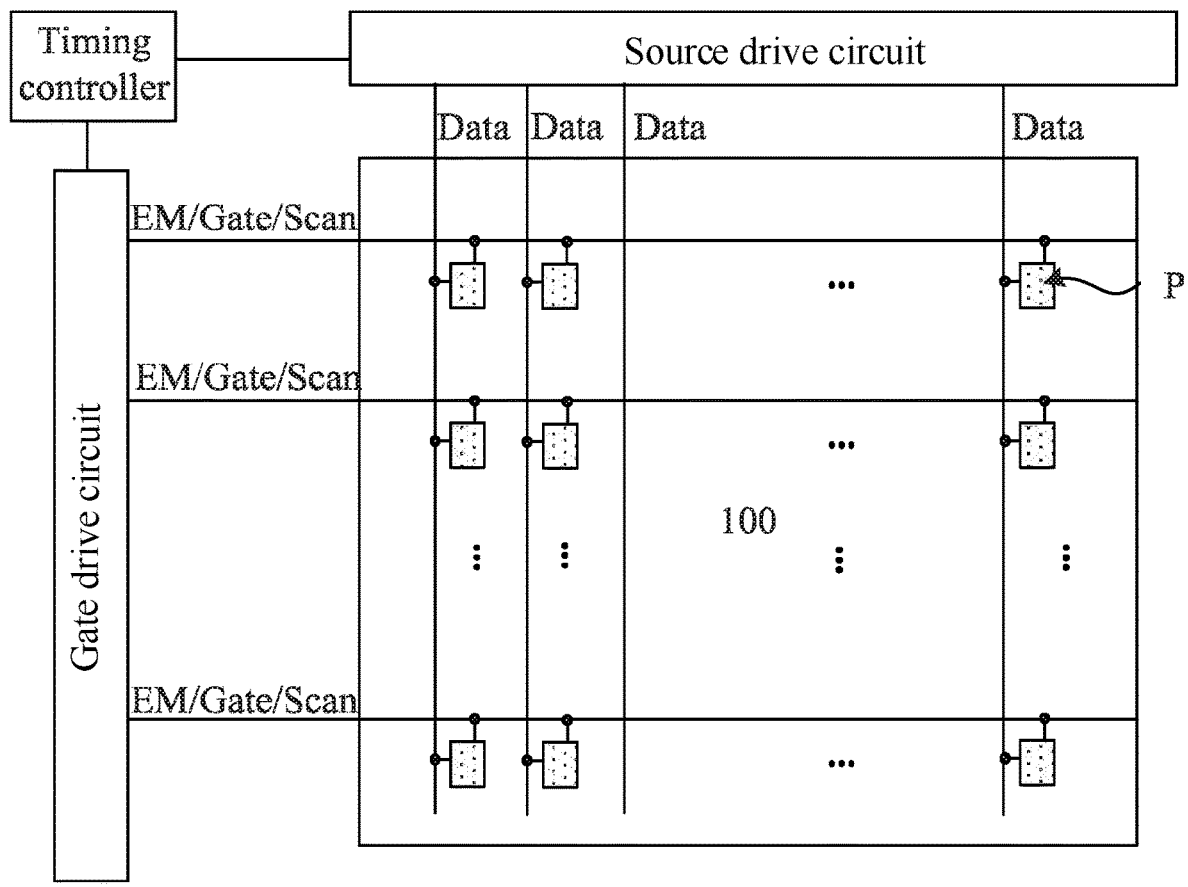
FIG. 2 is a schematic diagram of a structure of another display substrate.

FIG. 1A is a schematic diagram of a structure of a display substrate, FIG. 1B is a schematic diagram of a region division of a display substrate, and FIG. 2 is a schematic diagram of a structure of another display substrate. As shown in FIG. 1A, FIG. 1B, and FIG. 2, the display substrate may include a display region 100 and a non-display region 200, wherein a boundary of the display region 100 includes at least one arc-shaped boundary C, and the non-display region includes a rounded corner region CR located outside the arc-shaped boundary C.

In an exemplary implementation, a shape of the boundary of the display region may be a rectangle with rounded corners, which is not limited in the present disclosure.

The display substrate according to the present disclosure may achieve a function of bending four sides at a large angle, improving a wrinkling problem of module attaching, and improving a yield of products.

In an exemplary implementation, as shown in FIG. 1A and FIG. 2, the display region may include pixel units P arranged in an array, wherein at least one pixel unit includes at least three sub-pixels, and at least one sub-pixel includes a pixel drive circuit and a light emitting device. A pixel drive circuit is electrically connected with the light emitting device located in the same sub-pixel and is arranged to drive the light emitting device to emit light.

In an exemplary implementation, the pixel unit may include a red (R) sub-pixel, a green (G) sub-pixel and a blue (B) sub-pixel, or may include a red sub-pixel, a green sub-pixel, a blue sub-pixel and a white sub-pixel, which is not limited in the present disclosure.

In an exemplary implementation, a shape of a sub-pixel in a pixel unit may be a rectangle, a rhombus, a pentagon, or a hexagon. When the pixel unit includes three sub-pixels, the three sub-pixels may be arranged side by side horizontally, side by side vertically, or in the form of " "; and when the pixel unit includes four sub-pixels, the four sub-pixels may be arranged side by side horizontally, side by side vertically, or in the shape of a square, which is not limited in the present disclosure.

In an exemplary implementation, the light emitting devices may be organic light emitting diodes (OLEDs) or quantum dot light emitting diodes (QLEDs). The OLED may include a first electrode (anode), an organic light emitting layer and a second electrode (cathode) that are stacked.

In an exemplary implementation, the organic emitting layer may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL) that are stacked. In an exemplary implementation, hole injection layers of all sub-pixels may be a common layer connected together, electron injection layers of all the sub-pixels may be a common layer connected together, hole transport layers of all the sub-pixels may be a common layer connected together, electron transport layers of all the sub-pixels may be a common layer connected together, hole block layers of all the sub-pixels may be a common layer connected together, emitting layers of adjacent sub-pixels may be overlapped slightly or may be isolated from each other, and electron block layers of adjacent sub-pixels may be overlapped slightly or may be isolated from each other.

In an exemplary implementation, as shown in FIG. 1A, the non-display region 200 may include a bonding region located on a side of the display region 100, and a bezel region located at other sides of the display region 100.

In an exemplary implementation, the bonding region may include a lead region, a bending region, and a composite circuit region that are arranged sequentially along a direction away from the display region, wherein the lead region is connected to the display region 100, the bending region is connected to the lead region, and the composite circuit region is connected to the bending region.

In an exemplary implementation, the lead region may be provided with a plurality of lead-out lines. Ends of a part of the plurality of lead-out lines are correspondingly connected to a plurality of data fanout lines in the display region 100, and ends of another part of the plurality of lead-out lines are correspondingly connected to a plurality of data lines in the display region 100, and the other ends of the plurality of lead-out lines go through the bending region to be connected to an integrated circuit of the composite circuit region, so that the integrated circuit applies data signals to the data lines through the lead-out lines and the data fanout lines.

In an exemplary implementation, the bending region may be bent with a curvature, so that a surface of the composite circuit region may be turned over, that is, a surface of the composite circuit region facing upwards may be changed to face downwards by the bending of the bending region. In an exemplary implementation, when the bending region is bent, the composite circuit region may be overlapped with the display region 100.

In an exemplary implementation, the composite circuit region may include an electrostatic prevention region, a drive chip region, and a bonding pin region. An Integrated Circuit (IC) may be bonded to the drive chip region for connection, and a Flexible Printed Circuit (FPC) may be bonded to the bonding pin region for connection.

In an exemplary implementation, the integrated circuit may generate a drive signal required for driving sub-pixels, and may provide the drive signal to the sub-pixels in the display region 100. For example, the drive signal may be the data signal that drives a luminance of the sub-pixels. In an exemplary implementation, the integrated circuit may be bonded to the drive chip region through an anisotropic conductive film or otherwise means. In an exemplary implementation, the bonding pin region may be provided with bonding pads including a plurality of pins, and the flexible circuit board may be bonded to the bonding pads.

In an exemplary implementation, as shown in FIG. 2, the display substrate may include a timing controller, a data drive circuit, a gate drive circuit, and a pixel array, wherein the timing controller is connected to the data drive circuit and the gate drive circuit, respectively, the data drive circuit is connected to data signal lines Data, respectively, and the gate drive circuit is connected with gate lines, which may include one or more of a light emitting signal line EM, a scan signal line Gate, or a control signal line Scan. The pixel drive circuit may be connected to the gate line and the data signal line, respectively.

In an exemplary implementation, the timing controller may provide a gray-scale value and a control signal suitable for a specification of the data drive circuit to the data drive circuit, provide a clock signal, a start signal, etc., suitable for a specification of the gate drive circuit to the gate drive circuit, and provide a clock signal, an emission stop signal, etc., suitable for a specification of the light emitting drive circuit to the light emitting drive circuit. The data drive circuit may generate a data voltage to be provided to the data signal line by using the gray-scale value and control signal received from the timing controller. For example, the data drive circuit may sample the gray-scale value using a clock signal, and apply a data voltage corresponding to the gray-scale value to the data signal line by taking a pixel row as a unit.

In an exemplary implementation, the gate drive circuit may generate a scan signal to be provided to the gate line by the clock signal, the start signal, or the like, received from the timing controller. For example, the gate drive circuit may sequentially provide signals with on-level pulses to gate lines. For example, the gate drive circuit may be constructed in a form of a shift register, and may generate a scan signal by sequentially transmitting the start signal provided in a form of an on-level pulse to a next stage circuit under control of the clock signal.

In an exemplary implementation, the pixel drive circuit may have a structure of 3T1C, 4T1C, 5T1C, 5T2C, 6T1C, 7T1C, or 8T1C.

Figure 3A:
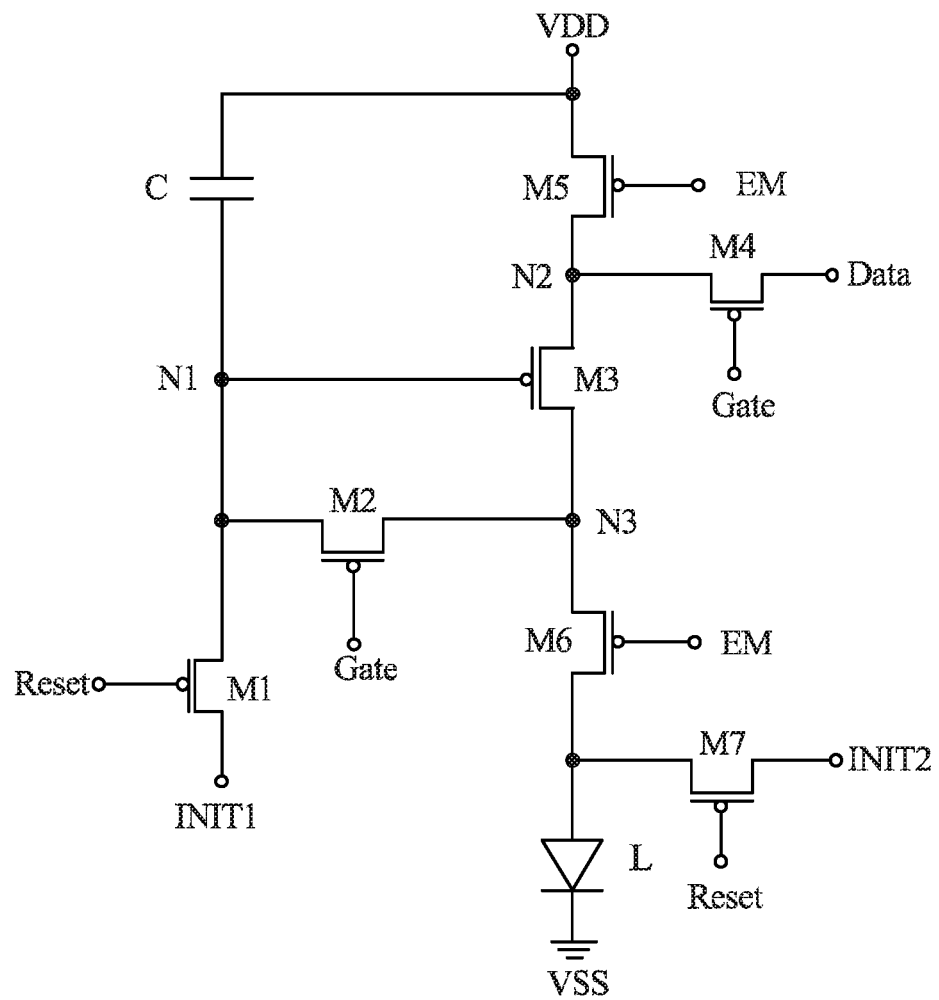
FIG. 3A is an equivalent circuit diagram of a pixel drive circuit.

In an exemplary implementation, FIG. 3A is an equivalent circuit schematic of a pixel drive circuit. As shown in FIG. 3A, the pixel drive circuit may include seven transistors (a first transistor M1 to a seventh transistor M7), one capacitor C and eight signal lines (a data signal line D, a scan signal line Gate, a reset signal line Reset, a light emitting signal line EM, a first initial signal line INIT1, a second initial signal line INIT2 and a high-level power supply line VDD and a low-level power supply line VSS).

As shown in FIG. 3A, a first electrode plate of the capacitor C is connected with the high-level power supply line VDD, and a second electrode plate of the capacitor C is connected with a first node N1. A control electrode of the first transistor M1 is connected with the reset signal line Reset, a first electrode of the first transistor M1 is connected with the first initial signal line INIT1, and a second electrode of the first transistor is connected with the first node N1. A control electrode of the second transistor M2 is connected with the scan signal line Gate, a first electrode of the second transistor M2 is connected with the first node N1, and a second electrode of the second transistor M2 is connected with a second node N2. A control electrode of the third transistor M3 is connected with the first node N1, a first electrode of the third transistor M3 is connected with the second node N2, and a second electrode of the third transistor M3 is connected with a third node N3. A control electrode of the fourth transistor M4 is connected with a scan signal line GATE, a first electrode of the fourth transistor M4 is connected with a data signal line Data, and a second electrode of the fourth transistor M4 is connected with the second node N2. A control electrode of the fifth transistor M5 is connected with the light emitting signal line EM, a first electrode of the fifth transistor M5 is connected with the high-level power supply line VDD, and a second electrode of the fifth transistor M5 is connected with the second node N2. A control electrode of the sixth transistor M6 is connected to the light emitting signal line EM, a first electrode of the sixth transistor M6 is connected to the third node N3, and a second electrode of the sixth transistor M6 is connected to a first electrode of the light emitting device L. A control electrode of the seventh transistor M7 is connected to the reset signal line Reset or the scan signal line Gate, a first electrode of the seventh transistor M7 is connected to the second initial signal line INIT2, a second electrode of the seventh transistor M7 is connected to the first electrode of the light emitting device L, and a second electrode of the light emitting device is connected to the low-level power supply line VSS. FIG. 3A is illustrated by taking the control electrode of the seventh transistor M7 and the reset signal line Reset as an example.

In an exemplary implementation, the first transistor M1 may be referred to as a node reset transistor, and when an effective level signal is input to the reset signal line Reset, the first transistor M1 transmits an initialization voltage to the first node N1 to initialize a charge amount of the first node N1.

In an exemplary implementation, the second transistor M2 may be referred to as a compensation transistor, and when an effective level signal is input to the control signal line SL, the second transistor M2 transmits a signal of the second node N2 to the first node N1 to compensate a signal of the first node N1.

In an exemplary implementation, the third transistor M3 may be referred to as a drive transistor, and the third transistor M3 determines a drive current flowing between the high-level power supply line VDD and the low-level power supply line VSS according to a potential difference between the control electrode and the first electrode.

In an exemplary implementation, the fourth transistor M4 may be referred to as a writing transistor, and when an effective level signal is input to the scan signal line Gate, the fourth transistor M4 enables a data voltage of the data signal line Data to be input to the third node N3.

In an exemplary implementation, the fifth transistor M5 and the sixth transistor M6 may be referred to as light emitting transistors. When an effective level signal is input to the light emitting signal line EM, the fifth transistor M5 and the sixth transistor M6 enable the light emitting light to emit light by forming a path of a drive current between the high-level power supply line VDD and the low-level power supply line VSS.

In an exemplary implementation, the seventh transistor M7 may be referred to as an anode reset transistor. When an effective level signal is input to the reset signal line Reset or the scan signal line Reset, the seventh transistor M7 transmits an initialization voltage to the first electrode of the light emitting device L to initialize charges of the first electrode of the light emitting device L.

In an exemplary implementation, a signal of the high-level power supply line VDD is a high-level signal continuously provided, and a signal of the low-level power supply line VSS is a low-level signal.

Distinguished by transistor characteristics, transistors may be divided into N-type transistors and P-type transistors. When the transistor is a P type transistor, its turn-on voltage is a low-level voltage (e.g., 0V, −5V, −10V or other suitable voltages) and its turn-off voltage is a high-level voltage (e.g., 5V, 10V or other suitable voltages). When the transistor is an N type transistor, its turn-on voltage is a high-level voltage (e.g., 5V, 10V or other suitable voltages) and its turn-off voltage is a low-level voltage (e.g., 0V, −5V, −10V or other suitable voltages).

In an exemplary implementation, the first transistor M1 to the seventh transistor M7 may be P-type transistors, or may be N-type transistors. Use of the same type of transistors in the pixel drive circuit may simplify a process flow, reduce process difficulty of a display panel, and improve the product yield. In some possible implementations, the first transistor M1 to the seventh transistor M7 may include P type transistors and N type transistors.

In an exemplary implementation, for the first transistor M1 to the seventh transistor M7, low temperature poly-silicon thin film transistors may be adopted, or oxide thin film transistors may be adopted, or both a low temperature poly-silicon thin film transistor and an oxide thin film transistor may be adopted. An active layer of a low temperature poly-silicon thin film transistor may be made of Low Temperature Poly-Silicon (LTPS for short), and an active layer of an oxide thin film transistor may be made of an oxide semiconductor (Oxide). The low temperature poly-silicon thin film transistor has advantages, such as a high migration rate, and fast charging. The oxide thin film transistor has advantages such as a low drain current. The low temperature poly-silicon thin film transistor and the oxide thin film transistor are integrated on one display substrate to form a Low Temperature Polycrystalline Oxide (LTPO for short) display substrate, so that advantages of the low temperature poly-silicon thin film transistor and the oxide thin film transistor can be utilized, low-frequency drive can be realized, power consumption can be reduced, and display quality can be improved.

In an exemplary embodiment, when the display substrate is an LTPO display substrate, the first transistor T1 and the second transistor T2 may be N-type transistors, and the remaining transistors are P-type transistors. When the display substrate is an LTPS display substrate, the first transistor M1 to the seventh transistor M7 are P-type transistors.

In an exemplary implementation, when the display substrate is an LTPO display substrate and the first transistor T1 and the second transistor T2 are N-type transistors, the first transistor T1 and the second transistor T2 may also be referred to as control transistors, and similarly, the N-type transistors in the pixel drive circuit may be referred to as control transistors.

Figure 3B:
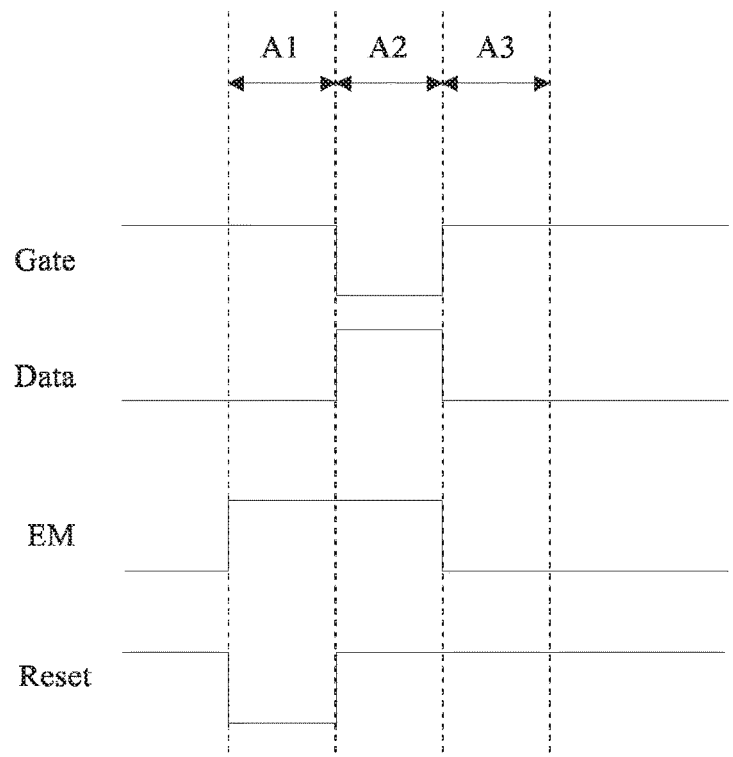
FIG. 3B is a working timing diagram of the pixel drive circuit provided in FIG. 3A.

FIG. 3B is a working timing diagram of the pixel drive circuit provided in FIG. 3A, and FIG. 3B is illustrated by taking a case in which the transistors in FIG. 3A are all P-type transistors as an example. Exemplary embodiments of the present disclosure are described below with reference to a working process of the pixel drive circuit illustrated in FIG. 3B. In an exemplary implementation, the working process of the pixel drive circuit may include following stages A1 to A3.

In a first stage A1, which is referred to as a reset stage, signals of a scan signal line Gate and a light emitting signal line EM are both high-level signals, and a signal of a reset signal line Reset is a low-level signal. The signal of the reset signal line Reset is a high-level signal, so that the first transistor M1 is turned on, a signal of the first initial signal line INIT1 is provided to the first node N1, the capacitor C is initialized, and an original data voltage in the storage capacitor C is cleared, the seventh transistor M7 is turned on, an initial voltage of the second initial signal line INIT2 is provided to the first electrode of the light emitting device L, the first electrode of the light emitting device L is initialized (reset), and a pre-stored voltage inside the light emitting device L is cleared up and initialization is completed. The signals of the scan signal line Gate and the light emitting signal line EM are the high-level signals, so that the second transistor M2, the fourth transistor M4, the fifth transistor M5, and the sixth transistor T6 are turned off, and in this stage, the light emitting device L does not emit light.

In a second stage A2, referred to as a data writing stage or a threshold compensation stage, the scan signal line Gate is a low-level signal, signals of the light emitting signal line EM and the reset signal line Reset are high-level signals, and the data signal line Data outputs a data voltage. In this stage, since a signal at the first node N1 is a low-level signal, the third transistor M3 is turned on. The signal of the scan signal line Gate is the low-level signal, so that the second transistor M2 and the fourth transistor M4 are turned on, which enables the data voltage output from the data signal line Data to be provided to the first node N1 through the second node N2, the turned-on third transistor M3, the third node N3 and the turned-on second transistor M2, and a difference between the data voltage output by the data signal line Data and a threshold voltage of the third transistor M3 to be charged into the capacitor C until a voltage of the first node N1 is Vd−|Vth| to ensure that the emitting device L does not emit light, wherein Vd is the data voltage output by the data signal line Data, and Vth is the threshold voltage of the third transistor M3. The signal of the reset signal line Reset is a high-level signal, and the first transistor M1 is turned off. The signal of the light emitting signal line EM is the high-level signal, and the fifth transistor M5 and the sixth transistor M6 are turned off.

In a third stage A3, referred to as a light emitting stage, signals of the scan signal line Gate and the reset signal line Reset are high-level signals, and a signal of the light emitting signal line EM is a low-level signal. The signal of the light emitting signal line EM is a low-level signal, so that the fifth transistor M5 and the sixth transistor M6 are turned on, and a power supply voltage output by the high-level power supply line VDD provides a drive voltage to the first electrode of the light emitting device L through the turned-on fifth transistor M5, third transistor M3, and sixth transistor M6 to drive the light emitting device L to emit light.

In a drive process of the pixel drive circuit, a drive current flowing through the third transistor M3 (a drive transistor) is determined by a voltage difference between the control electrode and the first electrode. Since the voltage of the first node N1 is Vd−|Vth|, the drive current of the third transistor M3 is as follows:

$$I = K*(Vgs - Vth)^2 = K*[(Vdd - Vd + |Vth|) - Vth]^2 = K*[(Vdd - Vd)]^2$$

Herein, I is the drive current flowing through the third transistor M3, that is, the drive current for driving an OLED, K is a constant, Vgs is the voltage difference between the control electrode and the first electrode of the third transistor M3, Vth is the threshold voltage of the third transistor M3, Vd is the data voltage output by the data signal line Data, and Vdd is the power supply voltage output by the high-level power supply line VDD.

Figure 4A:
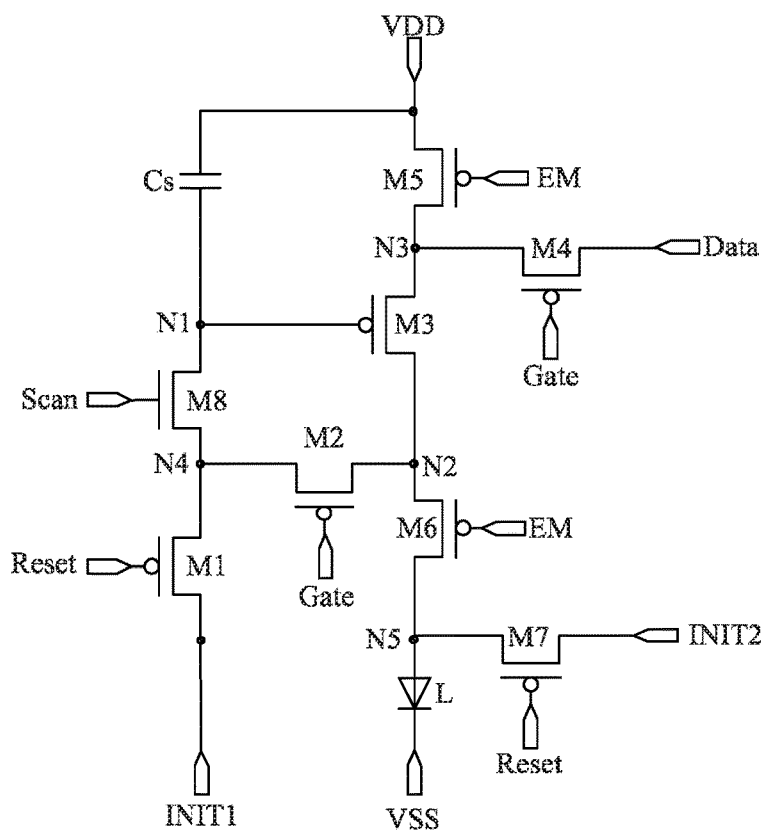
FIG. 4A is an equivalent circuit diagram of another pixel drive circuit.

In an exemplary implementation, FIG. 4A is an equivalent circuit diagram of another pixel drive circuit. As shown in FIG. 4A, the pixel drive circuit may include eight transistors (a first transistor M1 to an eighth transistor M8), one capacitor C and nine signal lines (a data signal line Data, a control signal line Scan, a scan signal line Gate, a reset signal line Reset, a light emitting signal line EM, a first initial signal line INIT1, a second initial signal line INIT2, a high-level power supply line VDD and a low-level power supply line VSS).

In an exemplary implementation, the pixel drive circuit provided in FIG. 4A is suitable for an LTPO display substrate.

In an exemplary implementation, a first electrode plate of the capacitor C is connected with the high-level power supply line VDD, and a second electrode plate of the capacitor C is connected with the first node N1. A control electrode of the first transistor M1 is connected to the reset signal line Reset, a first electrode of the first transistor M1 is connected to the first initial signal line INIT1, and a second electrode of the first transistor is connected to the fourth node N4. A control electrode of the second transistor M2 is connected with the scan signal line Gate, a first electrode of the second transistor M2 is connected with the fourth node N4, and a second electrode of the second transistor M2 is connected with the second node N2. A control electrode of the third transistor M3 is connected with the first node N1, a first electrode of the third transistor M3 is connected with a second node N2, and a second electrode of the third transistor M3 is connected with the third node N3. A control electrode of the fourth transistor M4 is connected with the scan signal line Gate, a first electrode of the fourth transistor M4 is connected with the data signal line Data, and a second electrode of the fourth transistor M4 is connected with the third node N3. A control electrode of the fifth transistor M5 is connected to the light emitting signal line EM, a first electrode of the fifth transistor M5 is connected to the high-level power supply line VDD, and a second electrode of the fifth transistor M5 is connected to the third node N3. A control electrode of the sixth transistor M6 is connected with the light emitting signal line EM, a first electrode of the sixth transistor M6 is connected with the second node N2, and a second electrode of the sixth transistor M6 is connected with a first electrode of a light emitting device L. A control electrode of the seventh transistor M7 is connected with the reset signal line Reset, a first electrode of the seventh transistor M7 is connected with the second initial signal line INIT2, a second electrode of the seventh transistor M7 is connected with the first electrode of the light emitting device L, and a second electrode of the light emitting device L is connected with the low-level power supply line VSS. A control electrode of the eighth transistor M8 is connected with the control signal line SCAN, a first electrode of the eighth transistor M8 is connected with the first node N1, and a second electrode of the eighth transistor M8 is connected with the fourth node N4.

In an exemplary implementation, the control electrode of the seventh transistor M7 may also be connected to the scan signal line Gate, the first electrode of the seventh transistor M7 is connected to the second initial signal line INIT2, the second electrode of the seventh transistor M7 is connected to the first electrode of the light emitting device L, and the second electrode of the light emitting device L is connected to the low-level power supply line VSS.

In an exemplary implementation, the first transistor M1 may be referred to as a node reset transistor, and when an effective level signal is input to the reset signal line RESET, the first transistor M1 transmits an initialization voltage to the first node N1 to initialize a charge amount of the first node N1.

In an exemplary implementation, the eighth transistor M8 may be referred to as a compensation reset transistor, and when an effective level signal is input to the control signal line Scan, the eighth transistor M8 transmits a signal of the fourth node N4 to the first node N1, which may not only initialize a charge amount of the first node, but also perform threshold compensation on the third transistor M3.

In an exemplary implementation, the second transistor M2 may be referred to as a compensation transistor, and when an effective level signal is input to the scan signal line Gate, the second transistor M2 enables a signal of the second node N2 to be written into the fourth node N4.

In an exemplary implementation, the third transistor M3 may be referred to as a drive transistor. The third transistor M3 determines a drive current flowing between the high-level power supply terminal VDD and the low-level power supply terminal VSS according to a potential difference between the control electrode and the first electrode of the third transistor T3.

In an exemplary implementation, the fourth transistor M4 may be referred to as a writing transistor, and when an effective level signal is input into the scan signal line GATE, the fourth transistor M4 enables the data voltage of the data signal line Data to be input to the pixel drive circuit.

In an exemplary implementation, the fifth transistor M5 and the sixth transistor M6 may be referred to as light emitting transistors. When an effective level signal is input to the light emitting signal line EM, the fifth transistor M5 and the sixth transistor M6 enable the light emitting device to emit light by forming a path of a drive current between the high-level power supply line VDD and the low-level power supply line VSS.

In an exemplary implementation, the seventh transistor M7 may be referred to as an anode reset transistor. When an effective level signal is input to the reset signal line Reset or the scan signal line Reset, the seventh transistor M7 transmits the initialization voltage to the first electrode of the light emitting device L to initialize charges of the first electrode of the light emitting device L.

In an exemplary implementation, a signal of the high-level power supply line VDD is a high-level signal continuously provided, and a signal of the low-level power supply line VSS is a low-level signal.

In an exemplary implementation, the eighth transistor M8 is a metal oxide transistor, and is an N-type transistor, and the first transistor M1 to the seventh transistor M7 are low-temperature poly-silicon transistors and are P-type transistors.

In an exemplary implementation, the eighth transistor M8 may be referred to as a control transistor.

In an exemplary implementation, the eighth transistor M8 is an oxide transistor, which can reduce a leakage current, improve performance of the pixel drive circuit, and reduce power consumption of the pixel drive circuit.

Figure 4B:
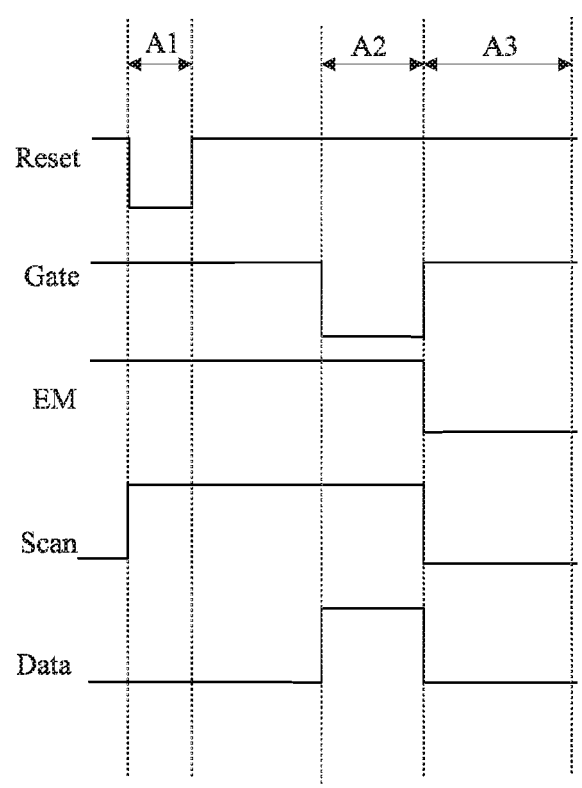
FIG. 4B is a working timing diagram of the pixel drive circuit provided in FIG. 4A.

FIG. 4B is a working timing diagram of the pixel drive circuit provided in FIG. 4A. Exemplary embodiments of the present disclosure are described below with reference to a working process of the pixel drive circuit illustrated in FIG. 4B. The working process of the pixel drive circuit may include the following stages.

In the first stage A1, referred to as a reset stage, signals of the control signal line Scan, the light emitting signal line EM, and the scan signal line Gate are all high-level signals, and a signal of the reset signal line Reset is a low-level signal. The signal of the reset signal line Reset is a low-level signal, so that the first transistor M1 is turned on, and a signal of the first initial signal line INIT1 is provided to the fourth node N4, the seventh transistor M7 is turned on, an initial voltage of the second initial signal line INIT2 is provided to the first electrode of the light emitting device L, and the first electrode of the light emitting device L is initialized (reset), for example, a pre-stored voltage inside the light emitting device L is cleared up, and initialization is completed to ensure that the light emitting device L does not emit light. The signal of the control signal line Scan is a high level signal, so that the eighth transistor M8 is turned on, the signal of the fourth node N4 is provided to the first node N1 to initialize the capacitor C, and the original data voltage in the capacitor C is cleared. The signals of the scan signal line Gate and the light emitting signal line EM are high-level signals, so that the second transistor M2, the fourth transistor M4, the fifth transistor M5, the sixth transistor M6 and the seventh transistor M7 are turned off, and the light emitting device L does not emit light in this stage.

In a second stage A2, referred to as a data writing stage or a threshold compensation stage, the signal of the scan signal line Gate is a low-level signal, signals of the reset signal line Reset, the light emitting signal line EM and the control signal line Scan are high-level signals, and the data signal line Data outputs a data voltage. In this stage, since the first node N1 is a low-level signal, so the third transistor M3 is turned on. The signal of the scan signal line Gate is a low-level signal, so that the second transistor M2 and the fourth transistor M4 are turned on. The signal of the control signal line Scan is a high-level signal, so that the eighth transistor M8 is turned on. The second transistor M2, the fourth transistor M4, and the eighth transistor M8 are turned on, so that a data voltage output from the data signal line Data is provided to the first node N1 through the third node N3, the turned-on third transistor M3, a second node N2, the turned-on second transistor M2, the fourth node N4, and the turned-on eighth transistor M8, and a difference between the data voltage output by the data signal line Data and a threshold voltage of the third transistor M3 is charged into the capacitor C until a voltage of the first node N1 is Vd−|Vth|, wherein Vd is the data voltage output by the data signal line Data, and Vth is the threshold voltage of the third transistor M3. The signal of the reset signal line Reset is a low-level signal, so that the first transistor M1 and the seventh transistor M7 are turned off. The signal of the light emitting signal line EM is a high-level signal, so that the fifth transistor M5 and the sixth transistor M6 are turned off.

In a third stage A3, referred to as a light emitting stage, signals of the control signal line Scan and the light emitting signal line EM are both low-level signals, and signals of the scan signal line Gate and the reset signal line Reset are high-level signals. The signal of the reset signal line Reset is a low-level signal, and the first transistor M1 and the seventh transistor M7 are turned off. The signal of the control signal line SCAN is a low-level signal, and the signals of the scan signal line GATE and the reset signal line Reset are high-level signals, so that the second transistor M2, the fourth transistor M4 and the eighth transistor M8 are turned off. The signal of the light emitting signal line EM is a low-level signal, so that the fifth transistor M5 and the sixth transistor M6 are turned on, and a power supply voltage output by the high-level power supply terminal VDD provides a drive voltage to the first electrode of the light emitting device L through the turned-on fifth transistor M5, third transistor M3, and sixth transistor M6 to drive the light emitting device L to emit light.

In a drive process of the pixel drive circuit, a drive current flowing through the third transistor M3 (a drive transistor) is determined by a voltage difference between the control electrode and the first electrode. Since the voltage of the first node N1 is Vd−|Vth|, the drive current of the third transistor M3 is as follows:

$$I = K*(Vgs - Vth)^2 = K*[(Vdd - Vd + |Vth|) - Vth]^2 = K*[(Vdd - Vd)]^2$$

Herein, I is a drive current flowing through the third transistor M3, that is, a drive current for driving the light emitting device L, K is a constant, Vgs is a voltage difference between the control electrode and the first electrode of the third transistor M3, Vth is a threshold voltage of the third transistor M3, Vd is a data voltage output by the data signal line Data, and Vdd is a power supply voltage output by the high-level power supply terminal VDD.

Figure 5A:
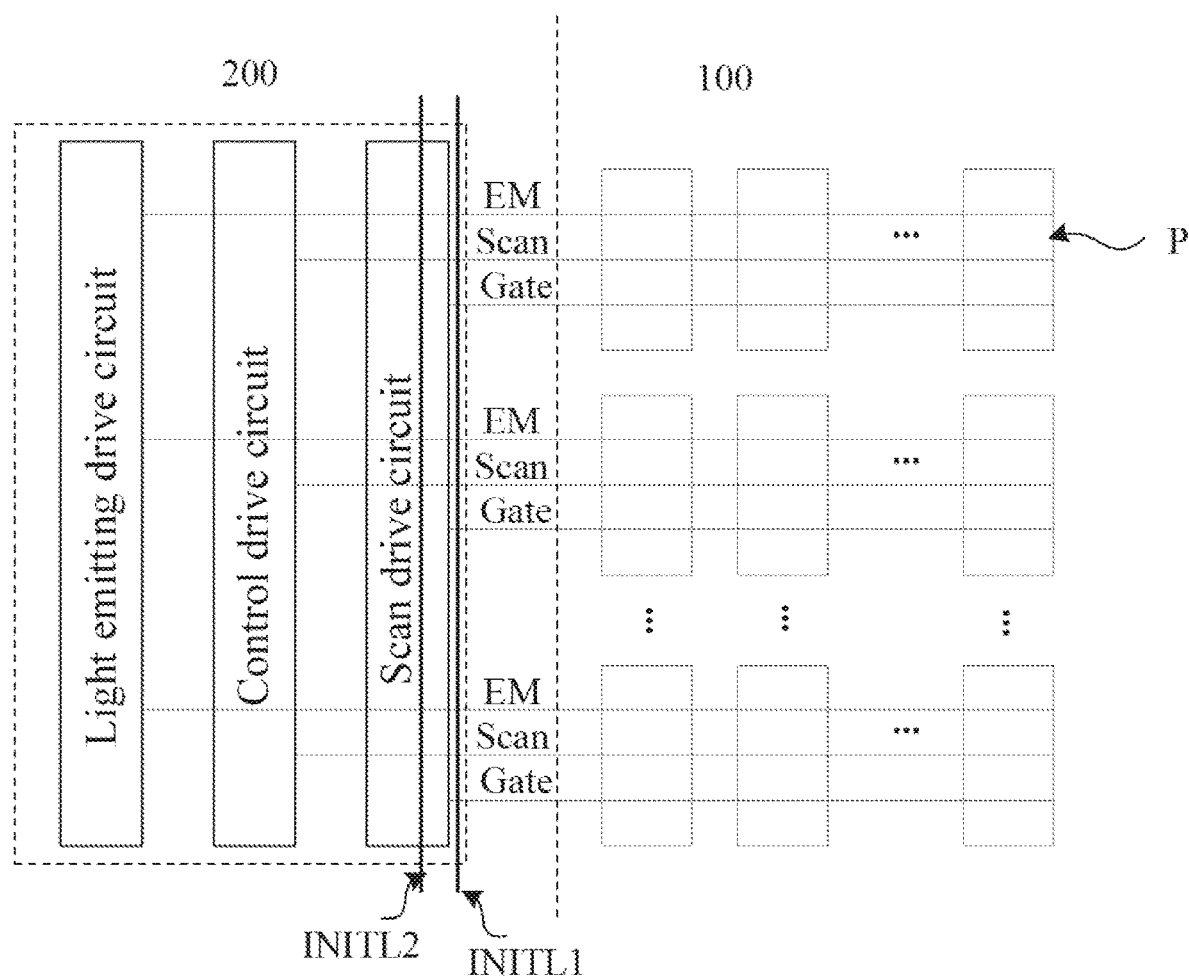
FIG. 5A is a first schematic diagram of a structure of a display substrate according to an embodiment of the present disclosure.
Figure 5B:
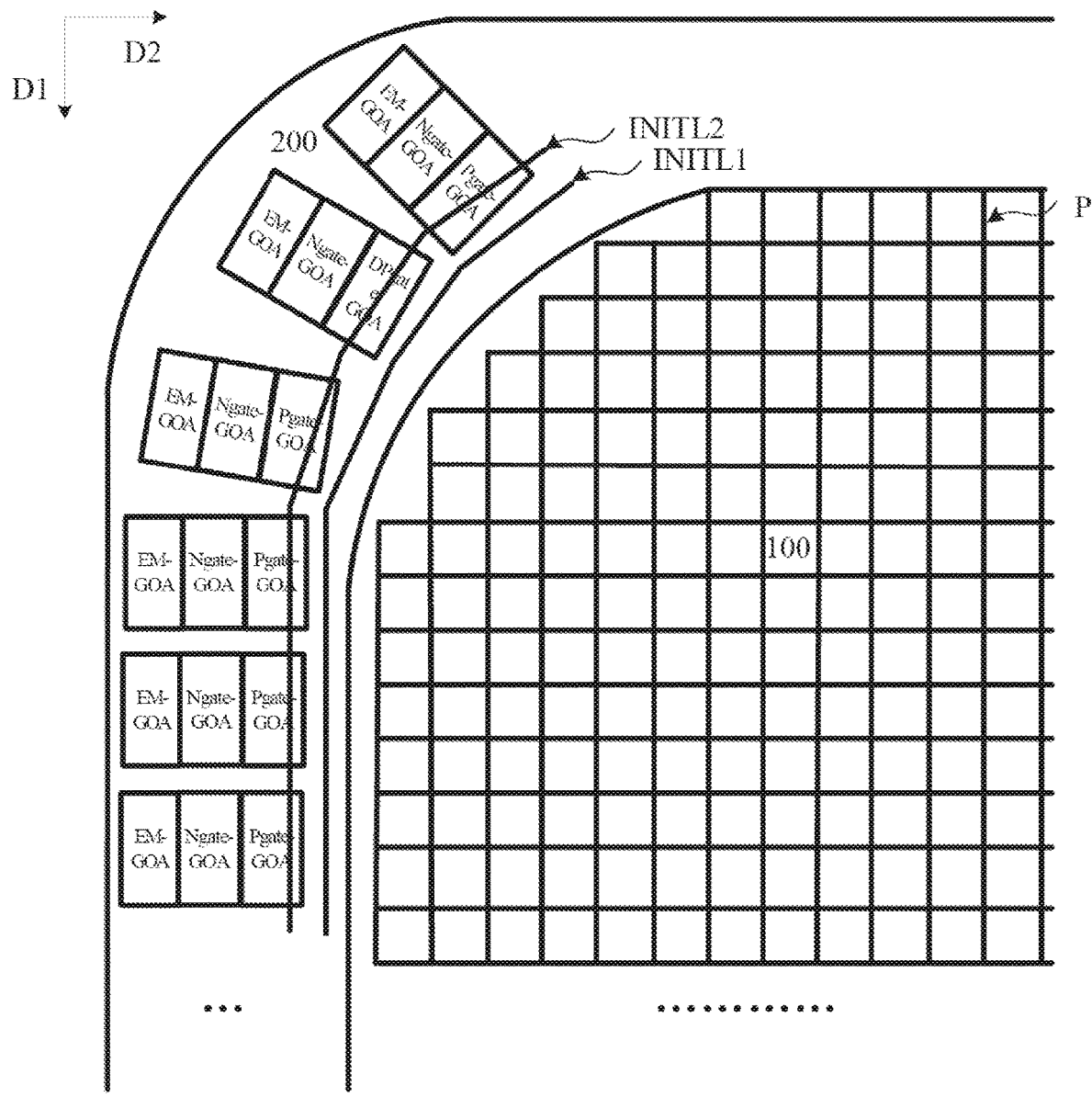
FIG. 5B is a partial schematic diagram of the display substrate provided in FIG. 5A.
Figure 6A:
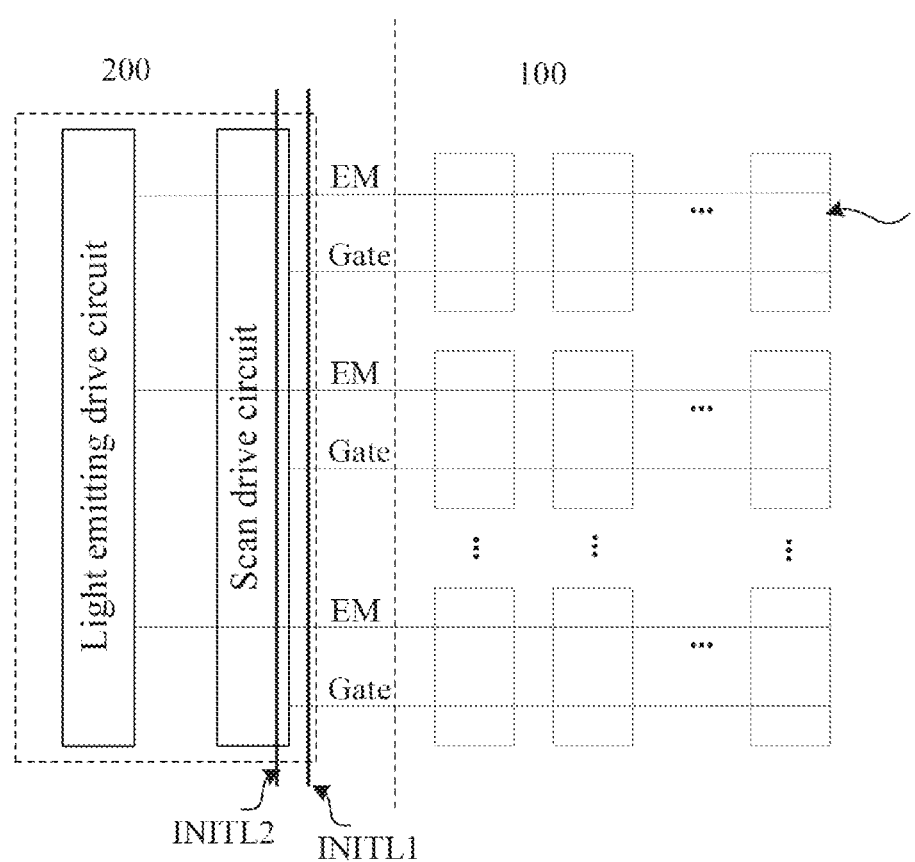
FIG. 6A is a second schematic diagram of a structure of a display substrate according to an embodiment of the present disclosure.
Figure 6B:
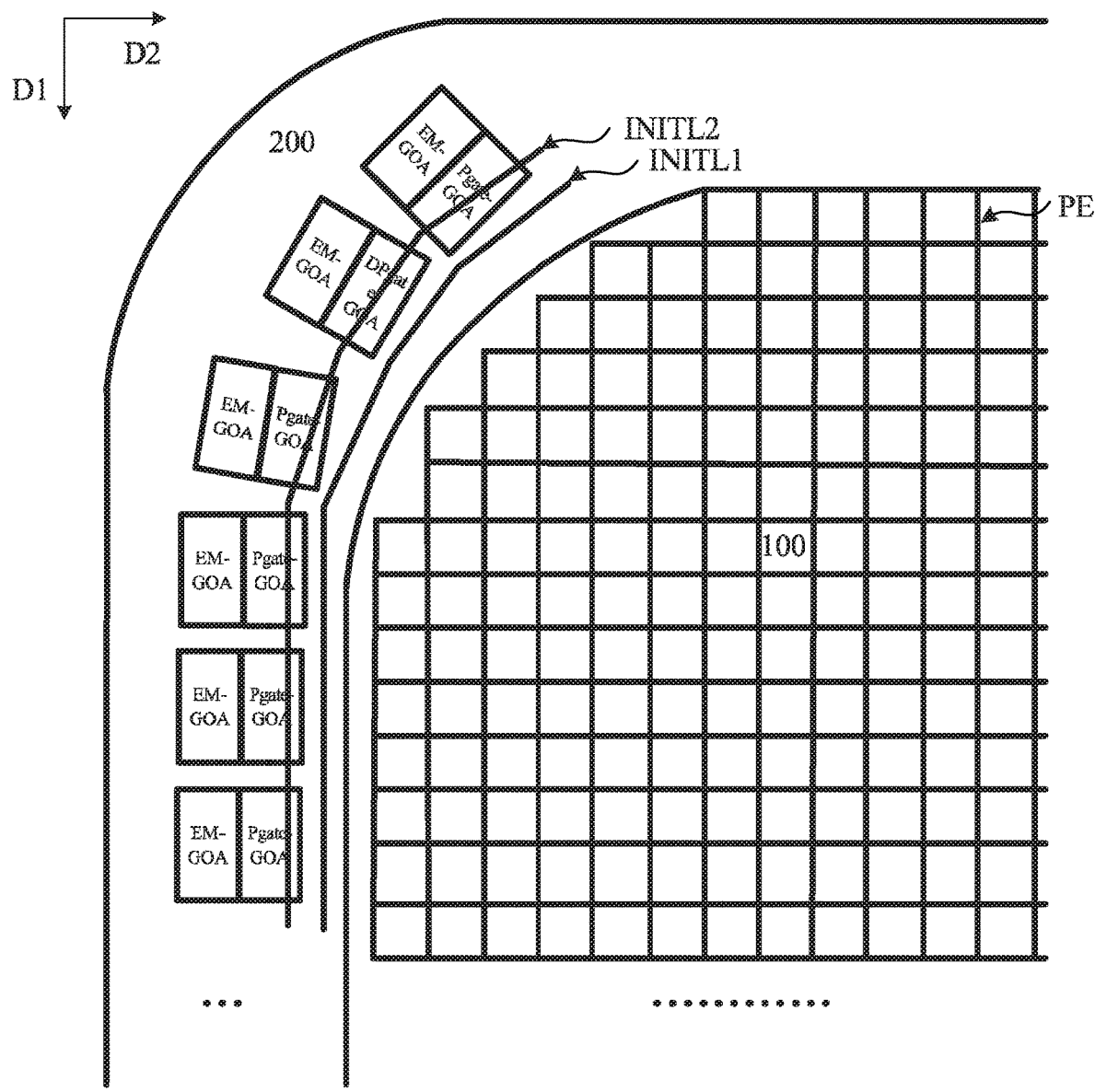
FIG. 6B is a partial schematic diagram of the display substrate provided in FIG. 6A.

FIG. 5A is a first schematic diagram of a structure of a display substrate according to an embodiment of the present disclosure, FIG. 5B is a partial schematic diagram of the display substrate provided in FIG. 5A, FIG. 6A is a second schematic diagram of a structure of a display substrate according to an embodiment of the present disclosure, and FIG. 6B is a partial schematic diagram of the display substrate provided in FIG. 6A. As shown in FIG. 5A, FIG. 5B, FIG. 6A and FIG. 6B, the display substrate provided by embodiments of the present disclosure may include a base substrate, and a drive circuit layer arranged on the base substrate, wherein the base substrate may include a display region 100 and a non-display region 200, and the drive circuit layer may include a pixel drive circuit PE located in the display region 100, a gate drive circuit located in the non-display region 200, and at least one initial power supply line extending at least partially along the first direction D1.

In an exemplary implementation, at least one initial power supply line includes the first initial power supply line to the N-th initial power supply line, wherein N is a positive integer greater than or equal to 1; and when N is greater than or equal to 2, N initial power supply lines are arranged along the second direction D2. FIG. 5A, FIG. 5B, FIG. 6A and FIG. 6B are illustrated by taking two initial power supply lines, which are the first initial power supply line INITL1 and the second initial power supply line INITL2, respectively, as an example.

In an exemplary implementation, the gate drive circuit is configured to provide a drive signal to the pixel drive circuit P, and the initial power supply line is configured to provide an initial signal to the pixel drive circuit.

In an exemplary implementation, an orthographic projection of at least one initial power supply line on the base substrate is at least partially overlapped with an orthographic projection of the gate drive circuit on the base substrate, and FIG. 5A, FIG. 5B, FIG. 6A and FIG. 6B are illustrated by taking a case in which the second initial power supply line INITL2 is overlapped with the gate drive circuit as an example.

In an exemplary implementation, the base substrate may be a rigid substrate or a flexible substrate, wherein the rigid substrate may be, but is not limited to, one or more of glass and metal foil; the flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary implementation, the display substrate may be a Low Temperature Polycrystalline Oxide (LTPO) display substrate or a Low Temperature Poly Silicon (LTPS) display substrate.

In an exemplary implementation, the drive circuits in the display substrate may be classified as two, three or more, which depends on the structure of the display substrate, and is not limited in the present disclosure.

In an exemplary implementation, the light emitting devices may be organic light emitting diodes (OLEDs) or quantum dot light emitting diodes (QLEDs).

In an exemplary implementation, the display region includes a first side and a second side arranged opposite to each other, and the gate drive circuit may be located on the first side and/or the second side of the display region. FIG.

5A and FIG. 6A are illustrated by taking a case in which the gate drive circuit is located on a side of the display region as an example.

In an exemplary implementation, the drive circuit layer may further include at least one initial signal line located at least partially in the display region, wherein the initial signal line may extend at least partially along the second direction, the at least one initial signal line corresponds to the at least one initial power supply line in a one-to-one relationship, and the initial signal line is electrically connected to the corresponding initial power supply line.

In an exemplary implementation, the display substrate may further include a light emitting structure layer arranged on a side of the drive circuit layer away from the base substrate, and an encapsulation structure layer arranged on a side of the light emitting structure layer away from the base substrate. In some possible implementations, the display substrate may include other film layers, such as a touch structure layer, etc., which is not limited here in the present disclosure.

In an exemplary implementation, the light emitting structure layer may include an anode, a pixel definition layer, an organic light emitting layer and a cathode 304, wherein the anode is connected with the pixel drive circuit through a via hole, the organic light emitting layer is connected with the anode, the cathode is connected with the organic light emitting layer, and the organic light emitting layer emits light of a corresponding color under the drive of the anode and the cathode.

In an exemplary implementation, the encapsulation structure layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is provided between the first encapsulation layer and the third encapsulation layer, which may ensure that external water vapor cannot enter the light emitting structure layer.

In an exemplary implementation, the touch structure layer may include a first touch insulation layer arranged on the encapsulation structure layer, a first touch metal layer arranged on the first touch insulation layer, a second touch insulation layer covering the first touch metal layer, a second touch metal layer 44 arranged on the second touch insulation layer, and a touch protective layer covering the second touch metal layer. The first touch metal layer may include a plurality of bridge electrodes, the second touch metal layer may include a plurality of first touch electrodes and second touch electrodes, and the first touch electrodes or second touch electrodes may be connected to the bridge electrodes through via holes.

In the present disclosure, an orthographic projection of at least one initial power supply line on the base substrate is at least partially overlapped with an orthographic projection of the gate drive circuit on the base substrate, which can reduce an area occupied by the bezel region of the display substrate to achieve a narrow frame.

In an exemplary implementation, the gate drive circuit may include a plurality of drive circuits arranged along a second direction, and the first direction intersects with the second direction. An orthographic projection of the at least one initial power supply line on the base substrate is at least partially overlapped with an orthographic projection of a drive circuit, close to the display region, of a plurality of drive circuits on the base substrate.

In an exemplary implementation, a positional relationship of the plurality of drive circuits may be determined according to a structure and function of the display substrate, which is not limited in the present disclosure.

In an exemplary implementation, the drive circuit may include a plurality of cascaded shift registers.

In an exemplary implementation, as shown in FIG. 6A and FIG. 6B, the pixel drive circuit includes a light emitting transistor and a writing transistor. The plurality of drive circuits may include a light emitting drive circuit and a scan drive circuit, wherein the light emitting drive circuit is electrically connected to the light emitting transistor, and the scan drive circuit is electrically connected to the writing transistor and is located on a side of the light emitting drive circuit close to the display region 100. In this case, an orthographic projection of at least one initial power supply line on the base substrate is at least partially overlapped with an orthographic projection of the scan drive circuit on the base substrate. FIG. 6A and FIG. 6B are illustrated by taking a case in which the second initial power supply line INITL2 is overlapped with the scan drive circuit as an example.

In an exemplary implementation, the light emitting drive circuit may include a plurality of cascaded light emitting shift registers EM-GOA, and the scan drive circuit may include a plurality of scan shift registers Pgate-GOA and a plurality of dummy scan shift registers DPgate-GOA.

In an exemplary implementation, the drive circuit layer may further include a light emitting signal line and a scan signal line which are located at least partially in the display region. The light emitting shift register is electrically connected to the pixel drive circuit through the light emitting signal line, the scan shift register is electrically connected to the pixel drive circuit through the scan signal line, and the dummy scan shift register is not electrically connected to the scan signal line.

In an exemplary implementation, as shown in FIG. 5A and FIG. 5B, the pixel drive circuit includes a light emitting transistor, a writing transistor and a control transistor. The plurality of drive circuits include a light emitting drive circuit, a scan drive circuit, and a control drive circuit. The light emitting drive circuit is electrically connected to the light emitting transistor, the scan drive circuit is electrically connected to the writing transistor, the control drive circuit is electrically connected to the control transistor, and the writing transistor and the control transistor have opposite transistor types; and the light emitting drive circuit and the control drive circuit are located on a side of the scan drive circuit away from the display region. An orthographic projection of the at least one initial power supply line on the base substrate is at least partially overlapped with an orthographic projection of the scan drive circuit on the base substrate. FIG. 6A and FIG. 6B are illustrated by taking a case in which the second initial power supply line INITL2 is overlapped with the scan drive circuit as an example.

In an exemplary implementation, the control transistor may be an N-type transistor in the pixel drive circuit.

In an exemplary implementation, the light emitting drive circuit may be located a side of the drive circuit close to the display region, or may be located on a side of the control drive circuit away from the display region, and in FIG. 5A and FIG. 5B, the light emitting drive circuit is located on a side of the control drive circuit away from the display region.

In an exemplary implementation, as shown in FIG. 6B, the light emitting drive circuit may include a plurality of cascaded light emitting shift registers EM-GOA, the control drive circuit may include a plurality of cascaded control shift registers Ngate-GOA, and the scan drive circuit may include a plurality of scan shift registers Pgate-GOA and a plurality of dummy scan shift registers DPgate-GOA.

In an exemplary implementation, as shown in FIG. 5B and FIG. 6B, the plurality of scan shift registers Pgate-GOA are cascaded, the plurality of DPgate-GOA dummy scan shift registers are interspersed between the plurality of scan shift registers Pgate-GOA, and the plurality of dummy scan shift registers are located at least partially in the rounded corner region.

In an exemplary implementation, orthographic projections of K adjacent initial power supply lines away from the display region on the base substrate are at least partially overlapped with an orthographic projection of the scan drive circuit on the base substrate, wherein K is a positive integer less than or equal to N. Exemplarily, the orthographic projections of the first initial power supply line and second initial power supply line on the base substrate may be both at least partially overlapped with the orthographic projection of the scan drive circuit on the base substrate.

In an exemplary implementation, the scan shift register or the dummy scan shift register may include a plurality of transistors and a plurality of capacitors, and the circuit structure of the scan shift register or the dummy scan shift register may be 8T2C, which is not limited in this disclosure.

Figure 7A:
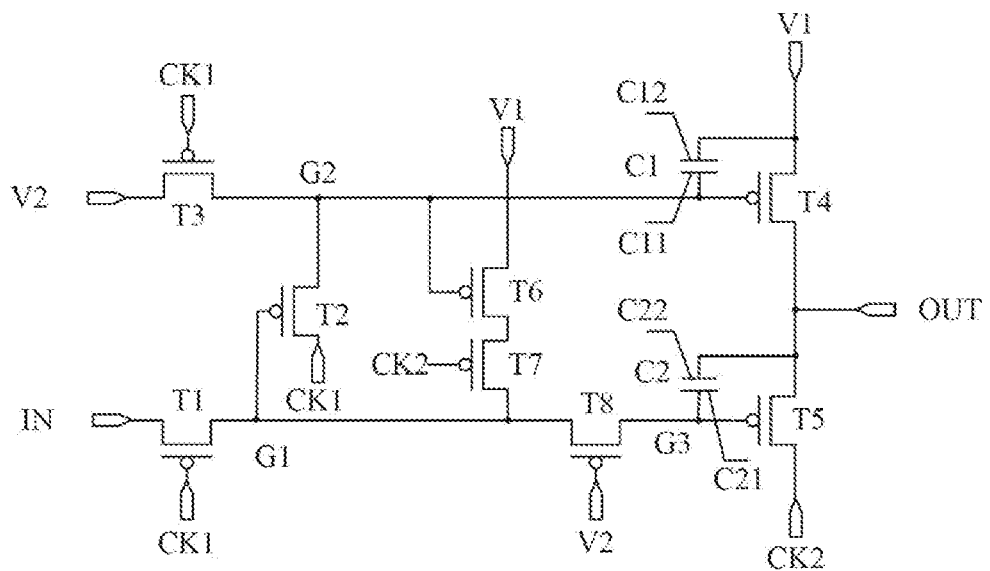
FIG. 7A is an equivalent circuit diagram of a shift register in a display substrate.
Figure 7B:
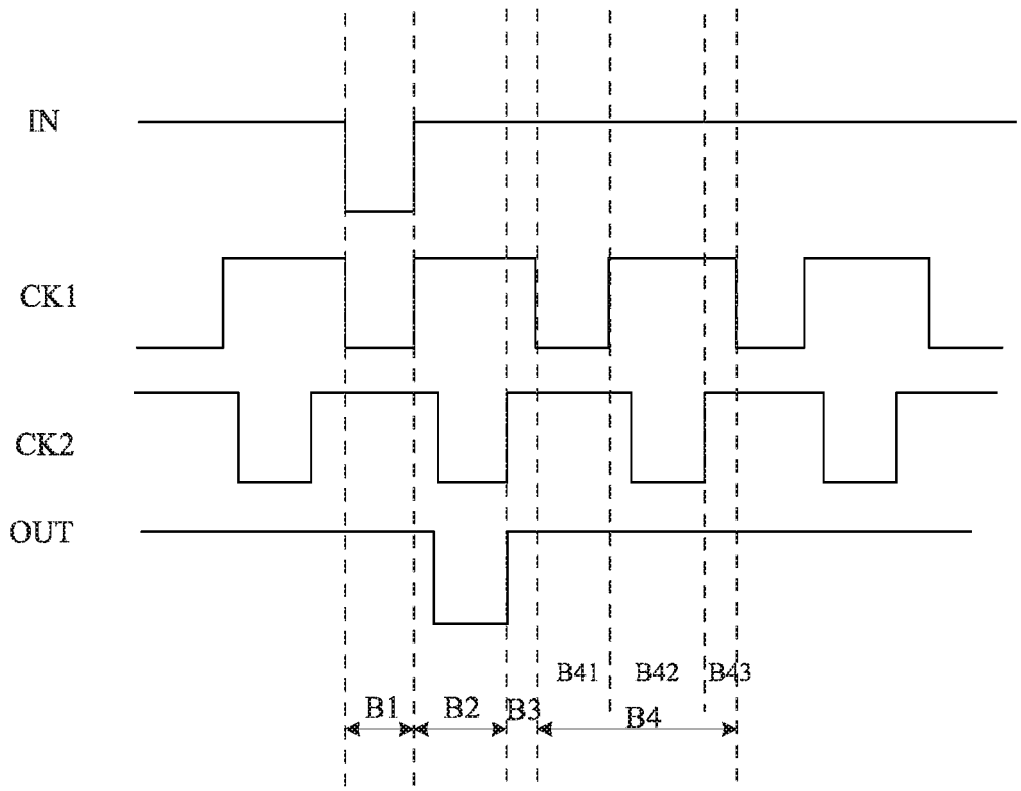
FIG. 7B is a timing diagram of the shift register provided by FIG. 7A.

FIG. 7A is an equivalent circuit diagram of a shift register in a display substrate, and FIG. 7B is a timing diagram of the shift register provided in FIG. 7A, which may be a scan shift register or a dummy scan shift register. As shown in FIG. 7A, the shift register includes a first transistor T1 to an eighth transistor T8, a first capacitor C1 and a second capacitor C2.

In an exemplary implementation, a control electrode of the first transistor T1 is electrically connected to a first clock signal terminal CK1, a first electrode of the first transistor T1 is electrically connected to an input terminal IN, and a second electrode of the first transistor T1 is electrically connected to a first node G1; a control electrode of the second transistor T2 is electrically connected to the first node G1, a first electrode of the second transistor T2 is electrically connected to the first clock signal terminal CK1, and the second electrode of the second transistor T2 is electrically connected to a second node G2; a control electrode of the third transistor T3 is electrically connected to the first clock signal terminal CK1, a first electrode of the third transistor T3 is electrically connected to a second power supply terminal V2, and a second electrode of the third transistor T3 is electrically connected to the second node G2; a control electrode of the fourth transistor T4 is electrically connected to the second node G2, a first electrode of the fourth transistor T4 is electrically connected to a first power supply terminal V1, and a second electrode of the fourth transistor T4 is electrically connected to an output terminal OUT; a control electrode of the fifth transistor T5 is electrically connected to a third node G3, a first electrode of the fifth transistor T5 is electrically connected to a second clock signal terminal CK2, and a second electrode of the fifth transistor T5 is electrically connected to the output terminal OUT; a control electrode of the sixth transistor T6 is electrically connected to the second node G2, a first electrode of the sixth transistor T6 is electrically connected to a first power supply terminal VH, and a second electrode of the sixth transistor T6 is electrically connected to a first electrode of the seventh transistor T7; a control electrode of the seventh transistor T7 is electrically connected to the second clock signal terminal CK2, and a second electrode of the seventh transistor T7 is electrically connected to the first node G1; a control electrode of the eighth transistor T8 is electrically connected to the second power supply terminal V2, a first electrode of the eighth transistor T8 is electrically connected to the first node G1, and a second electrode of the eighth transistor T8 is electrically connected to a third node G3; a first electrode plate C11 of the first capacitor C1 is electrically connected with the first power supply terminal V1, and a second electrode plate C12 of the first capacitor C1 is electrically connected with the second node G2; and a first electrode plate C21 of the second capacitor C2 is electrically connected to the output terminal OUT, and a second electrode plate C22 of the second capacitor C2 is electrically connected with the third node G3.

In an exemplary implementation, the first transistor T1 to the eighth transistor T8 may be P-type transistors or N-type transistors.

In some exemplary implementations, the first power supply terminal V1 keeps providing high-level signals, and the second power supply terminal V2 keeps providing low-level signals.

Taking a case in which the first transistor T1 to the eighth transistor T8 are P-type transistors as an example, as shown in FIG. 7B, a working process of a shift register according to an exemplary embodiment includes following stages.

In an input stage B1, signals of the first clock signal terminal CK1 and the input terminal IN are low-level signals, and a signal of the second clock signal terminal CK2 is a high-level signal. As the signal of the first clock signal terminal CK1 is the low-level signal, the first transistor T1 is turned on, and a signal of the input terminal IN is transmitted to the first node G1 via the first transistor T1. As a signal of the eighth transistor T8 receives a low-level signal of the second power supply terminal V2, the eighth transistor T8 is in an ON state. A level of the third node G3 may make the fifth transistor T5 be turned on, and the signal of the second clock signal terminal CK2 is transmitted to the output terminal OUT via the fifth transistor T5, that is, in the input stage B1, the output terminal OUT has the signal of the second clock signal terminal CK2 which is a high-level signal. In addition, since the signal of the first clock signal terminal CK1 is the low-level signal, the third transistor T3 is turned on, and the low-level signal of the second power supply terminal V2 is transmitted to the second node G2 via the third transistor T3. At this time, both the fourth transistor T4 and the sixth transistor T6 are turned on. As the signal of the second clock signal terminal CK2 is the high-level signal, the seventh transistor T7 is turned off.

In an output stage B2, a signal of the first clock signal terminal CK1 is a high-level signal, a signal of the second clock signal terminal CK2 is a low-level signal, and a signal of the input terminal IN is a high-level signal. The fifth transistor T5 is turned on, and the signal of the second clock signal terminal CK2 is used as the signal of the output terminal OUT via the fifth transistor T5. In the output stage B2, a level at one terminal of the second capacitor C2 connected to the output terminal OUT, becomes a signal of the second power supply terminal V2. Due to a bootstrap effect of the second capacitor C2, the eighth transistor T8 is turned off, the fifth transistor T5 may be turned on better, and the signal of the output terminal OUT is a low-level signal. In addition, the signal of the first clock signal terminal CK1 is a high-level signal, so that both the first transistor T1 and the third transistor T3 are turned off. The second transistor T2 is turned on, and the high-level signal of the first clock signal terminal CK1 is transmitted to the second node G2 via the second transistor T2, so that both the fourth transistor T4 and the sixth transistor T6 are turned off. As the signal of the second clock signal terminal CK2 is a low-level signal, the seventh transistor T7 is turned on.

In a buffering stage B3, the signals of the first clock signal terminal CK1 and the second clock signal terminal CK2 are both high-level signals, the signal of the input terminal IN is a high-level signal, the fifth transistor T5 is turned on, and the second clock signal terminal CK2 is used as an output signal via the fifth transistor T5. Due to a bootstrap effect of the second capacitor C2, a level of the first node G1 becomes V2−Vth. In addition, the signal of the first clock signal terminal CK1 is a high-level signal, so that the first transistor T1 and the third transistor T3 are both turned off, the eighth transistor T8 is turned on, the second transistor T2 is turned on, and the high-level signal of the first clock signal terminal CK1 is transmitted to the second node G2 via the second transistor T2, and thus both the fourth transistor T4 and the sixth transistor T6 are turned off. As the signal of the second clock signal terminal CK2 is a high-level signal, the seventh transistor T7 is turned off.

In a first sub-stage B41 of a stabilization stage B4, a signal of the first clock signal terminal CK1 is a low-level signal, and signals of the second clock signal terminal CK2 and the input terminal IN are high-level signals. As the signal of the first clock signal terminal CK1 is a low-level signal, the first transistor T1 is turned on, the signal of the input terminal IN is transmitted to the first node G1 via the first transistor T1, and the second transistor T2 is turned off. As the eighth transistor T8 is in an ON state, the fifth transistor T5 is turned off. Since the signal of the first clock signal terminal CK1 is at a low level, the third transistor T3 is turned on, the fourth transistor T4 and the sixth transistor T6 are both turned on, and the high-level signal of the first power supply terminal V1 is transmitted to the output terminal OUT via the fourth transistor T4, that is, the signal of the output terminal OUT is a high-level signal.

In a second sub-stage B42 of the stabilization stage B4, a signal of the first clock signal terminal CK1 is a high-level signal, a signal of the second clock signal terminal CK2 is a low-level signal, and a signal of the input terminal IN is a high-level signal. Both the fifth transistor T5 and the second transistor T2 are turned off. The signal of the first clock signal terminal CK1 is a high-level signal, so that the first transistor T1 and the third transistor T3 are both turned off. Under a maintaining effect of the first capacitor C1, the fourth transistor T4 and the sixth transistor T6 are both turned on, and a high-level signal is transmitted to the output terminal OUT via the fourth transistor T4, that is, a signal of the output terminal OUT is a high-level signal.

In the second sub-stage B42, as the signal of the second clock signal terminal CK2 is a low-level signal, the seventh transistor T7 is turned on, so that a high-level signal is transmitted to the third node G3 and the first node G1 via the sixth transistor T6 and the seventh transistor T7, and thus the signals of the third node G3 and the first node G1 are kept as high-level signals.

In a third sub-stage B43, signals of the first clock signal terminal CK1 and the second clock signal terminal CK2 are both high-level signals, and a signal of the input terminal IN is a high-level signal. The fifth transistor T5 and the second transistor T2 are turned off. The signal of the first clock signal terminal CK1 is a high-level signal, so that the first transistor T1 and the third transistor T3 are both turned off, and the fourth transistor T4 and the sixth transistor T6 are both turned on. A high-level signal is transmitted to the output terminal OUT via the fourth transistor T4, that is, the signal of the output terminal OUT is a high-level signal.

In an exemplary implementation, the number of transistors in the dummy scan shift register may be less than or equal to the number of transistors in the scan shift register.

In an exemplary implementation, a width of the dummy scan shift register may be less than or equal to a width of the scan shift register.

In an exemplary implementation, when the number of transistors of the dummy scan shift register is equal to the number of transistors in the scan shift register, a circuit structure of the dummy scan shift register may be the same as a circuit structure of the scan shift register. At this time, the width of the dummy scan shift register may be equal to the width of the scan shift register, the width is a length in a direction perpendicular to an extension direction of the second power supply line VGL to which the shift register is connected, and the shift register includes a dummy scan shift register or a scan shift register.

In an exemplary implementation, when the number of transistors of the dummy scan shift register is less than the number of transistors in the scan shift register, the width of the dummy scan shift register may be less than the width of the scan shift register.

In an exemplary implementation, in order to ensure the display effect of the rounded corner region, more pixel drive circuits close to the rounded corner region are arranged, while the present disclosure may save the space and provide enough region for wiring of the scan shift register by reducing the width of the dummy scan shift register, which reduces an area occupied by the rounded corner region, and can achieve a narrow bezel of the display substrate.

Figure 8A:
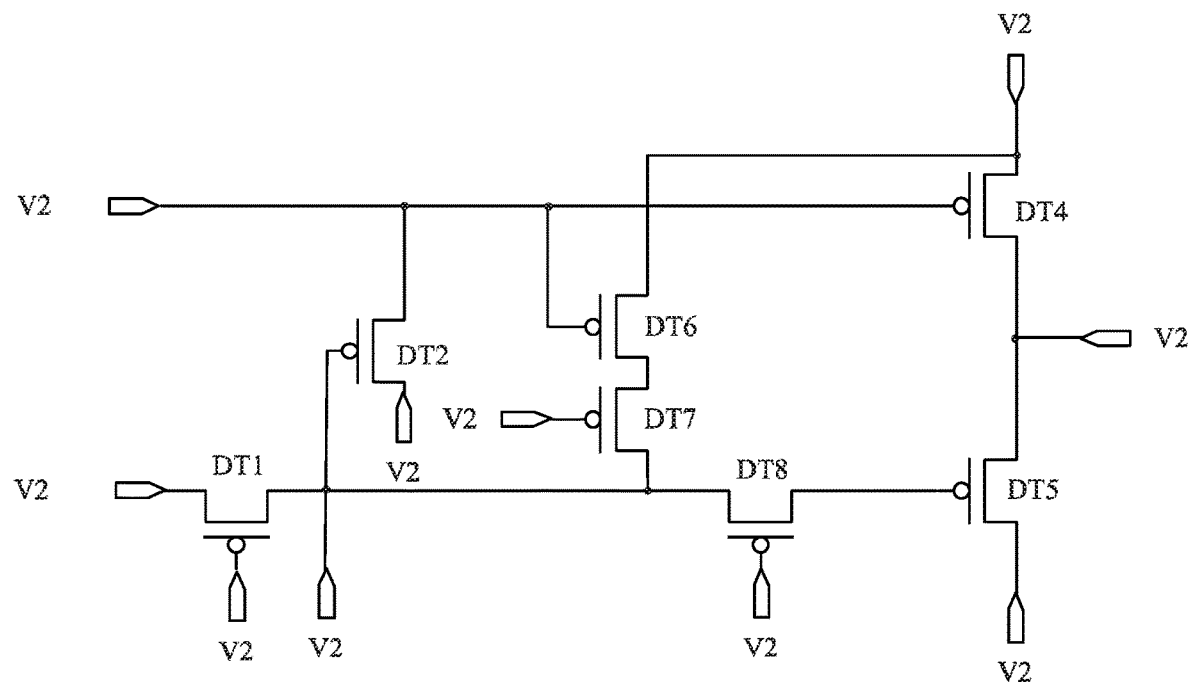
FIG. 8A is an equivalent circuit diagram of a dummy scan shift register.
Figure 8B:
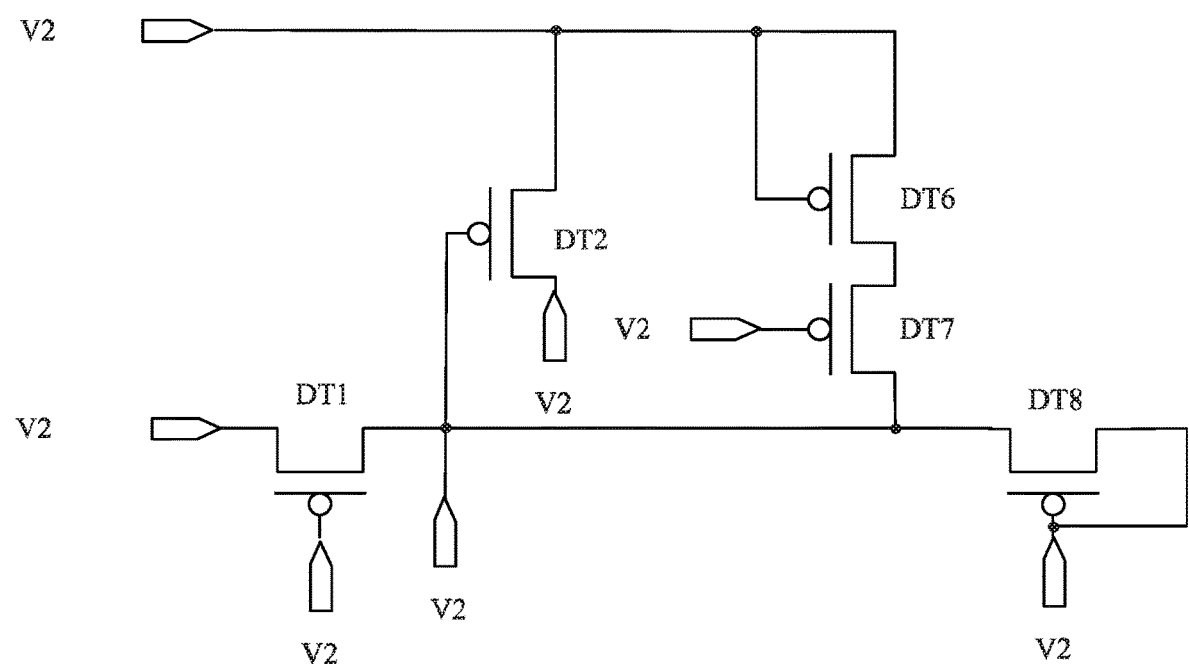
FIG. 8B is an equivalent circuit diagram of another dummy scan shift register.

In an exemplary implementation, FIG. 8A is an equivalent circuit diagram of a dummy scan shift register, and FIG. 8B is an equivalent circuit diagram of another dummy scan shift register. When the number of transistors in the dummy scan shift register is smaller than the number of transistors in the scan shift register, the circuit structure of the dummy scan shift register may be that in FIG. 8A or FIG. 8B, wherein the circuit structures provided in FIG. 8A and FIG. 8B are not provided with any capacitor.

In an exemplary implementation, as shown in FIG. 8A, the dummy scan shift register may include a first transistor DT1, a second transistor DT2, a fourth transistor DT4 to an eighth transistor DT8. Herein, a control electrode, a first electrode and a second electrode of the first transistor DT1 are electrically connected to the second power supply terminal V2; a control electrode, a first electrode and a second electrode of the second transistor DT2 are electrically connected to the second power supply terminal V2; a control electrode, a first electrode and a second electrode of the fourth transistor DT4 are electrically connected to the second power supply terminal V2; a first electrode and a second electrode of the fifth transistor DT5 are electrically connected to the second power supply terminal V2, and a control electrode of the fifth transistor DT5 is electrically connected to a second electrode of the eighth transistor DT8; a control electrode and a first electrode of the sixth transistor DT6 are electrically connected to the second power supply terminal V2, and a second electrode of the sixth transistor DT6 is electrically connected to a first electrode of the seventh transistor DT7; a control electrode and a second electrode of the seventh transistor DT7 are electrically connected to the second power supply terminal V2; and a control electrode and a first electrode of the eighth transistor DT8 are electrically connected to the second power supply terminal V2.

In an exemplary implementation, as shown in FIG. 8B, the dummy scan shift register may include a first transistor DT1, a second transistor DT2, a sixth transistor DT6 to an eighth transistor DT8. Herein, a control electrode, a first electrode and the second electrode of the first transistor DT1 are electrically connected to the second power supply terminal V2; a control electrode, a first electrode and a second electrode of the second transistor DT2 are electrically connected to the second power supply terminal V2; a control electrode and a first electrode of the sixth transistor DT6 are electrically connected to the second power supply terminal V2, and a second electrode of the sixth transistor DT6 is electrically connected to a first electrode of the seventh transistor DT7, and a control electrode and a second electrode of the seventh transistor DT7 are electrically connected to the second power supply terminal V2; and a control electrode, a first electrode and a second electrode of the eighth transistor DT8 are electrically connected to the second power supply terminal V2.

In an exemplary implementation, the circuit structure of the light emitting shift register or the control register may be 13T3C or 10T3C, which is not limited in the present disclosure.

In an exemplary implementation, the display substrate may further include other film layers, such as spacer column, and the present disclosure is not limited thereto.

Figure 9A:
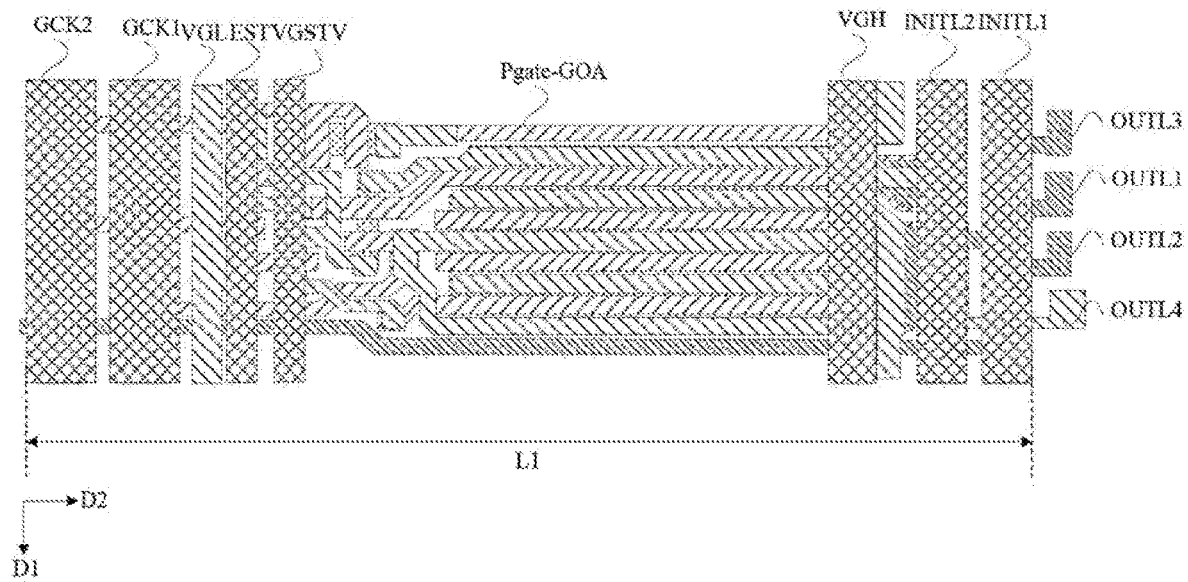
FIG. 9A is a partial schematic diagram of a display substrate.
Figure 9B:
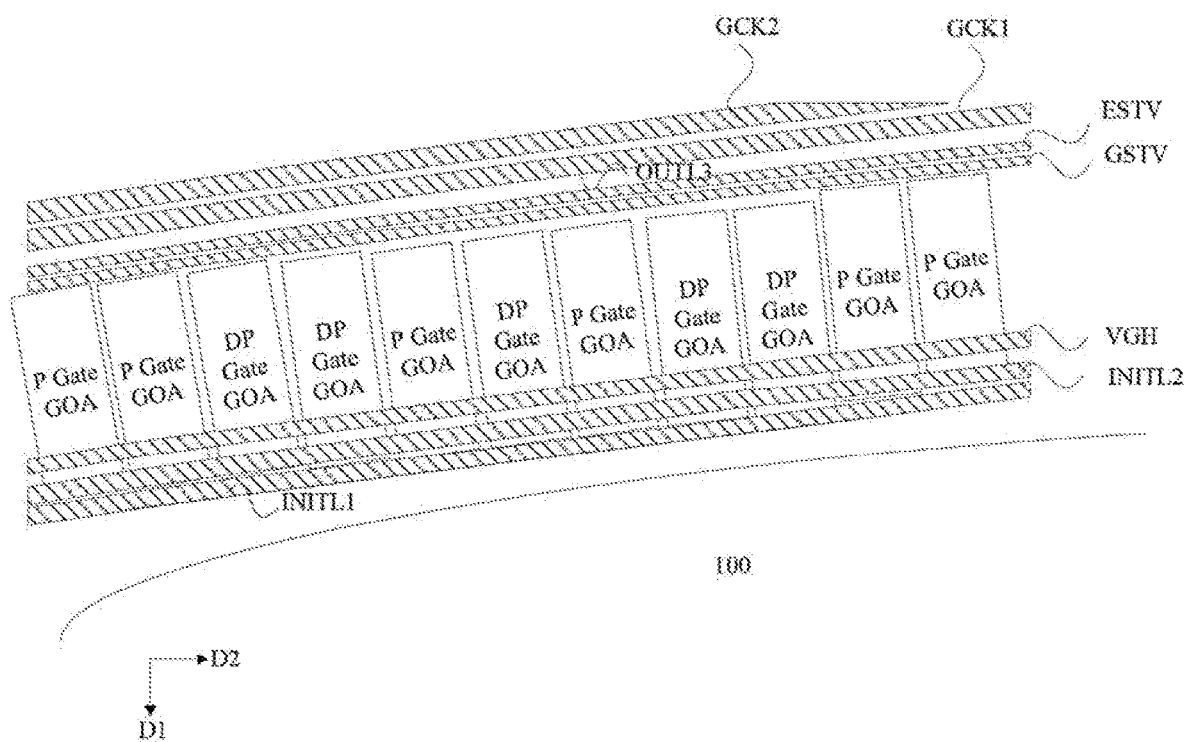
FIG. 9B is a partial schematic diagram of the display substrate provided in FIG. 9A in a rounded corner region.
Figure 10A:
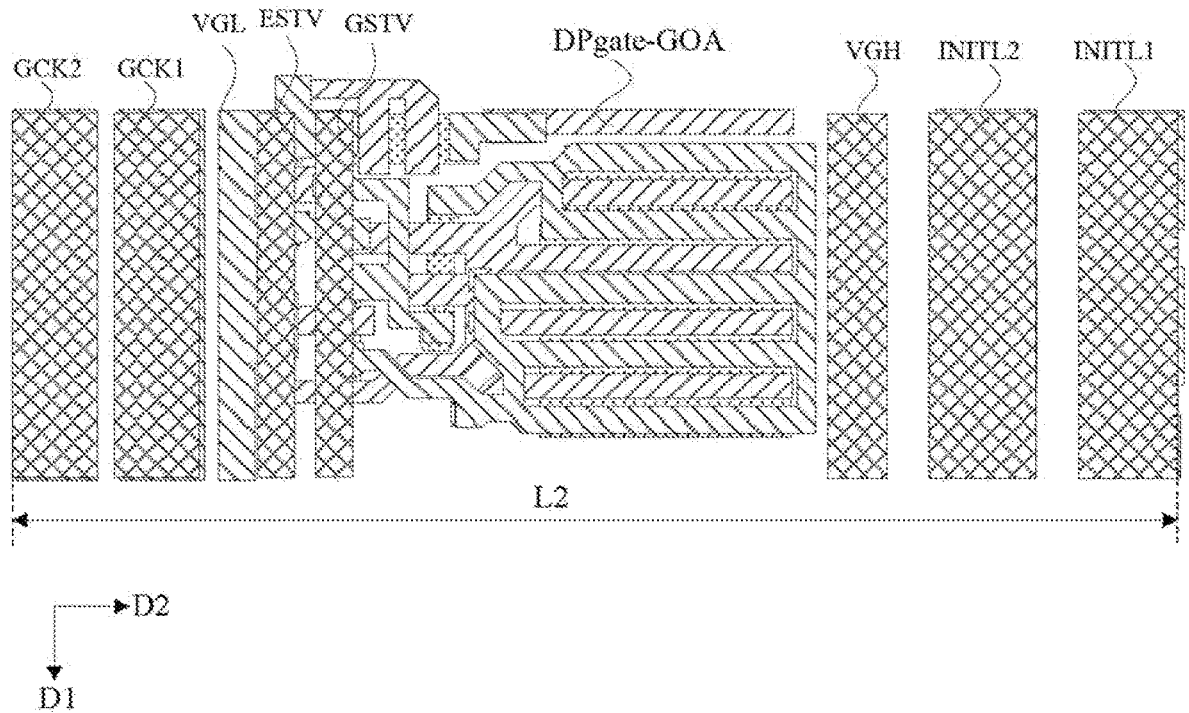
FIG. 10A is another partial schematic diagram of a display substrate.
Figure 10B:
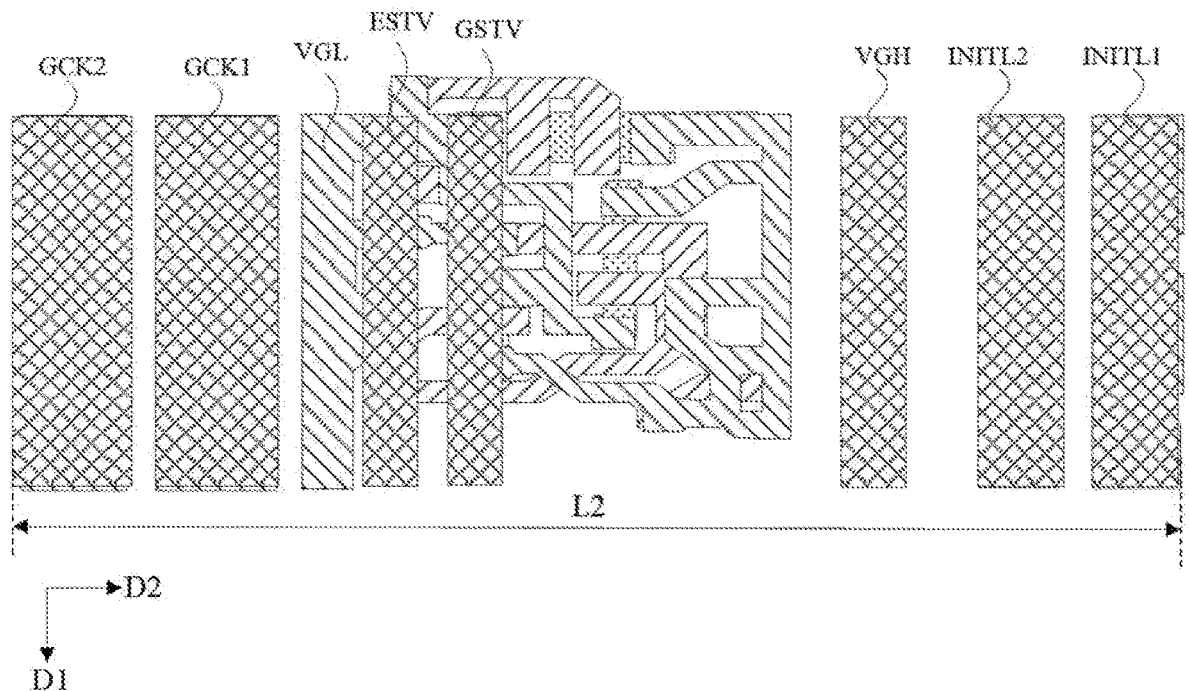
FIG. 10B is yet another partial schematic diagram of a display substrate.
Figure 11:
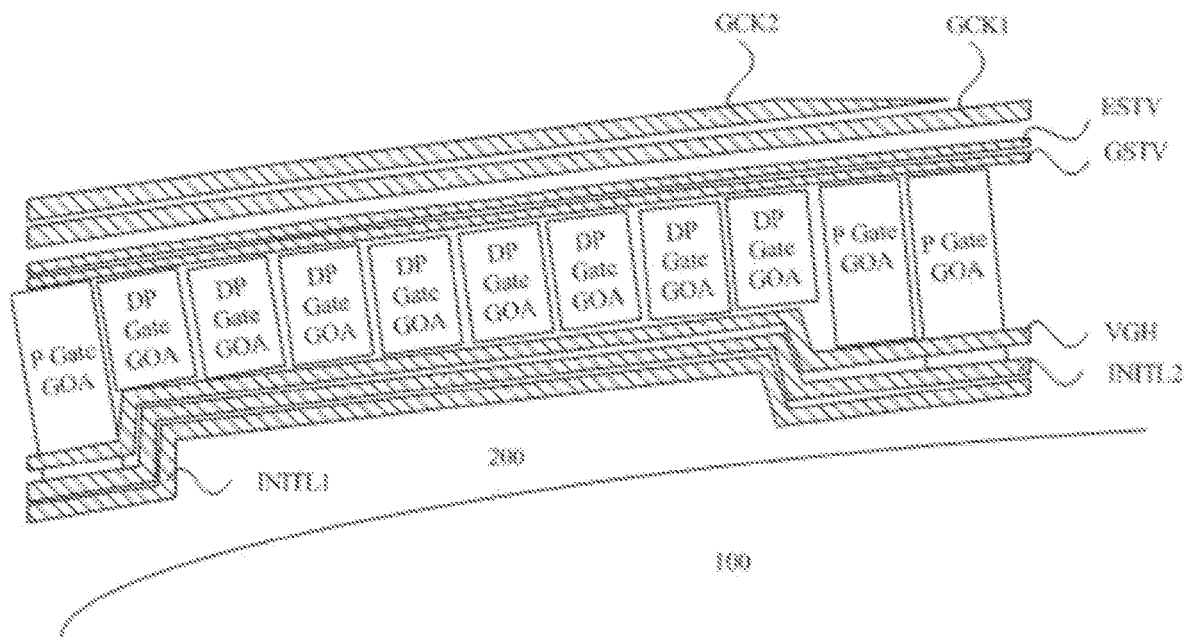
FIG. 11 is a partial schematic diagram of the display substrates provided in FIG. 10A and FIG. 10B in a rounded corner region.

FIG. 9A is a partial schematic diagram of a display substrate, FIG. 9B is a partial schematic diagram of the display substrate provided in FIG. 9A in the rounded corner region, FIG. 10A is another partial schematic diagram of the display substrate, FIG. 10B is another partial schematic diagram of the display substrate, and FIG. 11 is a partial schematic diagram of display substrates provided in FIG. 10A and FIG. 10B in the rounded corner region. As shown in FIG. 9A to FIG. 11, in an exemplary implementation, the drive circuit layer may further include a first initial signal line GSTV, a first clock signal line GCK1, a second clock signal line GCK2, a first power supply line VGH and a second power supply line VGL, which are located in the non-display region, and the scan drive circuit is electrically connected to the first clock signal line GCK1, the second clock signal line GCK2, the first power supply line VGH, the second power supply line VGL and the first initial signal line GSTV.

In an exemplary implementation, as shown in FIG. 9A to FIG. 11, the first clock signal line GCK1, the second clock signal line GCK2, the first initial signal line GSTV, the first power supply line VGH, and the second power supply line VGL may extend at least partially along the first direction D1.

In an exemplary implementation, an input terminal of a first stage shift register is electrically connected with a first initial signal line, and an output terminal of an i-th stage shift register is electrically connected with an input terminal of an (i+1)-th stage shift register; a first clock signal terminal of an i-th stage shift register is electrically connected with a first clock signal line, and a second clock signal terminal of the i-th stage shift register is electrically connected with a second clock signal line; a first clock signal terminal of an (i+1)-th stage shift register is electrically connected with the second clock signal line, and a second clock signal terminal is electrically connected with the first clock signal line; and a first power supply terminal of the i-th stage shift register is electrically connected with the first power supply line, and a second power supply terminal of the i-th stage shift register is electrically connected with the second power supply line.

In an exemplary implementation, as shown in FIG. 9A to FIG. 11, the second clock signal line GCK2 is located on a side of the first clock signal line GCK1 away from the display region, the second power supply line VGL is located on a side of the first clock signal line close to the display region, the first initial signal line GSTV is located on a side of the second power supply line VGL close to the display region, the first power supply line VGH is located on a side of the first initial signal line GSTV close to the display region, and at least one initial power supply line is located on a side of the first power supply line VGH close to the display region. FIG. 9A to FIG. 11 are illustrated by taking two initial power supply lines, that is, a first initial power supply line INITL1 and a second initial power supply line INITL2 as an example.

In an exemplary implementation, as shown in FIG. 9A to FIG. 11, the drive circuit layer may further include a second initial signal line ESTV located in the non-display region, and the second initial signal line ESTV extends at least partially along the first direction D1. The light emitting drive circuit is electrically connected with the second initial signal line ESTV, which is located between the second power supply line VGL and the first initial signal line GSTV.

In an exemplary implementation, as shown in FIG. 9A, the drive circuit layer may further include a first output signal line OUTL1 and a second output signal line OUTL2 which are located in the non-display region, and the first output signal line OUTL1 and the second output signal line OUTL2 extend at least partially along the second direction D2.

In an exemplary implementation, as shown in FIG. 9A, the first output signal line OUTL1 is located on a side of the scan drive circuit close to the display region, and is electrically connected to the scan drive circuit and the pixel drive circuit, respectively.

In an exemplary implementation, as shown in FIG. 9A, the second output signal line OUTL2 passes through the scan drive circuit, and is electrically connected to the pixel drive circuit and one of the light emitting drive circuit and the control drive circuit, respectively.

In an exemplary implementation, an orthographic projection of the initial power supply line which is overlapped with the scan drive circuit on the base substrate is at least partially overlapped with orthographic projections of the plurality of capacitors on the base substrate, and as shown in FIG. 9A, an orthographic projection of the second initial signal line INITL2 on the base substrate is at least partially overlapped with orthographic projections of the plurality of capacitors on the base substrate.

In an exemplary implementation, a distance between a boundary of an initial power supply line, which is overlapped with the scan drive circuit, away from the display region and the display region is less than a distance between a boundary of at least one of the plurality of capacitors away from the display region and the display region. Taking FIG. 8A as an example, a distance between a boundary of the second initial power supply line INITL2 away from the display region and the display region is smaller than a distance between a boundary of at least one of the plurality of capacitors away from the display region and the display region, that is, the second initial power supply line INITL2 is overlapped with the capacitors, but is not overlapped with the transistors, which can improve reliability of the scan shift register.

In an exemplary implementation, in conjunction with FIG. 9B, FIG. 10A, FIG. 10B, and FIG. 11, a distance L2 between a boundary of the second clock signal line, located on a side of the dummy scan shift register, away from the display region and a boundary of an initial power supply line, close to the display region, of the at least one initial power supply line, close to the display region is less than a distance L1 between a boundary of the second clock signal line, located on a side of the scan shift register, away from the display region and a boundary of the initial power supply line, close to the display region, of the at least one initial power supply line, close to the display region.

Figure 12:
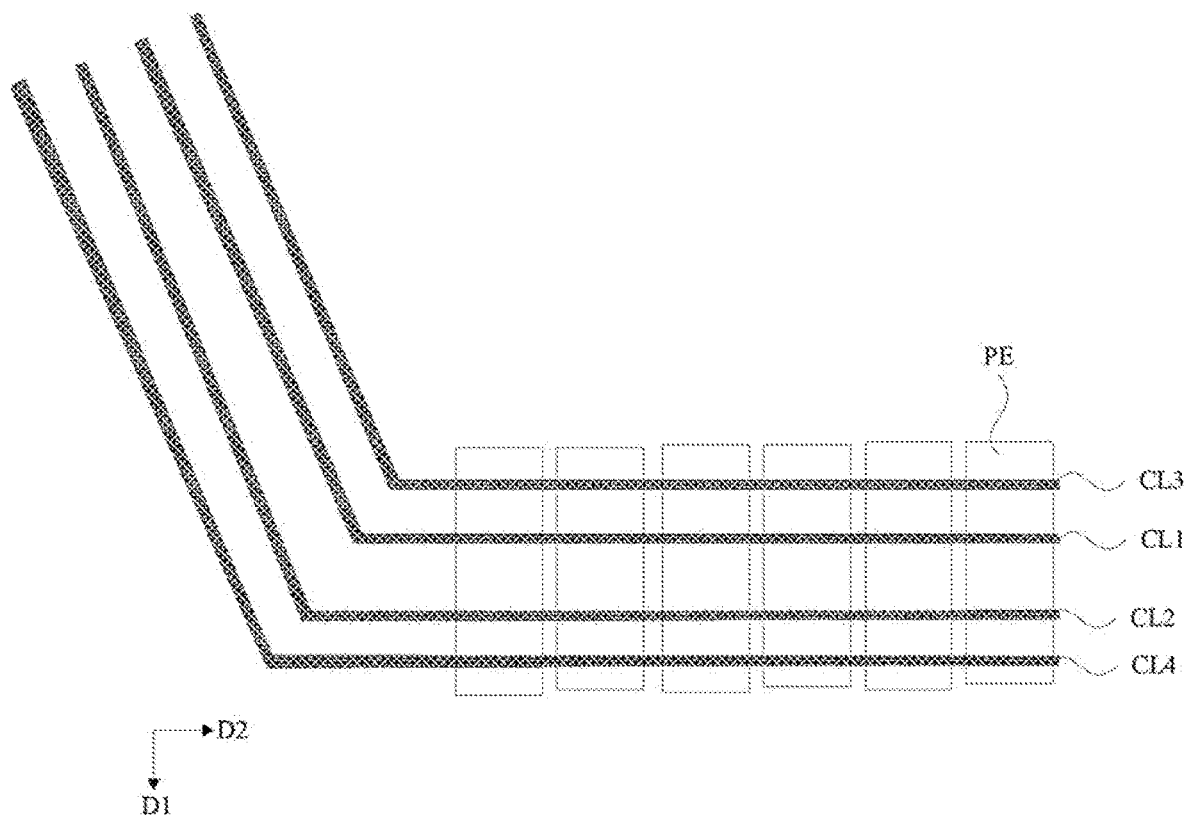
FIG. 12 is a partial schematic diagram of another display substrate.

In an exemplary implementation, FIG. 12 is a partial schematic diagram of another display substrate, and as shown in FIG. 12, the drive circuit layer may further include a first output connection line CL1 and a second output connection line CL2 which are located in the display region and the non-display region, wherein the first output connection line CL1 and the second output connection line CL2 extend at least partially along the second direction.

In an exemplary implementation, the first output connection line may be electrically connected to the first output signal line OUTL1 and the pixel drive circuit, respectively, and the second output connection line may be electrically connected to the second output signal line OUTL2 and the pixel drive circuit, respectively.

In an exemplary implementation, the first output connection line is electrically connected to the pixel drive circuit through the scan signal line. The second output connection line is electrically connected to the pixel drive circuit through the light emitting signal line or the control signal line. When the second output signal line, to which the second output connection line is connected, is electrically connected to the light emitting drive circuit, the second output connection line is electrically connected to the pixel drive circuit through the light emitting signal line, and when the second output signal line, to which the second output connection line is connected, is electrically connected to the control drive circuit, the second output connection line is electrically connected to the pixel drive circuit through the control signal line.

In an exemplary implementation, when N=2, as shown in FIG. 12, the drive circuit layer may further include a third output connection line CL3 and a fourth output connection line CL4, and the third output connection line CL3 and the fourth output connection line CL4 extend at least partially along the second direction D2. Herein, the third output connection line CL3 is electrically connected with the first initial power supply line and the pixel drive circuit, respectively; and the fourth output connection line CL4 is electrically connected to the second initial power supply line and the pixel drive circuit, respectively.

In an exemplary implementation, the drive circuit layer may include a semiconductor layer, a first conductive layer, a second conductive layer, a third conductive layer, and a fourth conductive layer that are sequentially stacked.

The semiconductor layer at least includes active layers of multiple transistors.

The first conductive layer at least includes control electrodes of the plurality of transistors and first electrode plates of a plurality of capacitors.

The second conductive layer at least includes second electrode plates of the plurality of capacitors, a first output signal line and a third output signal line.

The third conductive layer at least includes a second power supply line, a first electrode and second electrode of at least one transistor, and a fourth output signal line.

The fourth conductive layer at least includes a first initial signal line, a second initial signal line, and a first power supply line.

In an exemplary implementation, the drive circuit layer further includes a fifth conductive layer located on a side of the fourth conductive layer away from the base substrate.

The fifth conductive layer at least includes a first output connection line and a second output connection line.

In an exemplary implementation, the first output connection line and the second output connection line are located on the fifth conductive layer, which can further reduce a space occupied by the non-display region. The non-display region is connected to the display region through the first output connection line, and a cross-layer connection within the display region is to be connected to the corresponding pixel drive circuit.

In an exemplary implementation, a dummy trace may be interspersed between the first output connection line and the second output connection line, wherein the dummy trace is a signal trace that does not provide a signal. The dummy trace may be interspersed between the first output connection line and the second output connection line, which can ensure the etching uniformity of the fifth conductive layer, and can ensure the reliability of the display substrate.

In an exemplary implementation, the initial power supply line may be of a single-layer structure or may be of a multi-layer structure, which is not limited in this disclosure.

In an exemplary implementation, the initial power supply line is of a single-layer structure, and the initial power supply line is located on the fourth conductive layer.

In an exemplary implementation, when the display substrate is an LTPO display substrate, the initial power supply line may be of a single-layer structure.

In an exemplary implementation, the initial power supply line includes a first initial sub-segment and a second initial sub-segment connected to each other, and an orthographic projection of the first initial sub-segment on the base substrate is at least partially overlapped with an orthographic projection of the second initial sub-segment on the base substrate.

In an exemplary implementation, the first initial sub-segment is located on the third conductive layer, and the second initial sub-segment is located on the fourth conductive layer.

In an exemplary implementation, the initial power supply line adopts a stacked design, which can reduce load differences of the initial power supply lines and can also satisfy jumper rules of the display substrate to avoid static electricity risks in the display substrate.

In an exemplary implementation, the first clock signal line and the second clock signal line may be of a single-layer structure or may be of a multi-layer structure, which is not limited in this disclosure.

In an exemplary implementation, the first clock signal line and the second clock signal line are of a single-layer structure, and the first clock signal line and the second clock signal line are located on the fourth conductive layer.

In an exemplary implementation, the clock signal line may include a first clock sub-segment and a second clock sub-segment connected to each other, and the clock signal line includes a first clock signal line and a second clock signal line, wherein an orthographic projection of the first clock sub-segment on the base substrate is at least partially overlapped with an orthographic projection of the second clock sub-segment on the base substrate.

In an exemplary implementation, the first clock sub-segment is located on the third conductive layer, and the second clock sub-segment is located on a side of the fourth conductive layer close to the base substrate.

In an exemplary implementation, the first clock signal line and the second clock signal line adopt a stacked design, which can reduce load differences between the first clock signal line and the second clock signal line, and can also satisfy jumper rules of the display substrate to avoid static electricity risks in the display substrate.

In an exemplary implementation, the second output signal line may be of a single-layer structure, or may be of a multi-layer structure, which is not limited in this disclosure.

In an exemplary implementation, the second output signal line is of a single-layer structure, and the second output signal line is located on the second conductive layer.

Figure 13:
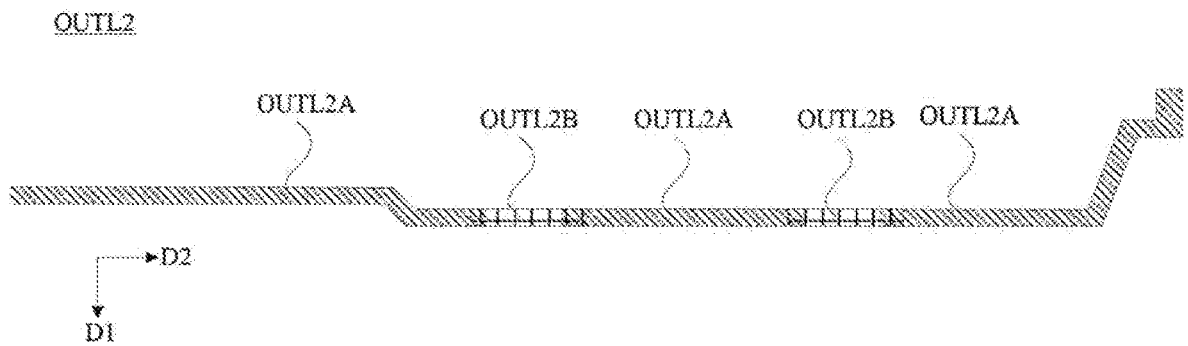
FIG. 13 is a schematic diagram of a structure of a second output signal line.

In an exemplary implementation, FIG. 13 is a schematic diagram of a structure of a second output signal line, and as shown in FIG. 13, the drive circuit layer further includes a sixth conductive layer located between the second conductive layer and the third conductive layer. The second output signal line includes a plurality of first output sub-segments OUTL2A and a plurality of second output sub-segments OUTL2B. Adjacent first output sub-segments OUTL2A are electrically connected through a second output sub-segment OUTL2B, and adjacent second output sub-segments OUTL2B are electrically connected through a first output sub-segment OUTL2A. An orthographic projection of the second output sub-segment OUTL2B on the base substrate is at least partially overlapped with an orthographic projection of the first output sub-segment OUTL2A electrically connected to the second output sub-segment OUTL2B on the base substrate, and an orthographic projection of the first output sub-segment OUTL2A on the base substrate is at least partially overlapped with an orthographic projection of the second output sub-segment OUTL2B electrically connected to the first output sub-segment OUTL2B on the base substrate. The first output sub-segment OUTL2A is located on the second conductive layer, and the second output sub-segment OUTL2B is located on the sixth conductive layer.

In an exemplary implementation, the second output signal line includes a first output sub-segment and a second output sub-segment which are located in different film layers, which can avoid a static electricity risk due to a longer second output signal line.

"Patterning processes" mentioned in the present disclosure include photoresist coating, mask exposure, development, etching, photoresist stripping, etc., for metal materials, inorganic materials or transparent conductive materials, and include organic material coating, mask exposure, development, etc., for organic materials. Deposition may be any one or more of sputtering, evaporation and chemical vapor deposition, coating may be any one or more of spray coating, spin coating and inkjet printing, and etching may be any one or more of dry etching and wet etching, the present disclosure is not limited thereto. "Thin film" refers to a layer of thin film formed from a certain material on a base substrate using deposition, coating or other processes. If the "thin film" does not need to be processed through a patterning process in the entire manufacturing process, the "thin film" may also be called a "layer". If the "thin film" needs to be processed through the patterning process in the entire manufacturing process, the "thin film" is called a "thin film" before the patterning process is performed, and is called a "layer" after the patterning process is performed. At least one "pattern" is contained in the "layer" which has been processed through the patterning process. "A and B are arranged on a same layer" in the present disclosure means that A and B are formed simultaneously through a same running of patterning process, and the "thickness" of the film layer is a size of the film layer in a direction perpendicular to the display substrate. In the exemplary embodiment of the present disclosure, "an orthographic projection of B being within the range of an orthographic projection of A" or "an orthographic projection of A containing an orthographic projection of B" means that the boundary of the orthographic projection of B falls within the range of the boundary of the orthographic projection of A, or the boundary of the orthographic projection of A is coincided with the boundary of the orthographic projection of B.

Exemplary description will be made below by the preparation process of the display substrate provided in FIG. 9A, which is illustrated by taking a case in which the second output signal line is of a single-layer structure as an example.

(1) A pattern of a semiconductor layer is formed on the base substrate. In an exemplary implementation, forming the pattern of the semiconductor layer may include: depositing a semiconductor thin film on the base substrate, and patterning the semiconductor thin film by a patterning process to form the pattern of the semiconductor layer, as shown in FIG. 14, which is a schematic diagram after the pattern of the semiconductor layer in FIG. 9A is formed.

Figure 14:
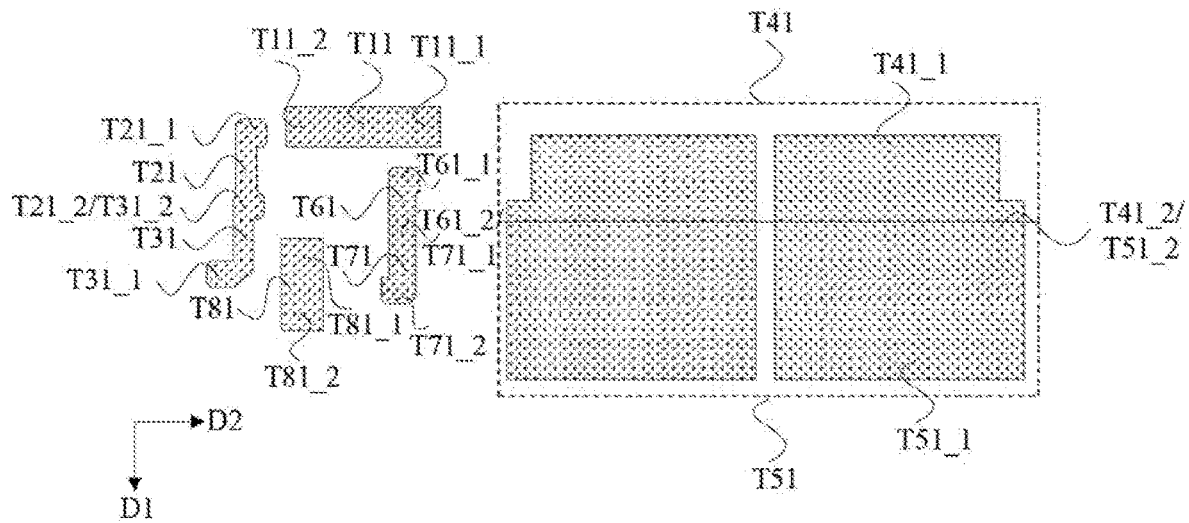
FIG. 14 is a schematic diagram after a pattern of a semiconductor layer is formed for the display substrate in FIG. 9A.

In an exemplary implementation, as shown in FIG. 14, the pattern of the semiconductor layer may include an active layer T11 of a first transistor to an active layer T81 of an eighth transistor.

In an exemplary implementation, the base substrate may be a rigid substrate or a flexible substrate, wherein the rigid substrate may be, but is not limited to, one or more of glass and metal foil; the flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber.

In an exemplary implementation, the flexible base substrate may include a first flexible material layer, a first inorganic material layer, a semiconductor layer, a second flexible material layer and a second inorganic material layer which are stacked. Materials of the first and second flexible material layers may be polyimide (PI), polyethylene terephthalate (PET) or surface treated polymer soft film, etc., and materials of the first and second inorganic material layers may be silicon nitride (SiNx), silicon oxide (SiOx) or the like, for improving the water and oxygen resistance of the base substrate. The first and second inorganic material layers may also be referred to as barrier layers. A material of the semiconductor layer may be amorphous silicon (a-si). In an exemplary implementation, taking a laminated structure of PI1/Barrier1/a-si/PI2/Barrier2 as an example, its preparation process may include: firstly, coating a layer of polyimide on the glass carrier plate, curing it into a film to form a first flexible (PI1) layer; then, depositing a layer of barrier thin film on the first flexible layer to form a first barrier (Barrier1) layer covering the first flexible layer; next, depositing a layer of amorphous silicon thin film on the first barrier layer to form an amorphous silicon (a-si) layer covering the first barrier layer; then coating a layer of polyimide on the amorphous silicon layer, curing it into a film to form a second flexible (PI2) layer; after that, depositing a layer of barrier thin film on the second flexible layer to form a second barrier (Barrier2) layer covering the second flexible layer, thereby completing preparation of the base substrate.

In an exemplary implementation, the semiconductor layer thin film may be made of various materials, such as amorphous indium gallium zinc oxide (a-IGZO), zinc oxynitride (ZnON), indium zinc tin oxide (IZTO), amorphous silicon (a-Si), polycrystalline silicon (p-Si), hexathiophene, or polythiophene. That is, the present disclosure is applicable to transistors manufactured based on oxide technology, silicon technology, and organic substance technology.

In an exemplary implementation, as shown in FIG. 14, the active layer T21 of the second transistor and the active layer T31 of the third transistor may be of an integral structure, the active layer T41 of the fourth transistor and the active layer T51 of the fifth transistor may be of an integral structure, the active layer T61 of the sixth transistor and the active layer T71 of the seventh transistor may be of an integral structure, and the active layer T11 of the first transistor and the active layer T81 of the eighth transistor are separately arranged.

In an exemplary implementation, as shown in FIG. 14, in the first direction D1, the active layer T81 of the eighth transistor, and the integral structure of the active layer T61 of the sixth transistor and the active layer T71 of the seventh transistor are located on the same side of the active layer T11 of the first transistor. In the second direction D2, the active layer T11 of the first transistor, the active layer T81 of the eighth transistor, the integral structure of the active layer T41 of the fourth transistor and the active layer T51 of the fifth transistor, and the integral structure of the active layer T61 of the sixth transistor and the active layer T71 of the seventh transistor are located on the same side of the integral structure of the active layer T21 of the second transistor and the active layer T31 of the third transistor; the integral structure of the active layer T41 of the fourth transistor and the active layer T51 of the fifth transistor, and the integral structure of the active layer T61 of the sixth transistor and the active layer T71 of the seventh transistor are located on the same side of the active layer T81 of the eighth transistor; and the active layer T11 of the first transistor of the present stage scan shift register is located on a side of the active layer T81 of the eighth transistor of the present stage scan shift register close to the previous stage scan shift register.

In an exemplary implementation, the active layer T11 of the first transistor may extend along the second direction D2 and has a strip structure. The integral structure of the active layer T21 of the second transistor and the active layer T31 of the third transistor, the integral structure of the active layer T61 of the sixth transistor and the active layer T71 of the seventh transistor, and the active layer T81 of the eighth transistor may be of an "I" shape. The integral structure of the active layer T41 of the fourth transistor and the active layer T51 of the fifth transistor may include two "I"-shaped structures, and the two "I"-shaped structures are arranged along the second direction D2.

In an exemplary implementation, the active layer of each transistor may include a first region, a second region, and a channel region located between the first region and the second region. In an exemplary implementation, a second region T21_2 of the active layer of the second transistor may serve as a second region T31_2 of the active layer of the third transistor, a second region T41_2 of the active layer of the fourth transistor may serve as a second region T51_2 of the active layer of the fifth transistor, a second region T61_2 of the active layer of the sixth transistor may serve as a first region T71_1 of the active layer of the seventh transistor, and a first region T11_1 and second region T11_2 of the active layer of the first transistor, a first region T21_1 of the active layer of the second transistor, a first region T31_1 of the active layer of the third transistor, a first region T41_1 of the active layer of the fourth transistor, a first region T51_1 of the active layer of the fifth transistor, a first region T61_1 of the active layer of the sixth transistor, a first region T71_2 of the active layer of the seventh transistor, and a first region T81_1 and second region T81_2 of the active layer of the eighth transistor may be arranged separately.

Figure 15:
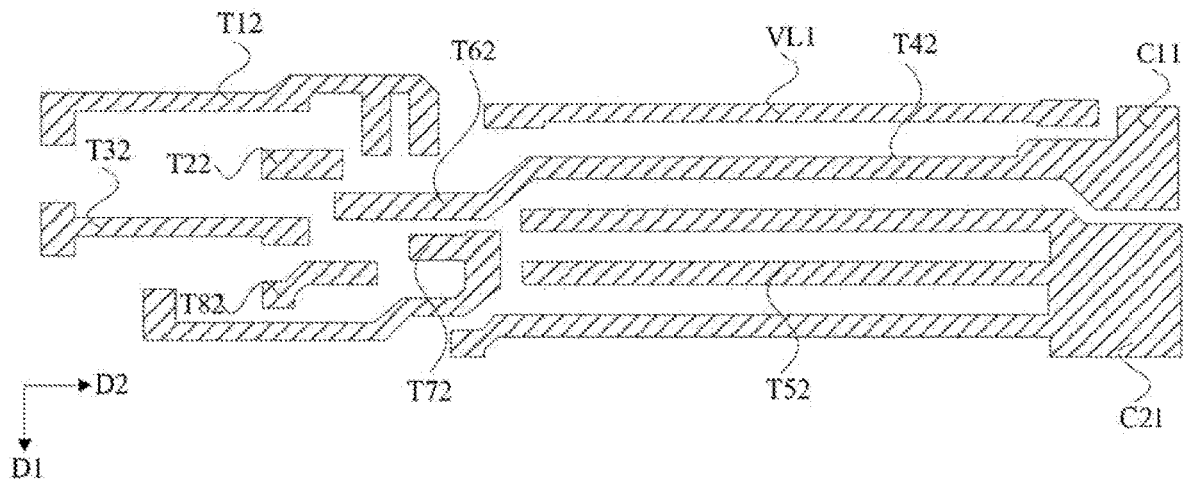
FIG. 15 is a schematic diagram of a pattern of a first conductive layer for the display substrate in FIG. 9A.
Figure 16:
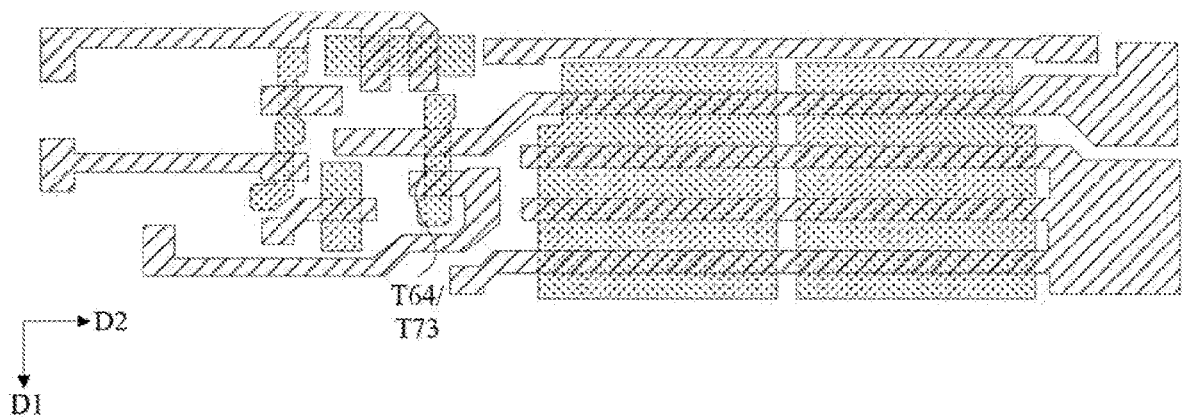
FIG. 16 is a schematic diagram after a pattern of the first conductive layer is formed for the display substrate in FIG. 9A.

(2) A pattern of a first conductive layer is formed. In an exemplary implementation, forming the pattern of the first conductive layer may include: sequentially depositing a first insulation thin film and a first conductive thin film on the base substrate on which the aforementioned pattern is formed, and patterning the first conductive thin film by a patterning process to form a first insulation layer that covers the pattern of the semiconductor layer and the pattern of the first conductive layer arranged on the first insulation layer. As shown in FIG. 15 and FIG. 16, FIG. 15 is a schematic diagram of a pattern of the first conductive layer in FIG. 9A and FIG. 16 is a schematic diagram after the pattern of the first conductive layer is formed in FIG. 9A. In an exemplary implementation, the first conductive layer may be referred to as a first gate metal (GATE1) layer.

In an exemplary implementation, as shown in FIG. 15 and FIG. 16, the pattern of the first conductive layer may at least include a control electrode T12 of the first transistor to a control electrode T82 of the eighth transistor, a first electrode plate C11 of the first capacitor, a first electrode plate C21 of the second capacitor, and a first connection line VL1.

In an exemplary implementation, as shown in FIG. 15 and FIG. 16, the first electrode plate C11 of the first capacitor, the control electrode T42 of the fourth transistor and the control electrode T62 of the sixth transistor are of an integral structure, and the first electrode plate C21 of the second capacitor and the control electrode T52 of the fifth transistor are of an integral structure.

In an exemplary implementation, as shown in FIG. 15 and FIG. 16, the first electrode plate C11 of the first capacitor and the first electrode plate C21 of the second capacitor may be arranged along the first direction D1, and the first electrode plate C11 of the first capacitor may be located on a side of the first electrode plate C21 of the second capacitor close to the previous stage scan shift register.

In an exemplary implementation, as shown in FIG. 15 and FIG. 16, an area of the first electrode plate C21 of the second capacitor may be larger than an area of the first electrode plate C11 of the first capacitor.

In an exemplary implementation, as shown in FIG. 15 and FIG. 16, the first electrode plate C11 of the first capacitor may be in a shape of a square, and may be located on a side of the control electrode T42 of the fourth transistor and the control electrode T62 of the sixth transistor close to the display region. The control electrode T42 of the fourth transistor and the control electrode T62 of the sixth transistor may be in a shape of a strip extending along the second direction D2.

In an exemplary implementation, as shown in FIG. 15 and FIG. 16, the first electrode plate C21 of the second capacitor may be in a shape of a square, and may be located on a side of the control electrode T52 of the fifth transistor close to the display region. The control electrode T52 of the fifth transistor may include a plurality of strip structures extending along the second direction D2, an integral structure of the control electrode T52 of the fifth transistor and the first electrode plate C21 of the second capacitor may be a dressing structure, the control electrode T52 of the fifth transistor serves as a comb tooth, and the first electrode plate C21 of the second capacitor serves as a comb back.

In an exemplary implementation, as shown in FIG. 15 and FIG. 16, the control electrode T12 of the first transistor may be located on a side of the first electrode plate C11 of the first capacitor away from the display region. The control electrode T12 of the first transistor may be in a shape of "F" rotated to the right, and the opening of the shape of "F" faces the control electrode T22 of the second transistor.

In an exemplary implementation, as shown in FIG. 15 and FIG. 16, the control electrode T22 of the second transistor and the control electrode T32 of the third transistor may be strip structures extending along the second direction D2.

In an exemplary implementation, as shown in FIG. 15 and FIG. 16, the control electrode T72 of the seventh transistor may be in a shape of "n" rotated to the left, and the lengths of the two sides of the "n" are different.

In an exemplary implementation, as shown in FIG. 15 and FIG. 16, the control electrode T82 of the eighth transistor extends at least partially along the second direction D2, and is in a shape of a broke line.

In an exemplary implementation, as shown in FIG. 15 and FIG. 16, the first connection line VL1 may be in a shape of a strip extending along the second direction D2, and located on a side of the control electrode T42 of the fourth transistor close to the previous stage shift register.

In an exemplary implementation, as shown in FIG. 15 and FIG. 16, the control electrode T12 of the first transistor is arranged across the active layer of the first transistor, the control electrode T22 of the second transistor is arranged across the active layer of the second transistor, the control electrode T32 of the third transistor is arranged across the active layer of the third transistor, the control electrode T42 of the fourth transistor is arranged across the active layer of the fourth transistor, the control electrode T52 of the fifth transistor is arranged across the active layer of the fifth transistor, the control electrode T62 of the sixth transistor is arranged across the active layer of the sixth transistor, the control electrode T72 of the seventh transistor is arranged across the active layer of the seventh transistor, and the extension direction of a control electrode of at least one transistor is perpendicular to the extension direction of the active layer.

In an exemplary implementation, after the pattern of the first conductive layer is formed, a conductive treatment may be performed on the semiconductor layer by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first regions and second regions of the first transistor T1 to the seventh active layer are all made to be conductive. An integral structure of the second region of the active layer of the sixth transistor and the first region of the active layer of the seventh transistor is reused as a second electrode T64 of the sixth transistor and a first electrode T73 of the seventh transistor.

Figure 17:
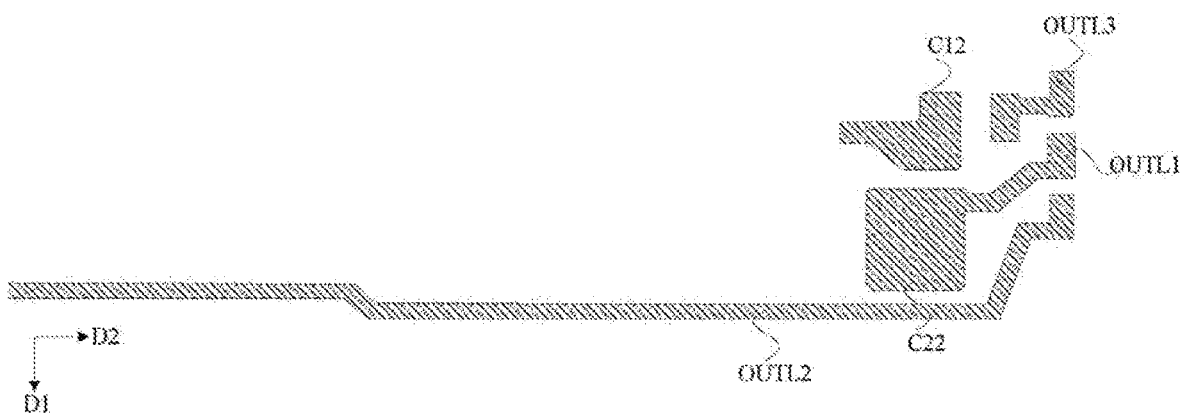
FIG. 17 is a schematic diagram of a pattern of a second conductive layer for the display substrate in FIG. 9A.
Figure 18:
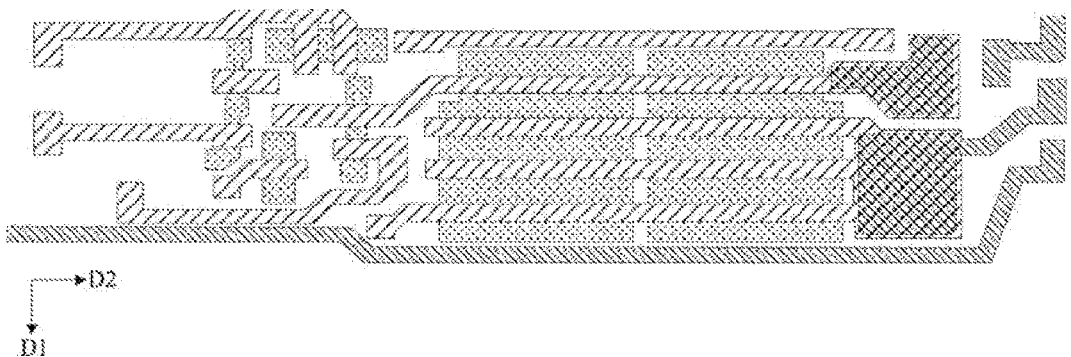
FIG. 18 is a schematic diagram after a pattern of the second conductive layer is formed for the display substrate in FIG. 9A.

(3) A pattern of a second conductive layer is formed. In an exemplary implementation, forming the pattern of the second conductive layer may include: sequentially depositing a second insulation thin film and a second conductive thin film on the base substrate on which the aforementioned patterns are formed, and patterning the second conductive thin film by a patterning process to form a second insulation layer that covers the pattern of the first conductive layer and the pattern of the second conductive layer arranged on the second insulation layer. As shown in FIG. 17 and FIG. 18, FIG. 17 is a schematic diagram of a pattern of the second conductive layer in FIG. 9A, and FIG. 18 is a schematic diagram after the pattern of the second conductive layer is formed in FIG. 9A. In an exemplary implementation, the second conductive layer may be referred to as a second gate metal (GATE2) layer.

In an exemplary implementation, as shown in FIG. 17 and FIG. 18, the pattern of the second conductive layer may at least include a second electrode plate C12 of the first capacitor, a second electrode plate C22 of the second capacitor, a first output signal line OUTL1, a second output signal line OUTL2, and a third output signal line OUTL3.

In an exemplary implementation, as shown in FIG. 17 and FIG. 18, the second electrode plate C22 of the second capacitor and the first output signal line OUTL1 may be of an integral structure, and the first output signal line OUTL1 is located on a side of the second electrode plate C22 of the second capacitor close to the display region.

In an exemplary implementation, as shown in FIG. 17 and FIG. 18, an outline of the second electrode plate C12 of the first capacitor may be in a shape of a sickle rotated to the left, and an orthographic projection of the second electrode plate C12 of the first capacitor on the base substrate is at least partially overlapped with an orthographic projection of the first electrode plate C11 of the first capacitor on the base substrate.

In an exemplary implementation, as shown in FIG. 17 and FIG. 18, an outline of the second electrode plate C22 of the second capacitor may be in a shape of a rectangle, corners of which may be chamfered, and an orthographic projection of the second electrode plate C22 of the second capacitor on the base substrate is at least partially overlapped with an orthographic projection of the first electrode plate C21 of the second capacitor on the base substrate.

In an exemplary implementation, as shown in FIG. 17 and FIG. 18, the first output signal line OUTL1, the second output signal line OUTL2, and the third output signal line OUTL3 may extend at least partially along the second direction D2, and may be in shapes of broke lines.

In an exemplary implementation, as shown in FIG. 17 and FIG. 18, the second output signal line OUTL2 may be located on a side of the first output signal line OUTL1 close to the previous stage scan shift register, the third output signal line OUTL3 may be located on a side of the first output signal line OUTL1 close to the next stage scan shift register, and the third output signal line OUTL3 may be located on a side of the second electrode plate C12 of the first capacitor close to the display region.

(4) A pattern of a third insulation layer is formed. In an exemplary implementation, forming the pattern of the third insulation layer may include: depositing a third insulation thin film on the base substrate on which the aforementioned patterns are formed, and patterning the third insulation thin film by a patterning process, to form the third insulation layer covering the second conductive layer, wherein a pattern of a plurality of via holes is arranged on the third insulation layer, as shown in FIG. 19, and FIG. 19 is a schematic diagram after the pattern of the third insulation layer is formed in FIG. 9A.

Figure 19:
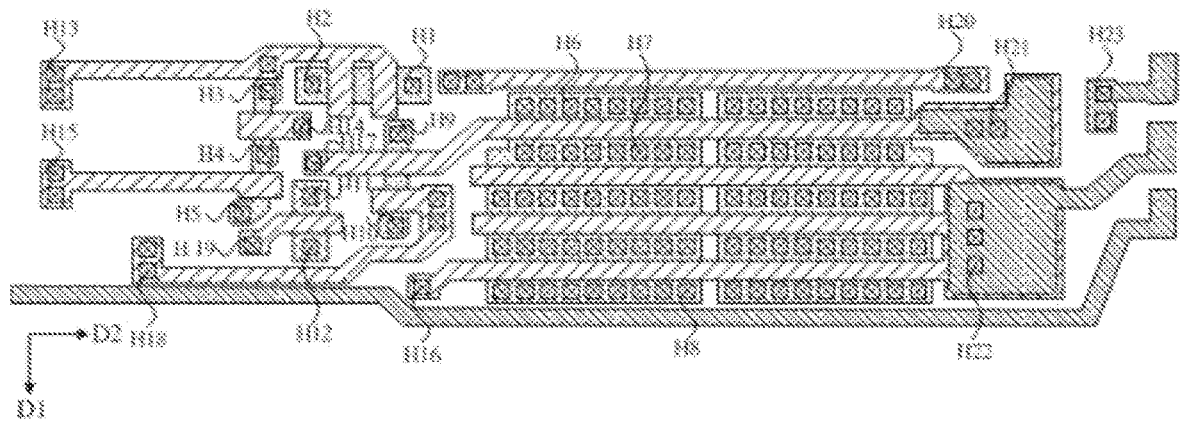
FIG. 19 is a schematic diagram after a pattern of a third insulation layer is formed for the display substrate in FIG. 9A.

In an exemplary implementation, as shown in FIG. 19, the pattern of the plurality of via holes may at least include a first via hole H1 to a twenty-second via hole H22.

In an exemplary implementation, as shown in FIG. 19, an orthographic projection of the first via hole H1 on the base substrate is located within a range of an orthographic projection of a first region of the active layer of the first transistor on the base substrate, the third insulation layer, the second insulation layer and the first insulation layer within the first via hole H1 are etched away to expose a surface of the first region of the active layer of the first transistor, and the first via hole H1 is configured to enable a first electrode of the first transistor T1 formed later to be connected to the first region of the active layer of the first transistor through this via hole H1.

In an exemplary implementation, as shown in FIG. 19, an orthographic projection of the second via hole H2 on the base substrate is located within a range of an orthographic projection of a second region of the active layer of the first transistor on the base substrate, the third insulation layer, the second insulation layer and the first insulation layer within the second via hole H2 is etched away to expose a surface of the second region of the active layer of the first transistor, and the second via hole H2 is configured to enable a second electrode of the first transistor T1 formed later to be connected with the second region of the active layer of the first transistor through this via hole H2.

In an exemplary implementation, as shown in FIG. 19, an orthographic projection of the third via hole H3 on the base substrate is located within a range of an orthographic projection of a first region of the active layer of the second transistor on the base substrate, the third insulation layer, the second insulation layer and the first insulation layer within the third via hole H3 is etched away to expose a surface of the first region of the active layer of the second transistor, and the third via hole H3 is configured to enable a first electrode of the second transistor formed later to be connected with the first region of the active layer of the second transistor through this via hole H3.

In an exemplary implementation, as shown in FIG. 19, an orthographic projection of the fourth via hole H4 on the base substrate is located within a range of an orthographic projection of a second region of the active layer of the second transistor (also a second region of the active layer of the third transistor) on the base substrate, the third insulation layer, the second insulation layer and the first insulation layer within the fourth via hole H4 are etched away to expose a surface of the second region of the active layer of the second transistor (also the second region of the active layer of the third transistor), and the fourth via hole H4 is configured to enable the second electrode of the second transistor (also the second electrode of the third transistor) formed later to be connected with the second region of the active layer of the second transistor (also the second region of the active layer of the third transistor) through this via hole H4.

In an exemplary implementation, as shown in FIG. 19, an orthographic projection of the fifth via hole H5 on the base substrate is located within a range of an orthographic projection of a first region of the active layer of the third transistor on the base substrate, the third insulation layer, the second insulation layer and the first insulation layer within the fifth via hole H5 are etched away to expose a surface of the first region of the active layer of the third transistor, and the fifth via hole H5 is configured to enable a first electrode of the third transistor formed later to be connected to the first region of the active layer of the third transistor through this via hole H5.

In an exemplary implementation, as shown in FIG. 19, an orthographic projection of the sixth via hole H6 on the base substrate is located within a range of an orthographic projection of a first region of the active layer of the fourth transistor on the base substrate, the third insulation layer, the second insulation layer and the first insulation layer within the sixth via hole H6 is etched away to expose a surface of the first region of the active layer of the fourth transistor, and the sixth via hole H6 is configured to enable a first electrode of the fourth transistor formed later to be connected with the first region of the active layer of the fourth transistor through this via hole H6.

In an exemplary implementation, as shown in FIG. 19, an orthographic projection of the seventh via hole H7 on the base substrate is located within a range of an orthographic projection of a second region of the active layer of the fourth transistor (also a second region of the active layer of the fifth transistor) on the base substrate, the third insulation layer, the second insulation layer and the first insulation layer within the seventh via hole H7 are etched away to expose a surface of the second region of the active layer of the fourth transistor (also the second region of the active layer of the fifth transistor), and the seventh via hole H7 is configured to enable the second electrode of the fourth transistor (also the second electrode of the fifth transistor) formed later to be connected with the second region of the active layer of the fourth transistor (also the second region of the active layer of the fifth transistor) through this via hole H7.

In an exemplary implementation, as shown in FIG. 19, an orthographic projection of the eighth via hole H8 on the base substrate is located within a range of an orthographic projection of a first region of the active layer of the fifth transistor on the base substrate, the third insulation layer, the second insulation layer and the first insulation layer within the eighth via hole H8 are etched away to expose a surface of the first region of the active layer of the fourth transistor, and the eighth via hole H8 is configured to enable a first electrode of the fifth transistor formed later to be connected to the first region of the active layer of the fifth transistor through this via hole H8.

In an exemplary implementation, as shown in FIG. 19, an orthographic projection of the ninth via hole H9 on the base substrate is located within a range of an orthographic projection of a first region of the active layer of the sixth transistor on the base substrate, the third insulation layer, the second insulation layer and the first insulation layer within the ninth via hole H9 is etched away to expose a surface of the first region of the active layer of the fourth transistor, and the ninth via hole H9 is configured to enable a first electrode of the sixth transistor formed later to be connected with the first region of the active layer of the sixth transistor through this via hole H9.

In an exemplary implementation, as shown in FIG. 19, an orthographic projection of the tenth via hole H10 on the base substrate is located within a range of an orthographic projection of a second region of the active layer of the seventh transistor on the base substrate, the third insulation layer, the second insulation layer and the first insulation layer within the tenth via hole H10 is etched away to expose a surface of the second region of the active layer of the fourth transistor, and the tenth via hole H10 is configured to enable a second electrode of the seventh transistor formed later to be connected with the second region of the active layer of the seventh transistor through this via hole H10.

In an exemplary implementation, as shown in FIG. 19, an orthographic projection of the eleventh via hole H11 on the base substrate is located within a range of an orthographic projection of a first region of the active layer of the eighth transistor on the base substrate, the third insulation layer, the second insulation layer and the first insulation layer within the eleventh via hole H11 are etched away to expose a surface of the first region of the active layer of the fourth transistor, and the eleventh via hole H11 is configured to enable a first electrode of the eighth transistor formed later to be connected to the first region of the active layer of the eighth transistor through this via hole H11.

In an exemplary implementation, as shown in FIG. 19, an orthographic projection of the twelfth via hole H12 on the base substrate is located within a range of an orthographic projection of a second region of the active layer of the eighth transistor on the base substrate, the third insulation layer, the second insulation layer and the first insulation layer within the twelfth via hole H12 is etched away to expose a surface of the first region of the active layer of the fourth transistor, and the twelfth via hole H12 is configured to enable a second electrode of the eighth transistor formed later to be connected with the second region of the active layer of the eighth transistor through this via hole H12.

In an exemplary implementation, as shown in FIG. 19, an orthographic projection of the thirteenth via hole H13 on the base substrate is located within a range of an orthographic projection of the control electrode of the first transistor on the base substrate, the third insulation layer and the second insulation layer within the thirteenth via hole H13 are etched away to expose a surface of the control electrode of the first transistor, and the thirteenth via hole H13 is configured to enable a first clock sub-segment of the second clock signal line and the first electrode of the second transistor formed later to be connected to the control electrode of the first transistor through this via hole H13.

In an exemplary implementation, as shown in FIG. 19, an orthographic projection of the fourteenth via hole H14 on the base substrate is located within a range of an orthographic projection of the control electrode of the second transistor on the base substrate, the third insulation layer and the second insulation layer within the fourteenth via hole H14 are etched away to expose a surface of the control electrode of the second transistor, and the fourteenth via hole H14 is configured to enable the second electrode of the first transistor (also the second electrode of the seventh transistor and the first electrode of the eighth transistor) formed later to be connected with the control electrode of the first transistor through this via hole H14.

In an exemplary implementation, as shown in FIG. 19, an orthographic projection of the fifteenth via hole H15 on the base substrate is located within a range of an orthographic projection of the control electrode of the third transistor on the base substrate, the third insulation layer and the second insulation layer within the fifteenth via hole H15 are etched away to expose a surface of the control electrode of the second transistor, and the fifteenth via hole H15 is configured to enable a first clock sub-segment of the second clock signal line formed later to be connected to the control electrode of the third transistor through this via hole H15.

In an exemplary implementation, as shown in FIG. 19, an orthographic projection of the sixteenth via hole H16 on the base substrate is located within a range of an orthographic projection of the control electrode of the fifth transistor on the base substrate, the third insulation layer and the second insulation layer within the sixteenth via hole H16 are etched away to expose a surface of the control electrode of the fifth transistor, and the sixteenth via hole H16 is configured to enable a second electrode of the eighth transistor formed later to be connected to the control electrode of the fifth transistor through this via hole H16.

In an exemplary implementation, as shown in FIG. 19, an orthographic projection of the seventeenth via hole H17 on the base substrate is located within a range of an orthographic projection of the control electrode of the sixth transistor on the base substrate, the third insulation layer and the second insulation layer within the seventeenth via hole H17 are etched away to expose a surface of the control electrode of the sixth transistor, and the seventeenth via hole H17 is configured to enable the second electrode of the second transistor (also the second electrode of the third transistor) formed later to be connected to the control electrode of the sixth transistor through this via hole H17.

In an exemplary implementation, as shown in FIG. 19, an orthographic projection of the eighteenth via hole H18 on the base substrate is located within a range of an orthographic projection of the control electrode of the seventh transistor on the base substrate, the third insulation layer and the second insulation layer within the eighteenth via hole H18 are etched away to expose a surface of the control electrode of the seventh transistor, and the eighteenth via hole H18 is configured to enable the first electrode of the fifth transistor and a first clock sub-segment of the first clock signal line formed later to be connected to the control electrode of the seventh transistor through this via hole H18.

In an exemplary implementation, as shown in FIG. 19, an orthographic projection of the nineteenth via hole H19 on the base substrate is located within a range of an orthographic projection of the control electrode of the eighth transistor on the base substrate, the third insulation layer and the second insulation layer within the nineteenth via hole H19 are etched away to expose a surface of the control electrode of the eighth transistor, and the nineteenth via hole H19 is configured to enable the first electrode of the third transistor formed later to be connected to the control electrode of the eighth transistor through this via hole H19.

In an exemplary implementation, as shown in FIG. 19, an orthographic projection of the twentieth via hole H20 on the base substrate is located within a range of an orthographic projection of the first connection line on the base substrate, the third insulation layer and the second insulation layer within the twentieth via hole H20 are etched away to expose a surface of the first connection line, and the twentieth via hole H20 is configured to enable the first electrode of the first transistor formed later to be connected to the first connection line through this via hole H20.

In an exemplary implementation, as shown in FIG. 19, an orthographic projection of the twenty-first via hole H21 on the base substrate is located within a range of an orthographic projection of the second electrode plate of the first capacitor on the base substrate, the third insulation layer within the twenty-first via hole H21 is etched away to expose a surface of the second electrode plate of the first capacitor, and the twenty-first via hole H21 is configured to enable the first electrode of the fourth transistor formed later to be connected to the second electrode plate of the first capacitor through this via hole H21.

In an exemplary implementation, as shown in FIG. 19, an orthographic projection of the twenty-second via hole H22 on the base substrate is located within an orthographic projection of the second electrode plate of the second capacitor on the base substrate, the third insulation layer within the twenty-second via hole H22 is etched away to expose a surface of the second electrode plate of the second capacitor, and the twenty-second via hole H22 is configured to enable the second electrode of the fourth transistor (also the second electrode of the fifth transistor) formed later to be connected to the second electrode plate of the second capacitor through this via hole H22.

In an exemplary implementation, as shown in FIG. 19, an orthographic projection of the twenty-third via hole H23 on the base substrate is located within a range of an orthographic projection of the third output signal line on the base substrate, the third insulation layer within the twenty-third via hole H23 is etched away to expose a surface of the third output signal line, and the twenty-third via hole H23 is configured to enable a first initial sub-segment of the first initial power supply line formed later to be connected to the third output signal line through this via hole H23.

Figure 20:
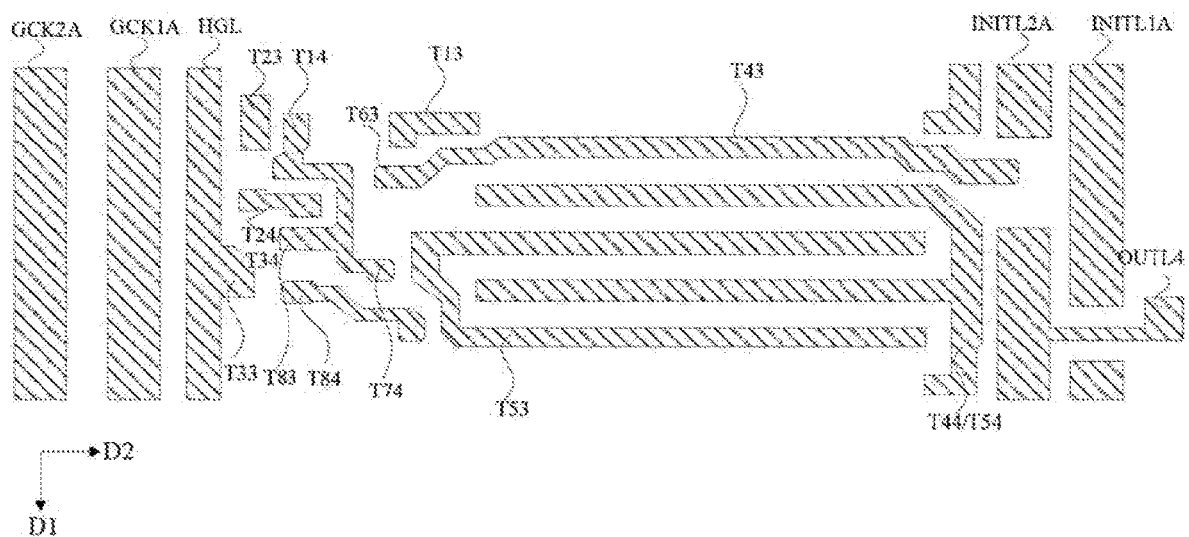
FIG. 20 is a schematic diagram of a pattern of the third conductive layer for the display substrate in FIG. 9A.
Figure 21:
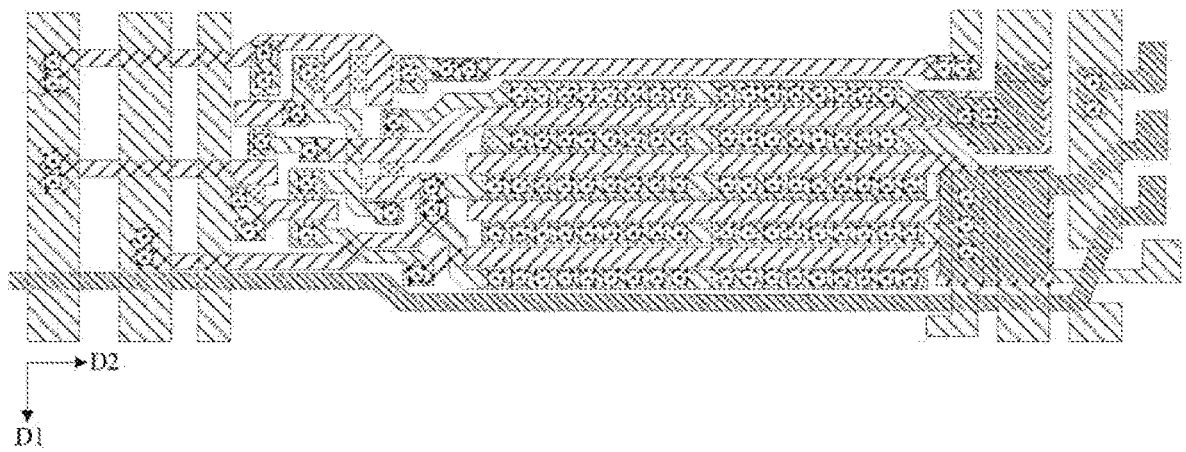
FIG. 21 is a schematic diagram after a pattern of a third conductive layer is formed for the display substrate in FIG. 9A.

(5) A pattern of a third conductive layer is formed. In an exemplary implementation, forming the third conductive layer may include: depositing a third conductive thin film on the base substrate on which the aforementioned patterns are formed, patterning the third conductive thin film by using a patterning process to form the third conductive layer arranged on the third insulation layer, as shown in FIG. 20 to FIG. 21, wherein FIG. 20 is a schematic diagram of a pattern of a third conductive layer in FIG. 9A, and FIG. 21 is a schematic diagram after the pattern of the third conductive layer is formed in FIG. 9A. In an exemplary implementation, the third conductive layer may be referred to as a first source-drain metal (SD1) layer.

In an exemplary implementation, as shown in FIG. 20 and FIG. 21, the pattern of the third conductive layer may at least include a first clock sub-segment GCK1A of the first clock signal line, a first clock sub-segment GCK2A of the second clock signal line, a second power supply line VGL, a first initial sub-segment INITL1A of the first initial power supply line, a first initial sub-segment INITL2A of the second initial power supply line, a fourth output signal line OUTL4, a first electrode T13 and second electrode T14 of the first transistor to a first electrode T53 and second electrode T54 of the fifth transistor, a first electrode T63 of the sixth transistor, a second electrode T74 of the seventh transistor, and a first electrode T83 and second electrode T84 of the eighth transistor.

In an exemplary implementation, as shown in FIG. 20 and FIG. 21, a shape of the first clock sub-segment GCK2A of the second clock signal line may be in a shape of a line extending at least partially along the first direction D1, and the first clock sub-segment GCK2A of the second clock signal line is connected to the control electrode of the first transistor through the thirteenth via hole, and is connected to the control electrode of the third transistor through the fifteenth via hole.

In an exemplary implementation, as shown in FIG. 20 and FIG. 21, a shape of the first clock sub-segment GCK1A of the first clock signal line may be in a shape of a line extending at least partially along the first direction D1, and is located on a side of the first clock sub-segment GCK2A of the second clock signal line close to the display region, and the first clock sub-segment GCK1A of the first clock signal line is connected to the control electrode of the seventh transistor through the eighteenth via hole.

In an exemplary implementation, as shown in FIG. 20 and FIG. 21, the first clock sub-segment GCK2A of the second clock signal line and the first clock sub-segment GCK1A of the first clock signal line may be designed with equal widths, or may be designed with unequal widths, may be straight lines, or may be broke lines, which can not only facilitate the layout of the scan drive circuit, but also reduce the parasitic capacitance between the signal lines, and the present disclosure is not limited thereto.

In an exemplary implementation, as shown in FIG. 20 and FIG. 21, the second power supply line VGL and the first electrode T33 of the third transistor are of an integral structure, the second power supply line VGL may be in a shape of a line extending at least partially along the first direction D1, and is located on a side of the first clock sub-segment GCK1A of the first clock signal line close to the display region. The first electrode T33 of the third transistor is located on a side of the second power supply line VGL close to the display region, and the first electrode T33 of the third transistor is connected to the first region of the active layer of the third transistor through the fifth via hole, and is connected to the control electrode of the eighth transistor through the nineteenth via hole.

In an exemplary implementation, a width of the second power supply line VGL may be smaller than a width of the first clock sub-segment GCK2A of the second clock signal line or a width of the first clock sub-segment GCK1A of the first clock signal line.

In an exemplary implementation, as shown in FIG. 20 and FIG. 21, the first electrode T13 of the first transistor may extend along the second direction D2, and the first electrode T13 of the first transistor is connected to the first region of the active layer of the first transistor through the first via hole, and is connected to the first connection line through the twentieth via hole, the first connection line is connected to the second electrode of the fourth transistor (also the second electrode of the fifth transistor) of the previous stage scan shift register, so as to achieve the cascading of the current stage scan shift register and the previous stage scan shift register.

In an exemplary implementation, as shown in FIG. 20 and FIG. 21, the second electrode T14 of the first transistor, the second electrode T74 of the seventh transistor, and the first electrode T83 of the eighth transistor may be of an integral structure, and may be connected to the second region of the active layer of the first transistor through the second via hole, be connected to the control electrode of the second transistor through the fourteenth via hole, be connected to the second region of the active layer of the seventh transistor through the tenth via hole, and be connected to the first region of the active layer of the eighth transistor through the eleventh via hole.

In an exemplary example, as shown in FIG. 20 and FIG. 21, the first electrode T23 of the second transistor may be in a shape of a line extending along the first direction. Herein, the first electrode T23 of the second transistor may be connected to the first region of the active layer of the second transistor through the third via hole, and is connected to the control electrode of the first transistor through the thirteenth via hole.

In the exemplary implementation, as shown in FIG. 20 and FIG. 21, the second electrode T24 of the second transistor and the second electrode T34 of the third transistor are of an integral structure, and may be in a shape of a line extending along the second direction D2. Herein, the integral structure of the second electrode T24 of the second transistor and the second electrode T34 of the third transistor may be connected to the second region of the active layer of the second transistor (also the second region of the active layer of the third transistor) through the fourth via hole, and is connected to the control electrode of the sixth transistor through the seventeenth via hole.

In an exemplary implementation, as shown in FIG. 20 and FIG. 21, the second electrode T24 of the second transistor and the second electrode T34 of the third transistor are of an integral structure, and may be in a shape of a line extending along the second direction D2. Herein, the integral structure of the second electrode T24 of the second transistor and the second electrode T34 of the third transistor may be connected to the second region of the active layer of the second transistor (also the second region of the active layer of the third transistor) through the fourth via hole, and is connected to the control electrode of the sixth transistor through the seventeenth via hole.

In an exemplary implementation, as shown in FIG. 20 and FIG. 21, the first electrode T43 of the fourth transistor and the first electrode T63 of the sixth transistor may be of an integral structure, and may extend at least partially along the second direction D2. The integral structure of the first electrode T43 of the fourth transistor and the first electrode T63 of the sixth transistor may be connected to the first region of the active layer of the fourth transistor through the sixth via hole, be connected to the first region of the active layer of the sixth transistor through the ninth via hole, and be connected to the second electrode plate of the first capacitor through the twenty-first via hole.

In an exemplary implementation, as shown in FIG. 20 and FIG. 21, the second electrode T44 of the fourth transistor and the second electrode T54 of the fifth transistor are of an integral structure, and may be in a shape of "F" inverted horizontally. Herein, the integral structure of the second electrode T44 of the fourth transistor and the second electrode T54 of the fifth transistor may be connected to the second region of the active layer of the fourth transistor (also the second region of the active layer of the fifth transistor) through the seventh via hole, and be connected to the second electrode plate of the second capacitor through the twenty-second via hole.

In an exemplary implementation, as shown in FIG. 20 and FIG. 21, the first electrode T53 of the fifth transistor may be in an "n" shape with an opening facing the display region. Herein, the first electrode T53 of the fifth transistor may be connected to the first region of the active layer of the fifth transistor through the eighth via hole, and be connected to the control electrode of the seventh transistor through the eighteenth via hole.

In an exemplary implementation, as shown in FIG. 20 and FIG. 21, the second electrode T84 of the eighth transistor may extend at least partially along the second direction D2. Herein, the second electrode T84 of the eighth transistor may be connected to the second region of the active layer of the eighth transistor through the twelfth via hole, and be connected to the control electrode of the fifth transistor through the sixteenth via hole.

In the exemplary implementation, as shown in FIG. 20 and FIG. 21, the first initial sub-segment INITL2A of the second initial power supply line and the fourth output signal line OUTL4 are of an integral structure, and the fourth output signal line OUTL4 is located on a side of the first initial sub-segment INITL2A of the second initial power supply line close to the display region.

In an exemplary implementation, as shown in FIG. 20 and FIG. 21, the first initial sub-segment INITL2A of the second initial power supply line may be in a shape of a line extending at least partially along the first direction D1, and includes a plurality of power supply electrodes arranged at intervals, and the first initial sub-segment INITL2A of the second initial power supply line may be located on a side of the integral structure of the second electrode T44 of the fourth transistor and the second electrode T54 of the fifth transistor close to the display region.

In an exemplary implementation, as shown in FIG. 20 and FIG. 21, the fourth output signal line OUTL4 may extend at least partially along the second direction D2.

In an exemplary implementation, as shown in FIG. 20 and FIG. 21, an orthographic projection of the first initial sub-segment INITL2A of the second initial power supply line on the base substrate is at least partially overlapped with orthographic projections of the second electrode plate of the first capacitor and the second electrode plate of the second capacitor on the base substrate.

In an exemplary implementation, as shown in FIG. 20 and FIG. 21, the first initial sub-segment INITL1A of the first initial power supply line may be in a shape of a line extending at least partially along the first direction D1, and includes a plurality of power supply electrodes arranged at intervals, and the first initial sub-segment INITL1A of the first initial power supply line may be located on a side of the first initial sub-segment INITL2A of the second initial power supply line close to the display region.

In an exemplary implementation, as shown in FIG. 20 and FIG. 21, the first initial sub-segment INITL1A of the first initial power supply line and the first initial sub-segment INITL2A of the second initial power supply line may be designed with equal widths, or may be designed with non-equal widths, may be straight lines, or may be broke lines, which can not only facilitate the layout of the scan drive circuit, but also reduce the parasitic capacitance between the signal lines, and the present disclosure is not limited thereto.

(6) A pattern of a fourth insulation layer is formed. In an exemplary implementation, forming the pattern of the fourth insulation layer may include: depositing a fourth insulation thin film on the base substrate on which the aforementioned patterns are formed, and patterning the fourth insulation thin film by a patterning process, to form a fourth insulation layer covering the third conductive layer, wherein a plurality of via holes are arranged on the fourth insulation layer, as shown in FIG. 22, and FIG. 22 is a schematic diagram after the pattern of the fourth insulation layer is formed in FIG. 9A.

In an exemplary implementation, the plurality of via holes at least include a twenty-fourth via hole H24 to a twenty-eighth via hole H28.

Figure 22:
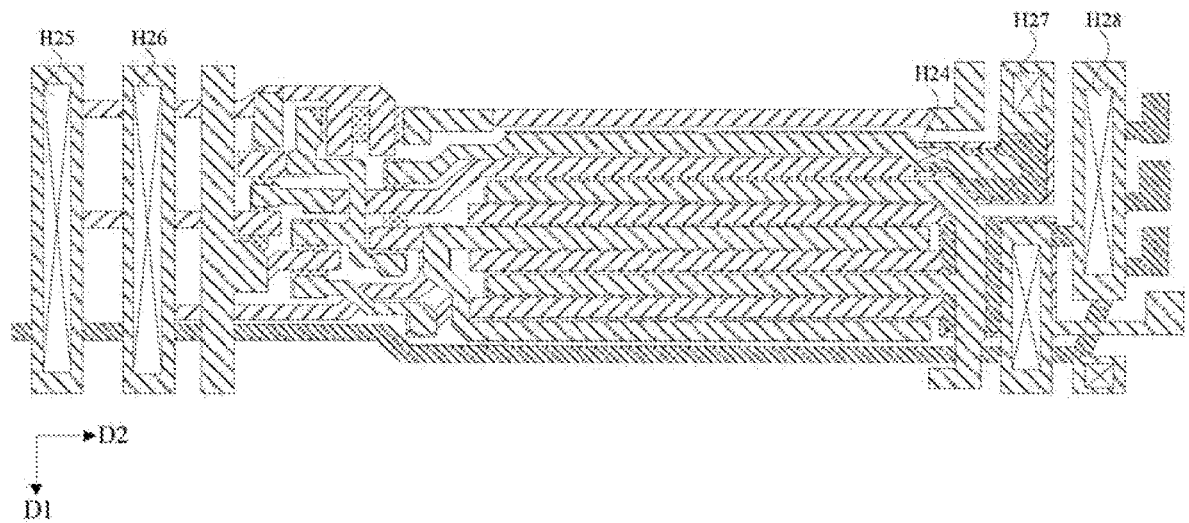
FIG. 22 is a schematic diagram after a pattern of a fourth insulation layer is formed for the display substrate in FIG. 9A.

In an exemplary implementation, as shown in FIG. 22, an orthographic projection of the twenty-fourth via hole H24 on the base substrate is located within a range of an orthographic projection of the first electrode of the fourth transistor on the base substrate, the fourth insulation layer of the twenty-fourth via hole H24 is etched away to expose a surface of the first electrode of the fourth transistor, and the twenty-fourth via hole H24 is configured to enable the first power supply line formed later to be connected to the first electrode of the fourth transistor through this via hole H24.

In an exemplary implementation, as shown in FIG. 22, an orthographic projection of the twenty-fifth via hole H25 on the base substrate is located within a range of an orthographic projection of the first clock sub-segment of the second clock signal line on the base substrate, the fourth insulation layer of the twenty-fourth via hole H24 is etched away to expose a surface of the first clock sub-segment of the second clock signal line, and the twenty-fourth via hole H24 is configured to enable the second clock sub-segment of the second clock signal line formed later to be connected to the first clock sub-segment of the second clock signal line through the via hole H25.

In an exemplary implementation, as shown in FIG. 22, an orthographic projection of the twenty-sixth via hole H26 on the base substrate is located within a range of an orthographic projection of the first clock sub-segment of the first clock signal line on the base substrate, the fourth insulation layer of the twenty-fifth via hole H25 is etched away to expose a surface of the first clock sub-segment of the first clock signal line, and the twenty-fifth via hole H25 is configured to enable the second clock sub-segment of the first clock signal line formed later to be connected to the first clock sub-segment of the first clock signal line through the via hole H26.

In an exemplary implementation, as shown in FIG. 22, an orthographic projection of the twenty-seventh via hole H27 on the base substrate is located within a range of an orthographic projection of the first initial sub-segment of the second initial power supply line on the base substrate, the fourth insulation layer of the twenty-seventh via hole H27 is etched away to expose a surface of the first initial sub-segment of the second initial power supply line, and the twenty-seventh via hole H27 is configured to enable the second initial sub-segment of the second initial power supply line formed later to be connected to the first initial sub-segment of the second initial power supply line through this via hole H27.

In an exemplary implementation, as shown in FIG. 22, an orthographic projection of the twenty-eighth via hole H28 on the base substrate is located within a range of an orthographic projection of the first initial sub-segment of the first initial power supply line on the base substrate, the fourth insulation layer of the twenty-eighth via hole H28 is etched away to expose a surface of the first initial sub-segment of the first initial power supply line, and the twenty-eighth via hole H28 is configured to enable the second initial sub-segment of the first initial power supply line formed later to be connected to the first initial sub-segment of the first initial power supply line through this via hole H28.

Figure 23:
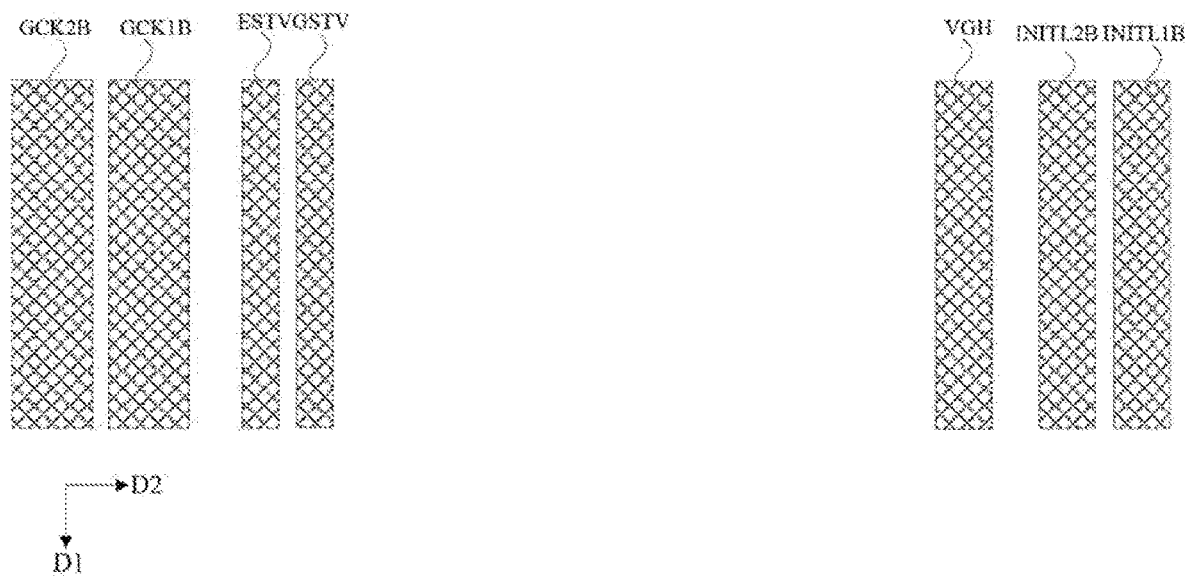
FIG. 23 is a schematic diagram of a fourth conductive layer for the display substrate in FIG. 9A.
Figure 24:
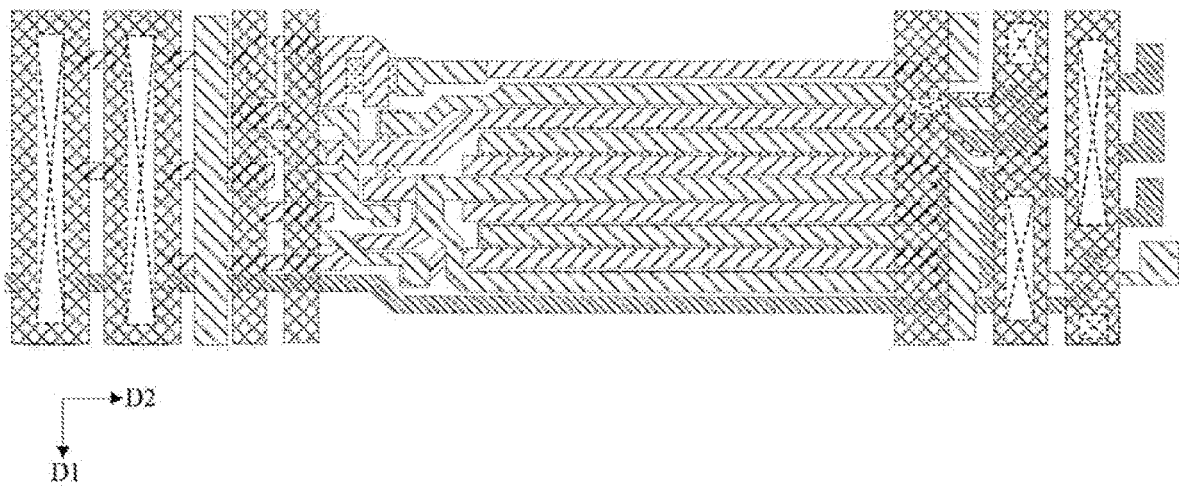
FIG. 24 is a schematic diagram of a pattern of the fourth conductive layer formed for the display substrate in FIG. 9A.

(7) A pattern of a fourth conductive layer is formed. In an exemplary implementation, forming the fourth conductive layer may include: depositing a fourth conductive thin film on the base substrate on which the aforementioned patterns are formed, patterning the fourth conductive thin film by using a patterning process to form the fourth conductive layer arranged on the fourth insulation layer. As shown in FIG. 23 and FIG. 24, FIG. 23 is a schematic diagram of the fourth conductive layer in FIG. 9A, and FIG. 24 is a schematic diagram of the fourth conductive layer formed in FIG. 9A. In an exemplary implementation, the fourth conductive layer may be referred to as a second source-drain metal (SD2) layer.

In an exemplary implementation, as shown in FIG. 23 and FIG. 24, the pattern of the fourth conductive layer may at least include a second clock sub-segment GCK1B of the first clock signal line, a second clock sub-segment GCK2B of the second clock signal line, a first power supply line VGH, a second initial sub-segment INITL1B of the first initial power supply line, a second initial sub-segment INITL2B of the second initial power supply line, a first initial signal line GSTV, and a second initial signal line ESTV.

In an exemplary implementation, as shown in FIG. 23 and FIG. 24, the second clock sub-segment GCK2B of the second clock signal line may be in a shape of a line extending at least partially along the first direction D1, an orthographic projection of the second clock sub-segment GCK2B of the second clock signal line on the base substrate is at least partially overlapped with an orthographic projection of the first clock sub-segment of the second clock signal line on the base substrate, and is connected to the first clock sub-segment of the second clock signal line through the twenty-fifth via hole to form the second clock signal line.

In an exemplary implementation, as shown in FIG. 23 and FIG. 24, the second clock sub-segment GCK1B of the first clock signal line may be in a shape of a line extending at least partially along the first direction D1, an orthographic projection of the second clock sub-segment GCK1B of the first clock signal line on the base substrate is at least partially overlapped with an orthographic projection of the first clock sub-segment of the first clock signal line on the base substrate, and is connected to the first clock sub-segment of the first clock signal line through the twenty-sixth via hole to form the first clock signal line.

In an exemplary implementation, as shown in FIG. 23 and FIG. 24, the second initial sub-segment GCK2B of the second clock signal line and the second clock sub-segment GCK1B of the first clock signal line may be designed with equal widths, or may be designed with unequal widths, may be straight lines, or may be broke lines, which can not only facilitate the layout of the scan drive circuit, but also reduce the parasitic capacitance between the signal lines, and the present disclosure is not limited thereto.

In an exemplary implementation, as shown in FIG. 23 and FIG. 24, the second initial signal line ESTV is located on a side of the second clock sub-segment GCK1B of the first clock signal line close to the display region, and an orthographic projection of the second initial signal line ESTV on the base substrate is at least partially overlapped with an orthographic projection of the first electrode of the third transistor on the base substrate.

In an exemplary implementation, as shown in FIG. 23 and FIG. 24, the first initial signal line GSTV is located on a side of the second initial signal line ESTV close to the display region, and an orthographic projection of the first initial signal line GSTV on the base substrate is at least partially overlapped with an orthographic projection of the control electrode of the eighth transistor on the base substrate.

In an exemplary implementation, as shown in FIG. 23 and FIG. 24, the second initial signal line ESTV and the first initial signal line GSTV may be designed with equal widths, or may be designed with unequal widths, may be straight lines, or may be broke lines, which can not only facilitate the layout of the scan drive circuit, but also reduce the parasitic capacitance between the signal lines, and the present disclosure is not limited thereto.

In an exemplary implementation, as shown in FIG. 23 and FIG. 24, the first power supply line VGH may be in a shape of a line extending at least partially along the first direction D1, and an orthographic projection of the first power supply line VGH on the base substrate is at least partially overlapped with orthographic projections of the second electrode of the fourth transistor (also the second electrode of the fifth transistor) and the first electrode of the fourth transistor on the base substrate, and is connected to the first electrode of the fourth transistor through the twenty-fourth via hole.

In an exemplary implementation, as shown in FIG. 23 and FIG. 24, the second initial sub-segment INITL2B of the second initial power supply line may be in a shape of a line extending at least partially along the first direction D1, an orthographic projection of the second initial sub-segment INITL2B of the second initial power supply line on the base substrate is at least partially overlapped with an orthographic projection of the first initial sub-segment of the second initial power supply line on the base substrate, and is connected to the first initial sub-segment of the second initial power supply line through the twenty-seventh via hole to form the second initial power supply line.

In an exemplary implementation, as shown in FIG. 23 and FIG. 24, the second initial sub-segment INITL1B of the first initial power supply line may be in a shape of a line extending at least partially along the first direction D1, an orthographic projection of the second initial sub-segment INITL1B of the first initial power supply line on the base substrate is at least partially overlapped with an orthographic projection of the first initial sub-segment of the first initial power supply line on the base substrate, and is connected to the first initial sub-segment of the first initial power supply line through the twenty-eighth via hole to form the first initial power supply line.

In an exemplary implementation, as shown in FIG. 23 and FIG. 24, the second initial sub-segment INITL2B of the second initial power supply line and the second initial sub-segment INITL1B of the first initial power supply line may be designed with equal widths, or may be designed with non-equal widths, may be straight lines, or may be broke lines, which can not only facilitate the layout of the scan drive circuit, but also reduce the parasitic capacitance between the signal lines, and the present disclosure is not limited thereto.

(8) A pattern of a fifth conductive layer is formed. In an exemplary implementation, forming the pattern of the fifth conductive layer may include: depositing sequentially a fifth insulation thin film and a fifth conductive thin film on the base substrate on which the aforementioned patterns are formed, and patterning the fifth conductive thin film by a patterning process to form a fourth insulation layer covering the pattern of the pattern of the fourth conductive layer, and the pattern of the fifth conductive layer arranged on the first insulation layer. In an exemplary implementation, the fifth conductive layer may be referred to as a third source-drain metal (SD3) layer.

In an exemplary implementation, the pattern of the fifth conductive layer may at least include a first output connection line, a second output connection line, a third output connection line, and a fourth output connection line.

In an exemplary implementation, the first output connection line is connected to the first output signal line, the second output connection line is connected to the second output signal line, the third output connection line is connected to the third output signal line, and the fourth output connection line is connected to the fourth output signal line.

So far, the drive circuit layer has been prepared on the base substrate. The drive circuit layer may include a semiconductor layer, a first insulation layer, a first conductive layer, a second insulation layer, a second conductive layer, a third insulation layer, a third conductive layer, a fourth insulation layer, a fourth conductive layer, a fifth insulation layer, and a fifth conductive layer which are arranged sequentially on the base substrate.

In an exemplary implementation, the semiconductor layer may be a metal oxide layer. The metal oxide layer may be made of an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. The metal oxide layer may be a single layer, double layers or multi layers. An active layer thin film may be made of an amorphous Indium Gallium Zinc Oxide (a-IGZO), Zinc OxyNitride (ZnON), indium Zinc Tin Oxide (IZTO), amorphous Silicon (a-Si), polycrystalline Silicon (p-Si), hexathiophene, polythiophene, and other materials, that is, the present disclosure is applicable to transistors manufactured based on an oxide technology, a silicon technology, or an organic substance technology.

In an exemplary implementation, the first conductive layer, the second conductive layer, the third conductive layer, the fourth conductive layer, and the fifth conductive layer may be made of a metal material, such as any one or more of Argentum (Ag), Copper (Cu), Aluminum (Al), and Molybdenum (Mo), or an alloy material of the above-mentioned metals, such as Aluminum-Neodymium alloy (AlNd) or Molybdenum-Niobium alloy (MoNb), and may be in a single-layer structure, or a multilayer composite structure such as Mo/Cu/Mo.

In an exemplary implementation, the first insulation layer, the second insulation layer, the third insulation layer, the fourth insulation layer and the fifth insulation layer may be made of any one or more of silicon oxide (SiOx), silicon nitride (SiNx) and silicon oxynitride (SiON), and may be a single layer, multi layers or a composite layer. The first insulation layer and the second insulation layer may be referred to as Gate Insulation (GI) layers, the third insulation layer and the fourth insulation layer may be referred to as Interlayer Dielectric (ILD) layers, and the fifth insulation layer may be referred to as a Passivation (PVX) layer.

In an exemplary implementation, when the second output signal line is of a double-layer structure, the pattern of the second conductive layer formed in act (3) includes a first output sub-segment of the second output signal line, and it may include forming a pattern of a sixth conductive layer between act (3) and act (4). Forming the pattern of the sixth conductive layer may include sequentially depositing a sixth insulation thin film and a sixth conductive thin film on the base substrate on which the aforementioned patterns are formed, patterning the sixth conductive thin film by a patterning process, forming a sixth insulation layer covering the pattern of the second conductive layer, and a pattern of the sixth conductive layer arranged on the sixth insulation layer.

In an exemplary implementation, the pattern of the sixth conductive layer may at least include a second output sub-segment of the second output signal line.

In an exemplary implementation, a fourth insulation layer covering the sixth conductive layer is formed in act (4), and the subsequent acts are the same as the flow for forming FIG. 9A in the aforementioned embodiments, which are not repeated in this disclosure.

In an exemplary implementation, the sixth conductive layer may be made of a metal material, such as any one or more of Argentum (Ag), Copper (Cu), Aluminum (Al), and Molybdenum (Mo), or an alloy material of the above-mentioned metals, such as Aluminum-Neodymium alloy (AlNd) or Molybdenum-Niobium alloy (MoNb), and may be in a single-layer structure, or a multilayer composite structure such as Mo/Cu/Mo.

In an exemplary implementation, the sixth insulation layer may be any one or more of silicon oxide (SiOx), silicon nitride (SiNx), and silicon oxynitride (SiON), and may be in a single layer, a multi-layer, or a composite layer.

In an exemplary implementation, after preparation of the drive circuit layer is completed, a light emitting structure layer is prepared on the drive circuit layer, and a preparation process of the light emitting structure layer may include following operations.

(9) A light emitting structure layer is formed. In an exemplary implementation, forming the light emitting structure layer may include: coating a first planarization thin film on the base substrate on which the aforementioned patterns are formed; patterning the first planarization thin film by a patterning process to form a first planarization layer; depositing an anode conductive thin film on the aforementioned patterns formed; patterning the anode conductive thin film by a patterning process to form an anode conductive layer arranged on the planarization layer, wherein the anode conductive layer at least includes a plurality of anode patterns; coating a pixel definition thin film on the base substrate on which the aforementioned patterns are formed; patterning the pixel definition film by a patterning process to form a pixel definition layer; and forming an organic light emitting layer on the base substrate on which the aforementioned patterns are formed by an evaporation process or an inkjet printing process at first, subsequently forming a cathode on the organic emitting layer, and then forming an encapsulation structure layer.

In an exemplary implementation, the encapsulation structure layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is provided between the first encapsulation layer and the third encapsulation layer, which can ensured that external water vapor cannot enter the light emitting structure layer.

In an exemplary implementation, a material of the pixel definition layer may include polyimide, acrylic, or polyethylene terephthalate.

In an exemplary implementation, the planarization layer may be made of an organic material.

In an exemplary implementation, the anode thin film may be made of Indium Tin Oxide (ITO) or Indium Zinc Oxide (IZO).

In an exemplary implementation, the cathode thin film may be made of any one or more of Magnesium (Mg), Argentum (Ag), Aluminum (A1), Copper (Cu), and Lithium (Li), or an alloy made of any one or more of the above metals.

Exemplary description is made below through the preparation process of FIG. 10A, which shows a dummy scan shift register including a first transistor DT1, a second transistor DT2, and a fourth transistor DT4 to an eighth transistor DT8.

(1) A pattern of a semiconductor layer is formed on the base substrate. In an exemplary implementation, forming the pattern of the semiconductor layer may include depositing a semiconductor thin film on the base substrate, and patterning the semiconductor thin film by a patterning process to form the pattern of the semiconductor layer, as shown in FIG. 25, which is a schematic diagram after the pattern of the semiconductor layer in FIG. 10A is formed.

Figure 25:
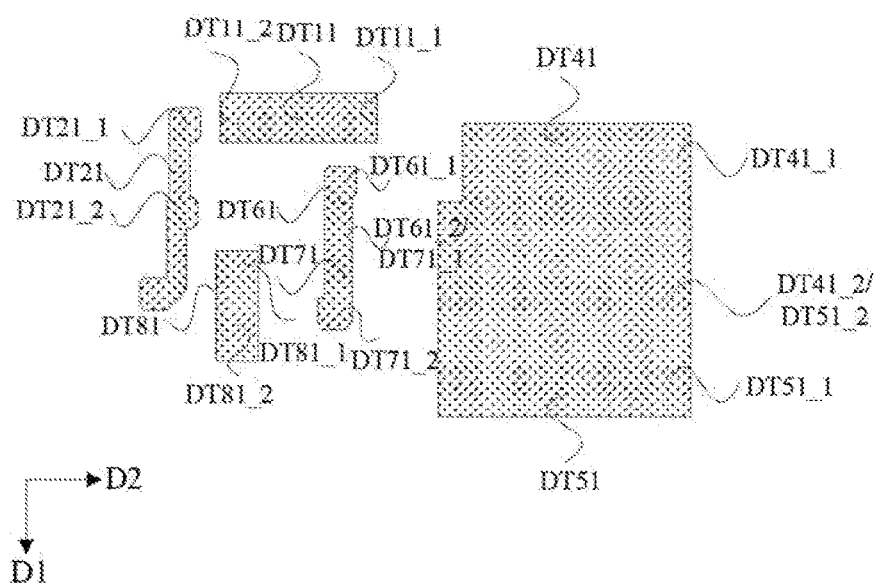
FIG. 25 is a schematic diagram after a pattern of a semiconductor layer is formed for the display substrate in FIG. 10A.

In an exemplary implementation, as shown in FIG. 25, the pattern of the semiconductor layer may include an active layer DT11 of a first transistor, an active layer DT21 of a second transistor, and an active layer DT41 of a fourth transistor to an active layer DT81 of an eighth transistor.

In an exemplary implementation, the active layer DT11 of the first transistor, the active layer DT21 of the second transistor, and the active layer DT61 of the sixth transistor to the active layer DT81 of the eighth transistor in FIG. 25 are identical in positions and structures to the active layer T11 of the first transistor, the active layer T21 of the second transistor, and the active layer T61 of the sixth transistor to the active layer T81 of the eighth transistor in FIG. 14. The difference is that the integral structure of the active layer DT41 of the fourth transistor and the active layer DT51 of the fifth transistor in FIG. 25 may be in a shape of "I".

Figure 26:
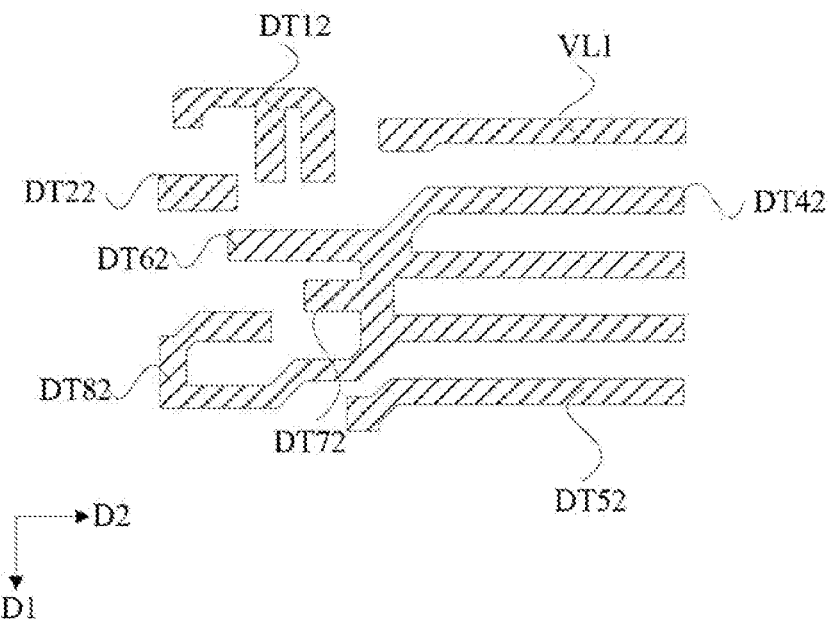
FIG. 26 is a schematic diagram of a pattern of a first conductive layer for the display substrate in FIG. 10A.
Figure 27:
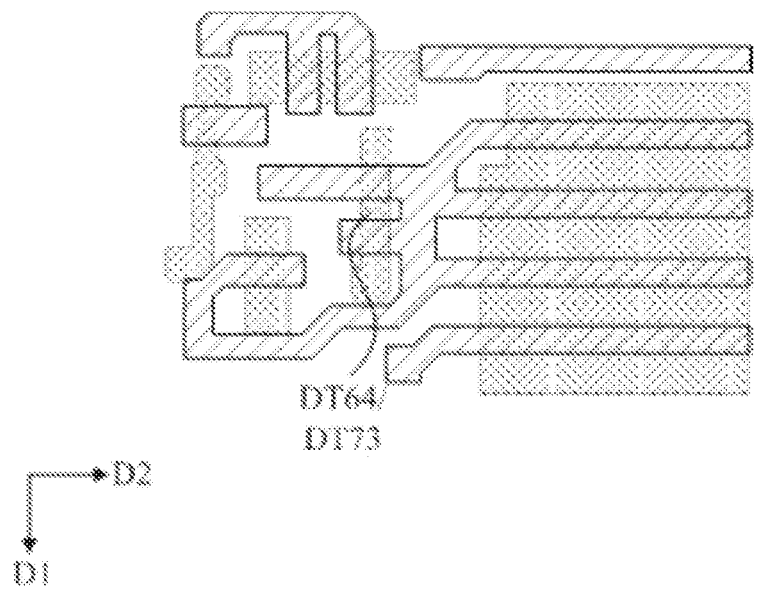
FIG. 27 is a schematic diagram after a pattern of the first conductive layer is formed for the display substrate in FIG. 10A.

(2) A pattern of a first conductive layer is formed. In an exemplary implementation, forming the pattern of the first conductive layer may include: sequentially depositing a first insulation thin film and a first conductive thin film on the base substrate on which the aforementioned patterns are formed, and patterning the first conductive thin film by a patterning process to form a first insulation layer that covers the pattern of the semiconductor layer and the pattern of the first conductive layer arranged on the first insulation layer. As shown in FIG. 26 and FIG. 27, FIG. 26 is a schematic diagram of a pattern of the first conductive layer in FIG. 10A, and FIG. 27 is a schematic diagram after the pattern of the first conductive layer is formed in FIG. 10A. In an exemplary implementation, the first conductive layer may be referred to as a first gate metal (GATE1) layer.

In an exemplary implementation, as shown in FIG. 26 and FIG. 27, the pattern of the first conductive layer may at least include a control electrode DT12 of the first transistor, a control electrode DT22 of the second transistor, a control electrode DT42 of the fourth transistor to a control electrode DT82 of the eighth transistor, and a first connection line VL1.

In an exemplary implementation, as shown in FIG. 26 and FIG. 27, the control electrode DT42 of the fourth transistor, the control electrode DT62 of the sixth transistor to the control electrode DT82 of the eighth transistor are of an integral structure, and the control electrode DT12 of the first transistor, the control electrode DT22 of the second transistor and the control electrode DT52 of the fifth transistor may be separately arranged.

In an exemplary implementation, the shapes of the control electrode T12 of the first transistor and the control electrode DT22 of the second transistor and the first connection line VL1 in FIG. 26 are the same as those of the control electrode DT12 of the first transistor and the control electrode DT22 of the second transistor and the first connection line VL1 in FIG. 15.

In an exemplary implementation, as shown in FIG. 26 and FIG. 27, the control electrode DT42 of the fourth transistor may be a dressing structure with an opening facing the display region, the control electrode DT62 of the sixth transistor to the control electrode DT82 of the eighth transistor are located on a side of the comb back of the control electrode DT42 of the fourth transistor away from the display region, the control electrode DT62 of the sixth transistor and the control electrode DT72 of the seventh transistor may be in a shape of a line extending along the second direction D2, and the control electrode DT82 of the eighth transistor may be in a shape of "n" with an opening facing the display region.

(3) A pattern of a third insulation layer is formed. In an exemplary implementation, forming the pattern of the third insulation layer may include: depositing a second insulation thin film and a third insulation thin film on the base substrate on which the aforementioned patterns are formed, and patterning the second insulation thin film and the third insulation thin film by a patterning process, to form a second insulation layer and a third insulation layer covering the first conductive layer, wherein a pattern of a plurality of via holes are arranged on the third insulation layer, as shown in FIG. 28, and FIG. 28 is a schematic diagram after the pattern of the third insulation layer is formed in FIG. 10A.

Figure 28:
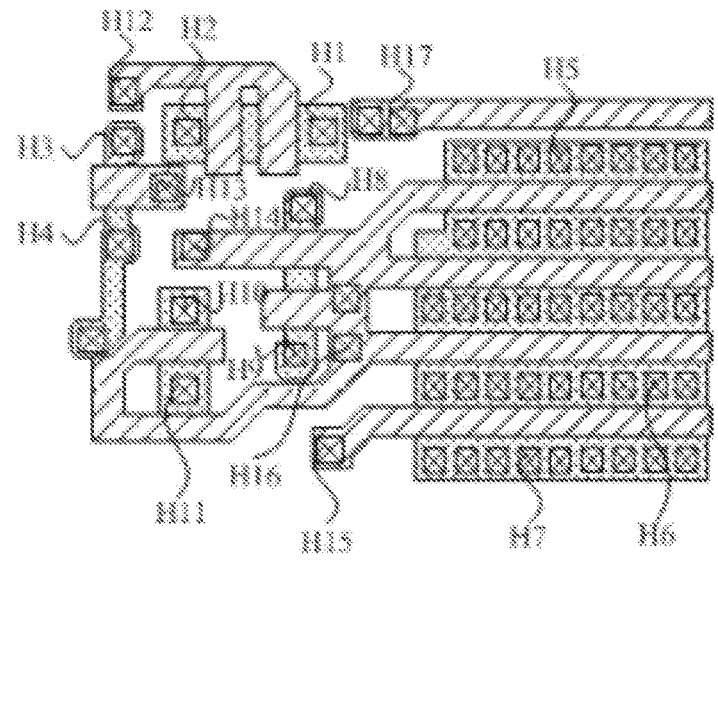
FIG. 28 is a schematic diagram after a pattern of a third insulation layer is formed for the display substrate in FIG. 10A.

In an exemplary implementation, as shown in FIG. 28, the pattern of the plurality of the via holes may at least include a first via hole H1 to a seventeenth via hole H17. The first via hole H1 to the eleventh via hole H11 are provided in the first insulation layer to the third insulation layer, and the twelfth via hole H12 to the seventeenth via hole H17 are provided in the second insulation layer and the third insulation layer. Herein, the first via hole H1 exposes the first region of the active layer of the first transistor, the second via hole H2 exposes the second region of the active layer of the first transistor, the third via hole H3 exposes the first region of the active layer of the second transistor, the fourth via hole H4 exposes the second region of the active layer of the second transistor, the fifth via hole H5 exposes the first region of the active layer of the fourth transistor, the sixth via hole H6 exposes the second region of the active layer of the fourth transistor (the second region of the active layer of the fifth transistor), the seventh via hole H7 exposes the first region of the active layer of the fifth transistor, the eighth via hole H8 exposes the first region of the active layer of the sixth transistor, the ninth via hole H9 exposes the second region of the active layer of the seventh transistor, the tenth via hole H10 exposes the first region of the active layer of the eighth transistor, the eleventh via hole H11 exposes the second region of the active layer of the eighth transistor, the twelfth via hole H12 exposes the control electrode of the first transistor, the thirteenth via hole H13 exposes the control electrode of the second transistor, the fourteenth via hole H14 exposes the control electrode of the sixth transistor, the fifteenth via hole H15 exposes the control electrode of the fifth transistor, the sixteenth via hole H16 exposes the control electrode of the fourth transistor, and the seventeenth via hole H17 exposes the first connection line.

Figure 29:
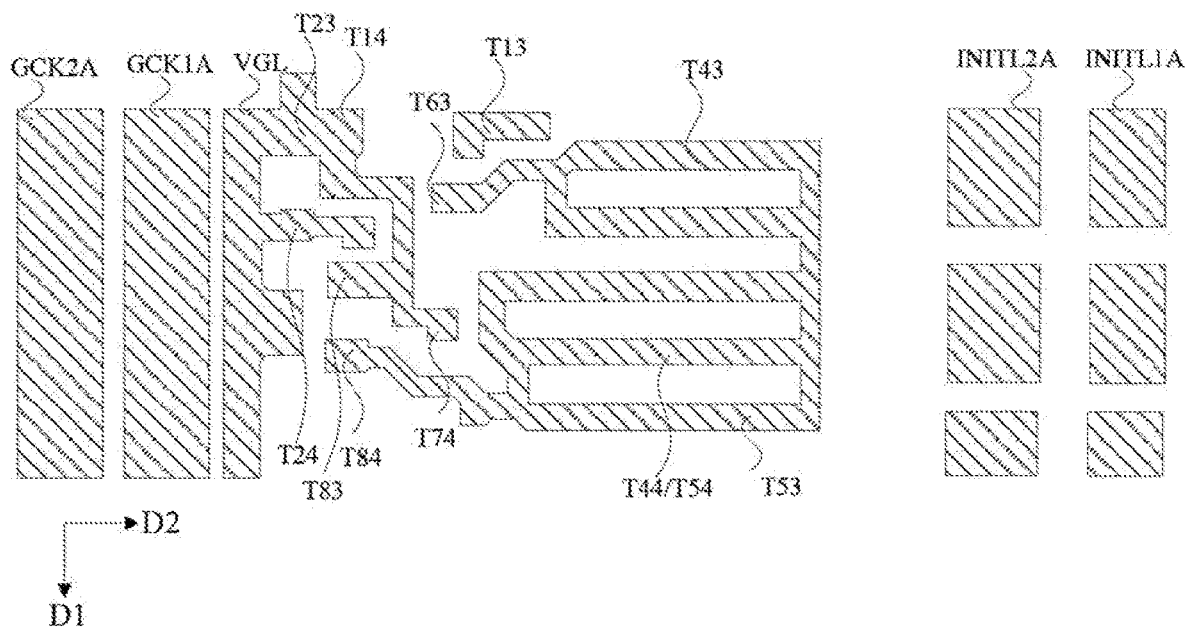
FIG. 29 is a schematic diagram of a pattern of a third conductive layer for the display substrate in FIG. 10A.
Figure 30:
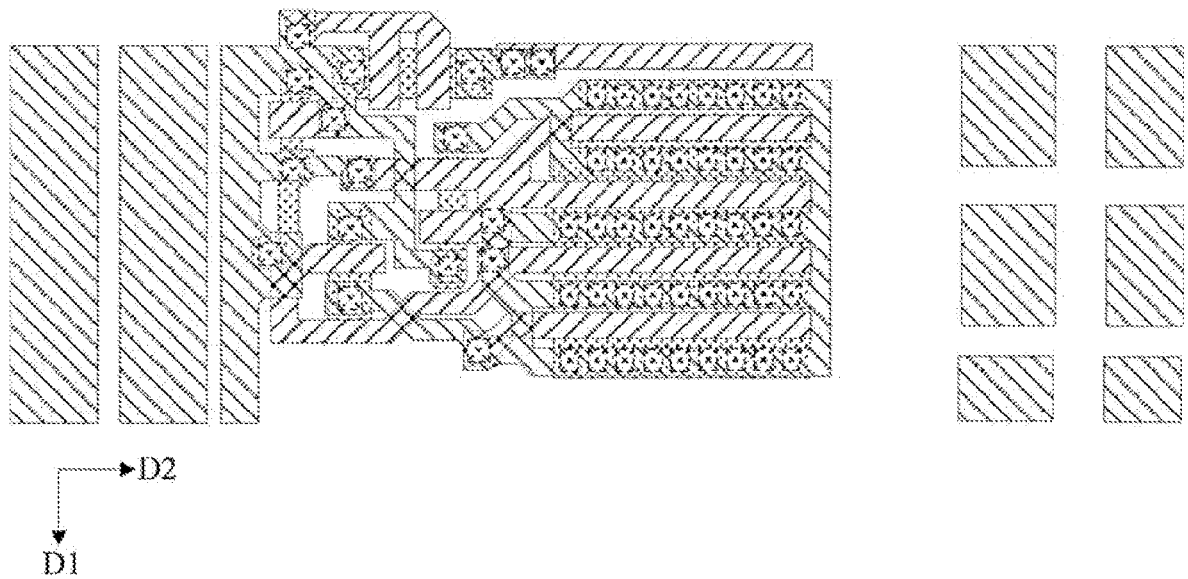
FIG. 30 is a schematic diagram after the pattern of the third conductive layer is formed for the display substrate in FIG. 10A.

(4) A pattern of a third conductive layer is formed. In an exemplary implementation, forming the third conductive layer may include depositing a third conductive thin film on the base substrate on which the aforementioned patterns are formed, patterning the third conductive thin film by using a patterning process to form a third conductive layer arranged on the third insulation layer, as shown in FIG. 29 to FIG. 30, wherein FIG. 29 is a schematic diagram of a pattern of a third conductive layer of FIG. 10A, and FIG. 30 is a schematic diagram after the pattern of the third conductive layer is formed in FIG. 10A. In an exemplary implementation, the third conductive layer may be referred to as a first source-drain metal (SD1) layer.

In an exemplary implementation, as shown in FIG. 29 and FIG. 30, the pattern of the third conductive layer may at least include a first clock sub-segment GCK1A of the first clock signal line, a first clock sub-segment GCK2A of the second clock signal line, a second power supply line VGL, a first initial sub-segment INITL1A of the first initial power supply line, a first initial sub-segment INITL2A of the second initial power supply line, a first electrode T13 and second electrode T14 of the first transistor, a first electrode T23 and second electrode T24 of the second transistor, a first electrode T43 and second electrode T44 of the fourth transistor, a first electrode T53 and first electrode T54 of the fifth transistor, a first electrodes T63 of the sixth transistor, a second electrode T74 of the seventh transistor, and a first electrode T83 and second electrode T84 of the eighth transistor.

In an exemplary implementation, the first clock sub-segment GCK2A of the second clock signal line, the first clock sub-segment GCK1A of the first clock signal line, the second power supply line VGL, the first initial sub-segment INITL1A of the first initial power supply line and the first initial sub-segment INITL2A of the second initial power supply line in FIG. 29 and FIG. 30 are the same as the first clock sub-segment GCK2A of the second clock signal line, the first clock sub-segment GCK1A of the first clock signal line, the second power supply line VGL, the first initial sub-segment INITL1A of the first initial power supply line and the first initial sub-segment INITL2A of the second initial power supply line in FIG. 20 and FIG. 21.

In an exemplary implementation, as shown in FIG. 29 and FIG. 30, the second power supply line VGL, and the second electrode of the first transistor, the first electrode T23 and second electrode T24 of the second transistor, the second electrode T74 of the seventh transistor and the first electrode T83 of the eighth transistor are of an integral structure. The second electrode of the first transistor, the first electrode T23 and second electrode T24 of the second transistor, the second electrode T74 of the seventh transistor and the first electrode T83 of the eighth transistor are located on a side of the second power supply line VGL close to the display region. The integral structure of the second power supply line VGL, the second electrode of the first transistor, the first electrode T23 and second electrode T24 of the second transistor, the second electrode T74 of the seventh transistor and the first electrode T83 of the eighth transistor is connected to the first region of the active layer of the first transistor through the second via hole, to the first region of the active layer of the second transistor through the third via hole, to the second region of the active layer of the second transistor through the fourth via hole, to the second region of the active layer of the seventh transistor through the ninth via hole, to the first region of the active layer of the eighth transistor through the tenth via hole H10, and to the control electrode of the first transistor through the twelfth via hole.

In an exemplary implementation, the first electrode T13 of the first transistor shown in FIG. 29 and FIG. 30 is the same as the first electrode T13 of the first transistor in FIG. 20 and FIG. 21.

In an exemplary implementation, as shown in FIG. 29 and FIG. 30, the first electrode T43 and the second electrode T44 of the fourth transistor, the first electrode T53 and the second electrode T54 of the fifth transistor, the first electrode T63 of the sixth transistor, and the second electrode T84 of the eighth transistor are of an integral structure, and the integral structure thereof is connected to the first region of the active layer of the fourth transistor through the fifth via hole, to the second region of the active layer of the fourth transistor (the second region of the active layer of the fifth transistor) through the sixth via hole, to the first region of the active layer of the fifth transistor through the seventh via hole, to the first region of the active layer of the sixth transistor through the eighth via hole, to the second region of the active layer of the eighth transistor through the eleventh via hole, to the control electrode of the second transistor through the thirteenth via hole, to the control electrode of the fifth transistor through the fifteenth via hole, and to the control electrode of the fourth transistor through the sixteenth via hole.

Figure 31:
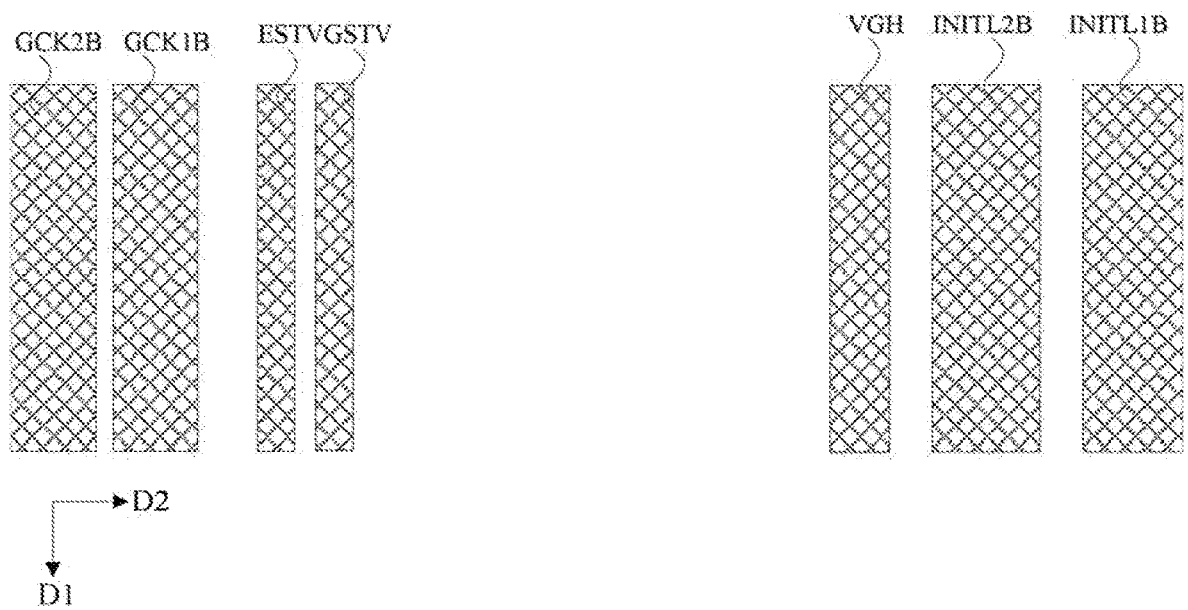
FIG. 31 is a schematic diagram of a fourth conductive layer for the display substrate for the display substrate in FIG. 10A.
Figure 32:
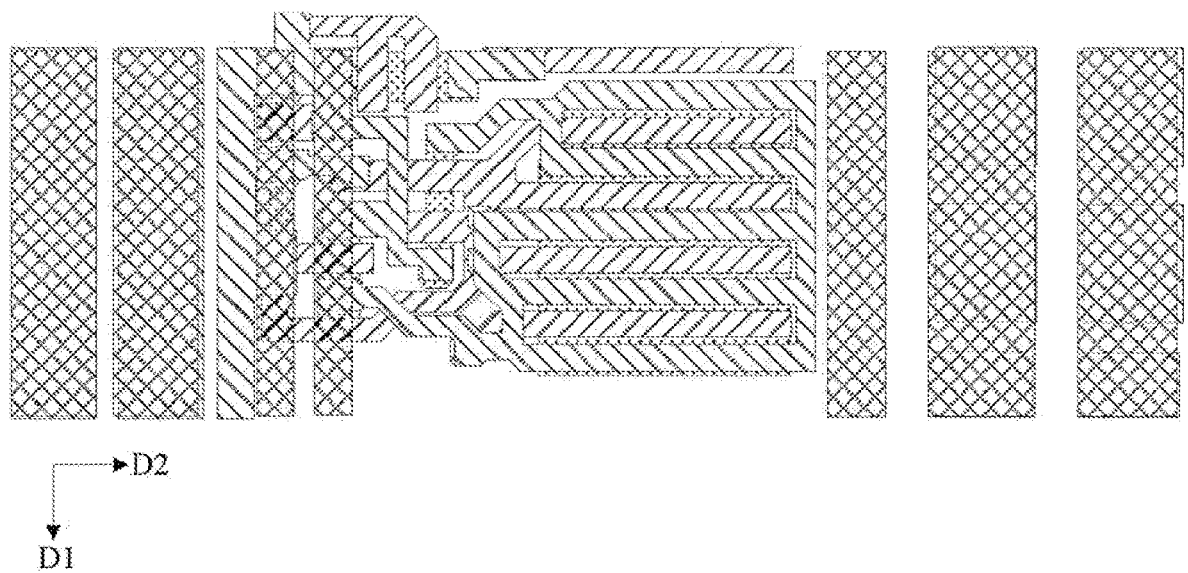
FIG. 32 is a schematic diagram after a pattern of the fourth conductive layer is formed for the display substrate in FIG. 10A.

(5) A pattern of a fourth conductive layer is formed. In an exemplary implementation, forming the fourth conductive layer may include: sequentially depositing a fourth insulation thin film and a fourth conductive thin film on the base substrate on which the aforementioned patterns are formed, and patterning the fourth insulation thin film, and the fourth conductive thin film by using a patterning process to form a fourth insulation layer covering the third semiconductor layer, and a fourth conductive layer arranged on the fourth insulation layer, as shown in FIG. 31 and FIG. 32, FIG. 31 is a schematic diagram of the fourth conductive layer in FIG. 10A, and FIG. 32 is a schematic diagram of the fourth conductive layer is formed in FIG. 10A. In an exemplary implementation, the fourth conductive layer may be referred to as a second source-drain metal (SD2) layer.

In an exemplary implementation, as shown in FIG. 31 and FIG. 32, the pattern of the fourth conductive layer may at least include a second clock sub-segment GCK1B of the first clock signal line, a second clock sub-segment GCK2B of the second clock signal line, a first power supply line VGH, a second initial sub-segment INITL1B of the first initial power supply line, a second initial sub-segment INITL2B of the second initial power supply line, a first initial signal line GSTV, and a second initial signal line ESTV. The second clock sub-segment GCK1B of the first clock signal line, the second clock sub-segment GCK2B of the second clock signal line, the first power supply line VGH, the second initial sub-segment INITL1B of the first initial power supply line, the second initial sub-segment INITL2B of the second initial power supply line, the first initial signal line GSTV and the second initial signal line ESTV in FIG. 31 and FIG. 32 have the same structures as the second clock sub-segment GCK1B of the first clock signal line, the second clock sub-segment GCK2B of the second clock signal line, the first power supply line VGH, the second initial sub-segment INITL1B of the first initial power supply line, the second initial sub-segment INITL2B of the second initial power supply line, the first initial signal line GSTV and the second initial signal line ESTV in FIG. 23 and FIG. 24, and the difference is spacings between signal lines.

In the exemplary implementation, after preparation of the drive circuit layer is completed, a light emitting structure layer is prepared on the drive circuit layer, and the preparation process of the light emitting structure layer is consistent with the preparation process provided in the aforementioned embodiments, and will not be described herein.

Exemplary description is made through the preparation process of FIG. 10B, which shows a dummy scan shift register including a first transistor DT1, a second transistor DT2, and a sixth transistor DT6 to an eighth transistor DT8.

(1) A pattern of a semiconductor layer is formed on the base substrate. In an exemplary implementation, forming the pattern of the semiconductor layer may include depositing a semiconductor thin film on the base substrate, and patterning the semiconductor thin film by a patterning process to form the pattern of the semiconductor layer, as shown in FIG. 33, which is a schematic diagram after the pattern of the semiconductor layer in FIG. 10A is formed.

Figure 33:
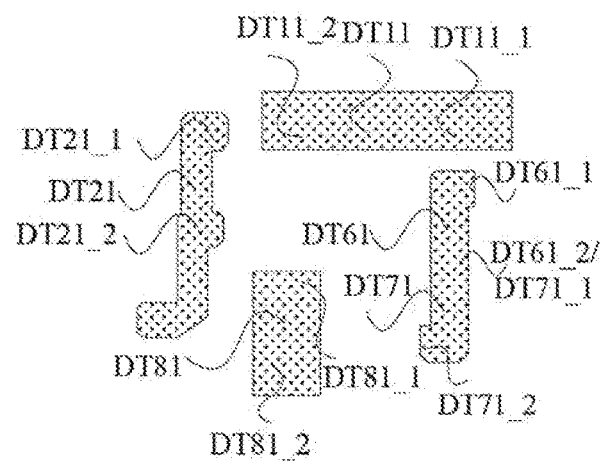
FIG. 33 is a schematic diagram after a pattern of a semiconductor layer is formed for the display substrate in FIG. 10B.

In an exemplary implementation, as shown in FIG. 33, the pattern of the semiconductor layer may include an active layer DT11 of a first transistor, an active layer DT21 of a second transistor, and an active layer DT61 of a sixth transistor to an active layer DT81 of an eighth transistor.

In an exemplary implementation, the active layer DT11 of the first transistor, the active layer DT21 of the second transistor, and the active layer DT61 of the sixth transistor to the active layer DT81 of the eighth transistor in FIG. 33 are identical in positions and structures to the active layer T11 of the first transistor, the active layer T21 of the second transistor, and the active layer T61 of the sixth transistor to the active layer T81 of the eighth transistor in FIG. 14.

Figure 34:
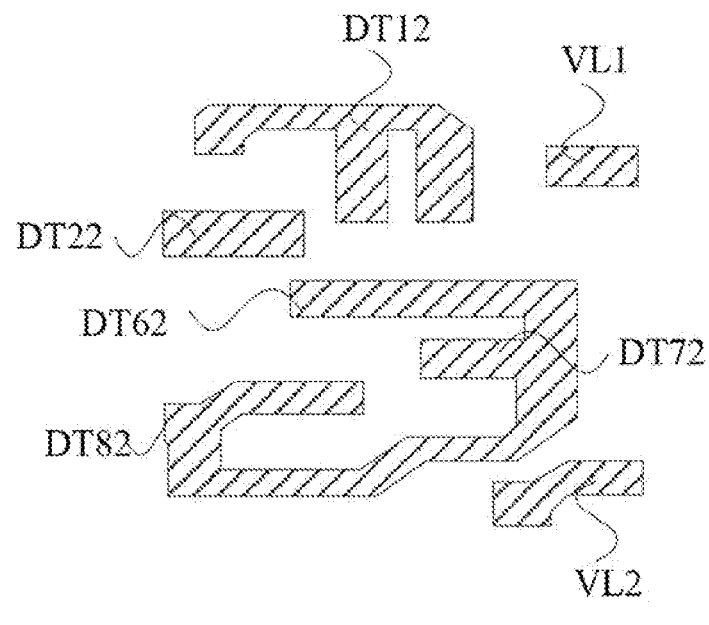
FIG. 34 is a schematic diagram of a pattern of a first conductive layer for the display substrate in FIG. 10B.
Figure 35:
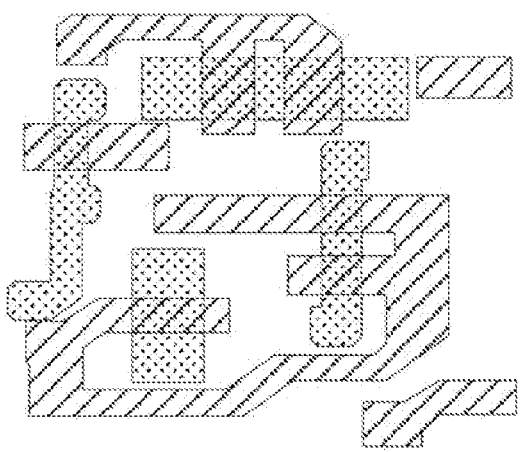
FIG. 35 is a schematic diagram after the pattern of the first conductive layer is formed for the display substrate in FIG. 10B.

(2) A pattern of a first conductive layer is formed. In an exemplary implementation, forming the pattern of the first conductive layer may include: sequentially depositing a first insulation thin film and a first conductive thin film on the base substrate on which the aforementioned patterns are formed, and patterning the first conductive thin film by a patterning process to form a first insulation layer that covers the pattern of the semiconductor layer and the pattern of the first conductive layer arranged on the first insulation layer, as shown in FIG. 34 and FIG. 35, FIG. 34 is a schematic diagram of a pattern of the first conductive layer in FIG. 10B, and FIG. 35 is a schematic diagram after a pattern of the first conductive layer is formed in FIG. 10B. In an exemplary implementation, the first conductive layer may be referred to as a first gate metal (GATE1) layer.

In an exemplary implementation, as shown in FIG. 34 and FIG. 35, the pattern of the first conductive layer may at least include a control electrode DT12 of the first transistor, a control electrode DT22 of the second transistor, a control electrode DT62 of the sixth transistor to a control electrode DT82 of the eighth transistor, a first connection line VL1 and a second connection line VL2.

In an exemplary implementation, as shown in FIG. 34 and FIG. 35, the control electrode T62 of the sixth transistor to the control electrode DT82 of the eighth transistor are of an integral structure.

In an exemplary implementation, the shapes of the control electrode T12 of the first transistor and the control electrode DT22 of the second transistor and the first connection line VL1 in FIG. 34 are the same as those of the control electrode DT12 of the first transistor and the control electrode DT22 of the second transistor and the first connection line VL1 in FIG. 25.

(3) A pattern of a third insulation layer is formed. In an exemplary implementation, forming the pattern of the third insulation layer may include: depositing a second insulation thin film and a third insulation thin film on the base substrate on which the aforementioned patterns are formed, and patterning the second insulation thin film and the third insulation thin film by a patterning process, to form a second insulation layer and a third insulation layer covering the first conductive layer, wherein a pattern of a plurality of via holes is arranged on the third insulation layer, as shown in FIG. 36, and FIG. 36 is a schematic diagram after the pattern of the third insulation layer is formed in FIG. 10B.

Figure 36:
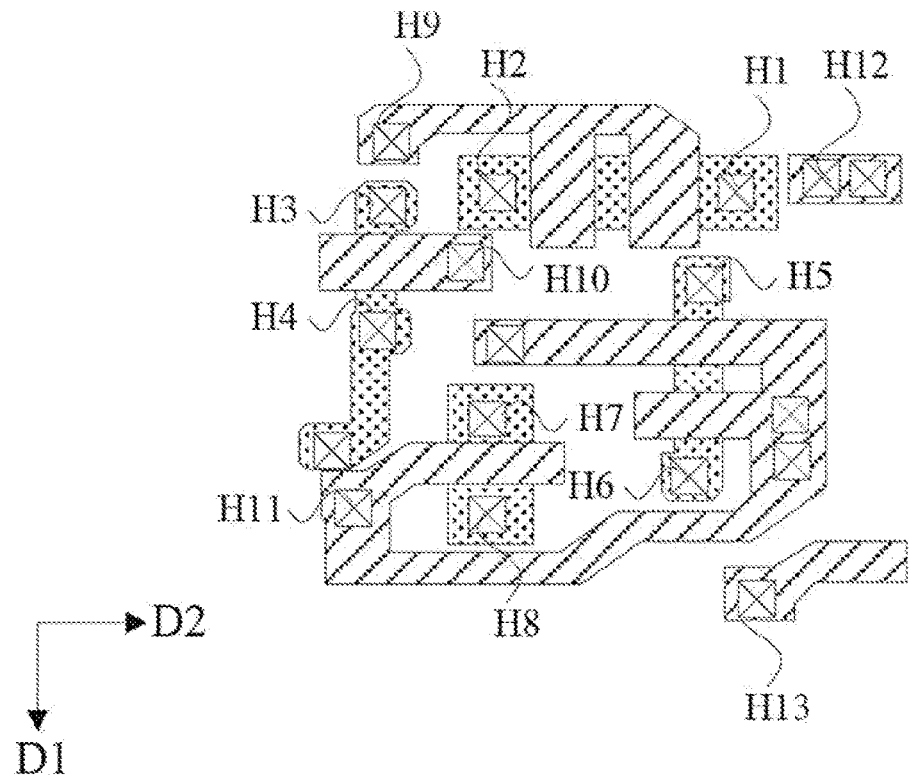
FIG. 36 is a schematic diagram after a pattern of a third insulation layer is formed for the display substrate in FIG. 10B.

In an exemplary implementation, as shown in FIG. 36, the pattern of the plurality of the via holes may at least include a first via hole H1 to a thirteenth via hole H13. The first via hole H1 to the eighth via hole H8 are provided in the first insulation layer to third insulation layer, and the ninth via hole H9 to the thirteenth via hole H13 are provided in the second insulation layer and the third insulation layer. Herein, the first via hole H1 exposes the first region of the active layer of the first transistor, the second via hole H2 exposes the second region of the active layer of the first transistor, the third via hole H3 exposes the first region of the active layer of the second transistor, the fourth via hole H4 exposes the second region of the active layer of the second transistor, the fifth via hole H5 exposes the first region of the active layer of the sixth transistor, the sixth via hole H6 exposes the second region of the active layer of the seventh transistor, the seventh via hole H7 exposes the first region of the active layer of the eighth transistor, the eighth via hole H8 exposes the second region of the active layer of the eighth transistor, the ninth via hole H9 exposes the control electrode of the first transistor, the tenth via hole H10 exposes the control electrode of the second transistor, the eleventh via hole H11 exposes the integral structure of the control electrode of the sixth transistor, the control electrode of the seventh transistor and the control electrode of the eighth transistor, the twelfth via hole H12 exposes the first connection line, and the thirteenth via hole H13 exposes the second connection line.

Figure 37:
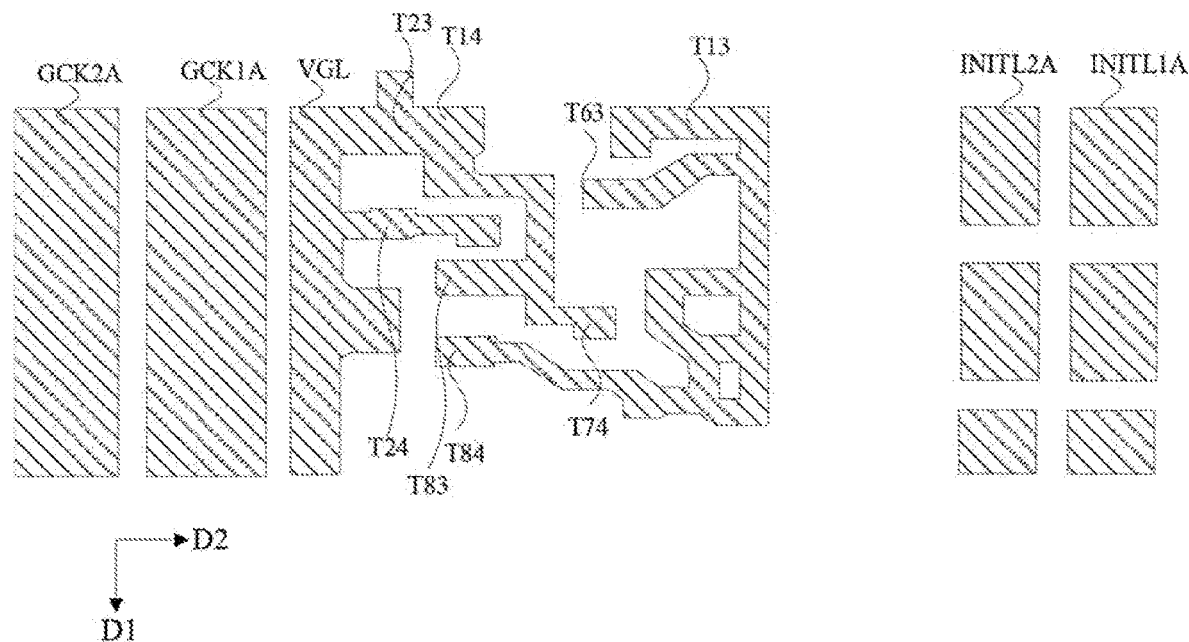
FIG. 37 is a schematic diagram of a pattern of a third conductive layer for the display substrate in FIG. 10B.
Figure 38:
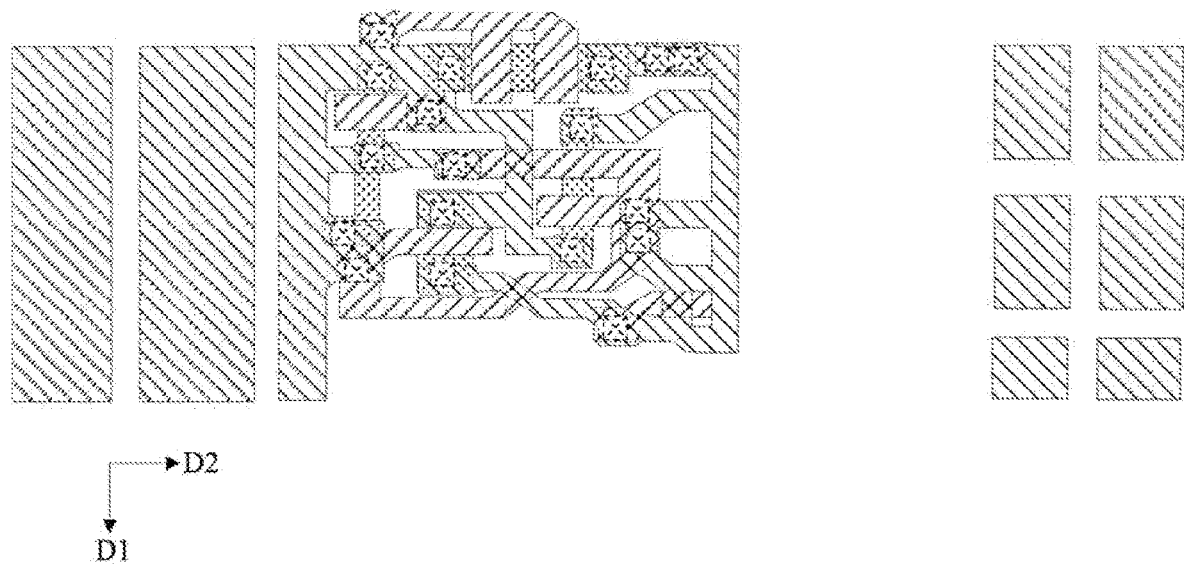
FIG. 38 is a schematic diagram after the pattern of the third conductive layer is formed for the display substrate in FIG. 10B.

(4) A pattern of a third conductive layer is formed. In an exemplary implementation, forming the pattern of the third conductive layer may include depositing a third conductive thin film on the base substrate on which the aforementioned patterns are formed, patterning the third conductive thin film by using a patterning process to form a third conductive layer arranged on the third insulation layer, as shown in FIG. 37 to FIG. 38, wherein FIG. 37 is a schematic diagram of a pattern of a third conductive layer in FIG. 10B, and FIG. 38 is a schematic diagram after a pattern of the third conductive layer is formed in FIG. 10B. In an exemplary implementation, the third conductive layer may be referred to as a first source-drain metal (SD1) layer.

In an exemplary implementation, as shown in FIG. 37 and FIG. 38, the pattern of the third conductive layer may at least include a first clock sub-segment GCK1A of the first clock signal line, a first clock sub-segment GCK2A of the second clock signal line, a second power supply line VGL, a first initial sub-segment INITL1A of the first initial power supply line, a first initial sub-segment INITL2A of the second initial power supply line, a first electrode T13 and second electrode T14 of the first transistor, a first electrode T23 and second electrode T24 of the second transistor, a first electrode T63 of the sixth transistor, a second electrode T74 of the seventh transistor, and a first electrode T83 and second electrode T84 of the eighth transistor.

In an exemplary implementation, the first clock sub-segment GCK2A of the second clock signal line, the first clock sub-segment GCK1A of the first clock signal line, the second power supply line VGL, the first initial sub-segment INITL1A of the first initial power supply line and the first initial sub-segment INITL2A of the second initial power supply line in FIG. 37 and FIG. 38 are the same as the first clock sub-segment GCK2A of the second clock signal line, the first clock sub-segment GCK1A of the first clock signal line, the second power supply line VGL, the first initial sub-segment INITL1A of the first initial power supply line and the first initial sub-segment INITL2A of the second initial power supply line in FIG. 20 and FIG. 21.

In an exemplary implementation, as shown in FIG. 37 and FIG. 38, the second power supply line VGL, the second electrode of the first transistor, the first electrode T23 and second electrode T24 of the second transistor, the second electrode T74 of the seventh transistor and the first electrode T83 of the eighth transistor are of an integral structure. The integral structure of the second power supply line VGL, the second electrode of the first transistor, the first electrode T23 and second electrode T24 of the second transistor, the second electrode T74 of the seventh transistor and the first electrode T83 of the eighth transistor are the same as the second power supply line VGL, the second electrode of the first transistor, the first electrode T23 and second electrode T24 of the second transistor, the second electrode T74 of the seventh transistor and the first electrode T83 of the eighth transistor, and is connected to the first region of the active layer of the first transistor through the second via hole, to the first region of the active layer of the second transistor through the third via hole, to the second region of the active layer of the second transistor through the fourth via hole, to the second region of the active layer of the seventh transistor through the sixth via hole, to the first region of the active layer of the eighth transistor through the seventh via hole, and to the control electrode of the first transistor through the ninth via hole.

In an exemplary implementation, as shown in FIG. 37 and FIG. 38, the first electrode T13 of the first transistor, the first electrode T63 of the sixth transistor and the second electrode T84 of the eighth transistor are of an integral structure, and the integral structure thereof is connected to the first region of the active layer of the first transistor through the first via hole, to the first connection line through the twelfth via hole, to the first region of the active layer of the sixth transistor through the fifth via hole, to the second region of the active layer of the eighth transistor through the eighth via hole, expose the integral structure of the control electrode of the sixth transistor, the control electrode of the seventh transistor and the control electrode of the eighth transistor through the eleventh via hole, and to the second connection line through the thirteenth via hole.

Figure 39:
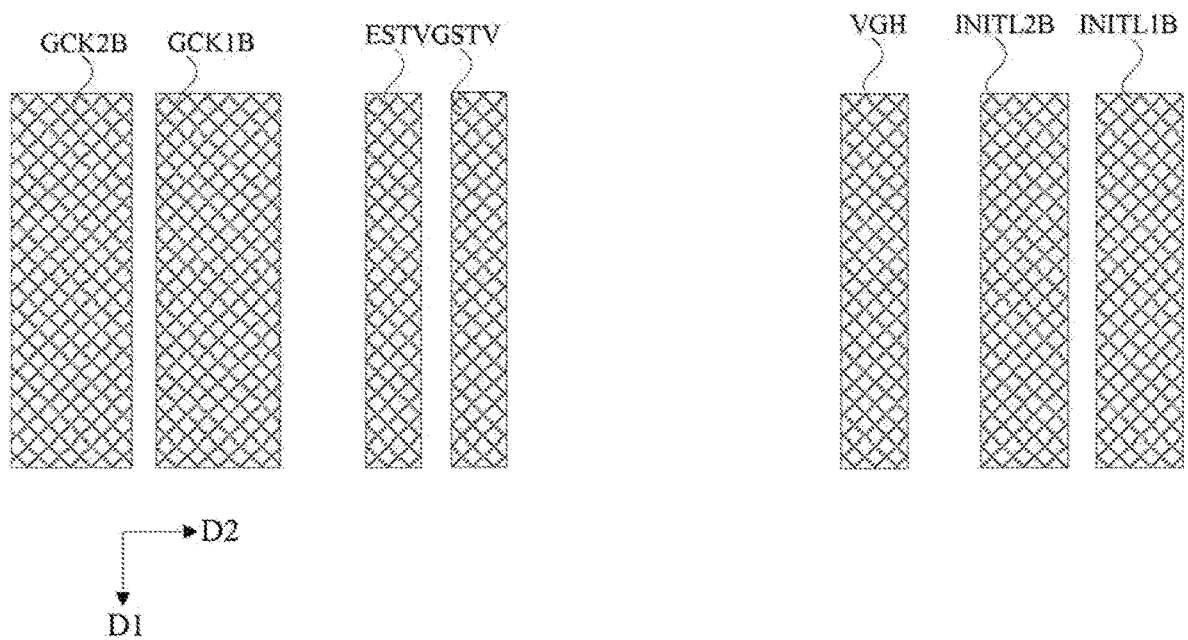
FIG. 39 is a schematic diagram of a fourth conductive layer for the display substrate in FIG. 10B.
Figure 40:
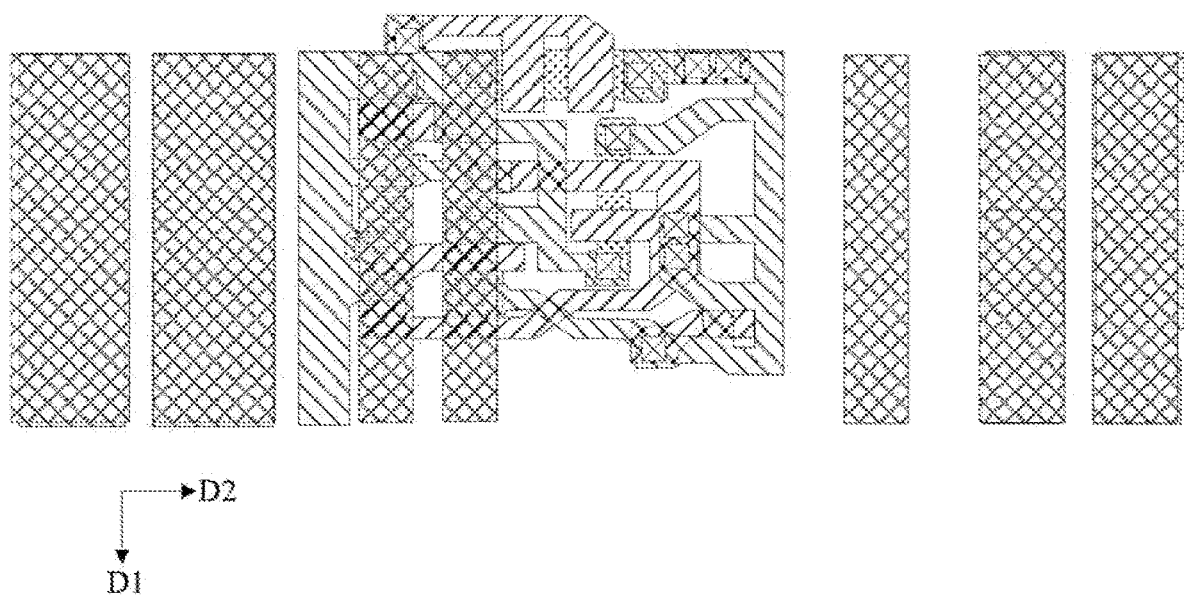
FIG. 40 is a schematic diagram of the fourth conductive layer is formed for the display substrate in FIG. 10B.

(5) A pattern of a fourth conductive layer is formed. In an exemplary implementation, forming the fourth conductive layer may include: sequentially depositing a fourth insulation thin film and a fourth conductive thin film on the base substrate on which the aforementioned patterns are formed, and patterning the fourth insulation thin film, and the fourth conductive thin film by using a patterning process to form a fourth insulation layer covering the third conductive layer, and a fourth conductive layer arranged on the fourth insulation layer, as shown in FIG. 39 and FIG. 40, wherein FIG. 39 is a schematic diagram of the fourth conductive layer in FIG. 10B, and FIG. 40 is a schematic diagram of the fourth conductive layer formed in FIG. 10B. In an exemplary implementation, the fourth conductive layer may be referred to as a second source-drain metal (SD2) layer.

In an exemplary implementation, as shown in FIG. 39 and FIG. 40, the pattern of the fourth conductive layer may at least include a second clock sub-segment GCK1B of the first clock signal line, a second clock sub-segment GCK2B of the second clock signal line, a first power supply line VGH, a second initial sub-segment INITL1B of the first initial power supply line, a second initial sub-segment INITL2B of the second initial power supply line, a first initial signal line GSTV, and a second initial signal line ESTV. The second clock sub-segment GCK1B of the first clock signal line, the second clock sub-segment GCK2B of the second clock signal line, the first power supply line VGH, the second initial sub-segment INITL1B of the first initial power supply line, the second initial sub-segment INITL2B of the second initial power supply line, the first initial signal line GSTV and the second initial signal line ESTV in FIG. 39 and FIG. 40 have the same structures as the second clock sub-segment GCK1B of the first clock signal line, the second clock sub-segment GCK2B of the second clock signal line, the first power supply line VGH, the second initial sub-segment INITL1B of the first initial power supply line, the second initial sub-segment INITL2B of the second initial power supply line, the first initial signal line GSTV and the second initial signal line ESTV in FIG. 23 and FIG. 24, and the difference is spacings between signal lines.

In the exemplary implementation, after preparation of the drive circuit layer is completed, a light emitting structure layer is prepared on the drive circuit layer and the preparation process of the light emitting structure layer is consistent with the preparation process provided in the aforementioned embodiments, and will not be described herein.

A width of a scan shift register in a display substrate provided by an embodiment of the present disclosure may be about 200 microns to 220 microns, and exemplarily, a width of a scan shift register in a display substrate may be about 210 microns.

Through simulation, the load at the same position as well as the time of the rising edge and the falling edge of the data signal of the display substrate provided by an embodiment of the disclosure are compared with those of the reference display substrate, and it is found that there is little difference between the two, that is, the display substrate provided by the embodiment of the disclosure reduces the area occupied by the bezel region of the display substrate without affecting the picture quality, achieving a narrow bezel.

The display substrate according to the embodiment of the present disclosure may be applied to a display product with any resolution.

An embodiment of the present disclosure also provides a display device, including a display substrate.

In an exemplary implementation, the display apparatus may be any product or component with any display function, such as a display, a television, a mobile phone, a tablet computer, a navigator, a digital photo frame, and a wearable display product.

The display substrate is the display substrate according to any of the aforementioned embodiments, and has similar implementation principles and implementation effects, which will not be repeated here.

The drawings in the present disclosure relate only to the structures involved in the embodiments of the present disclosure, and other structures may refer to conventional designs.

For the sake of clarity, a thickness and size of a layer or a micro structure are enlarged in the accompanying drawings used to describe the embodiments of the present disclosure. It can be understood that when an element such as a layer, film, region or substrate is described as being "on" or "under" another element, this element may be "directly" located "on" or "under" the another element, or there may be an intermediate element.

Although the implementations disclosed in the present disclosure are as above, the described contents are only implementations used for convenience of understanding the present disclosure and are not intended to limit the present disclosure. Any skilled person in the art to which the present invention pertains can make any modifications and alterations in forms and details of implementations without departing from the spirit and scope of the present disclosure. However, the patent protection scope of the present disclosure should be subject to the scope defined by the appended claims.

The invention claimed is:

1. A display substrate, comprising: a base substrate and a drive circuit layer arranged on the base substrate, wherein the base substrate comprises a display region and a non-display region, and the drive circuit layer comprises a pixel drive circuit located in the display region, a gate drive circuit located in the non-display region, and at least one initial power supply line which extends at least partially along a first direction;
   the gate drive circuit is configured to provide a drive signal to the pixel drive circuit, and the initial power supply line is configured to provide an initial signal to the pixel drive circuit, wherein at least one gate drive circuit is located on at least one side of the display region respectively;
   an orthographic projection of at least one of the at least one initial power supply line on the base substrate is at least partially overlapped with an orthographic projection of the gate drive circuit on the base substrate;
   wherein one of the at least one gate drive circuit on one side of the display region comprises: a plurality of drive circuits arranged along a second direction; and the at least one initial power supply line comprises: a first initial power supply line to an N-th initial power supply line, wherein the first direction intersects with the second direction, and N is a positive integer greater than or equal to 2; and
   the N initial power supply lines are arranged along the second direction, and an orthographic projection of K adjacent initial power supply lines away from the display region on the base substrate is at least partially overlapped with an orthographic projection of a drive circuit, close to the display region, of the plurality of drive circuits on the side of the display region on the base substrate, wherein K is a positive integer less than or equal to N.

2. The display substrate according to claim 1, wherein the pixel drive circuit comprises a light emitting transistor and a writing transistor, and the plurality of drive circuits comprise a light emitting drive circuit and a scan drive circuit, wherein the light emitting drive circuit is electrically connected to the light emitting transistor, and the scan drive circuit is electrically connected to the writing transistor, and is located on a side of the light emitting drive circuit close to the display region; and
   an orthographic projection of the at least one initial power supply line on the base substrate is at least partially overlapped with an orthographic projection of the scan drive circuit on the base substrate;
   or
   wherein the pixel drive circuit comprises a light emitting transistor, a writing transistor, and a control transistor, and the plurality of drive circuits comprise a light emitting drive circuit, a scan drive circuit, and a control drive circuit, wherein the light emitting drive circuit is electrically connected to the light emitting transistor, the scan drive circuit is electrically connected to the writing transistor, the control drive circuit is electrically connected to the control transistor, and the writing transistor and the control transistor have opposite transistor types; and the light emitting drive circuit and the control drive circuit are located on a side of the scan drive circuit away from the display region; and
   an orthographic projection of the at least one initial power supply line on the base substrate is at least partially overlapped with an orthographic projection of the scan drive circuit on the base substrate.

3. The display substrate according to claim 2, wherein the orthographic projection of the K adjacent initial power supply lines away from the display region on the base substrate is at least partially overlapped with an orthographic projection of the scan drive circuit on the base substrate.

4. The display substrate according to claim 3, wherein the drive circuit layer further comprises: a first clock signal line, a second clock signal line, a first initial signal line, a first power supply line, and a second power supply line, which are located in the non-display region, wherein the first clock signal line, the second clock signal line, the first initial signal line, the first power supply line, and the second power supply line extend at least partially along the first direction;
   the scan drive circuit is electrically connected with the first clock signal line, the second clock signal line, the first power supply line, the second power supply line and the first initial signal line, respectively; and
   the second clock signal line is located on a side of the first clock signal line away from the display region, the second power supply line is located on a side of the first clock signal line close to the display region, the first initial signal line is located on a side of the second power supply line close to the display region, the first power supply line is located on a side of the first initial signal line close to the display region, and the at least one initial power supply line is located on a side of the first power supply line close to the display region.

5. The display substrate according to claim 4, wherein the driver circuit layer further comprises: a second initial signal line located in the non-display region, and the second initial signal line extends at least partially along the first direction; and
   the light emitting drive circuit is electrically connected with the second initial signal line, and the second initial signal line is located between the second power supply line and the first initial signal line.

6. The display substrate according to claim 5, wherein the drive circuit layer further comprises a first output signal line and a second output signal line which are located in the non-display region, and the first output signal line and the second output signal line extend at least partially along the second direction;

the first output signal line is located on a side of the scan drive circuit close to the display region, and is electrically connected with the scan drive circuit and the pixel drive circuit, respectively; and the second output signal line passes through the scan drive circuit, and is electrically connected to the pixel drive circuit and one of the light emitting drive circuit and the control drive circuit, respectively.

7. The display substrate according to claim 6, wherein the drive circuit layer further comprises: a first output connection line and a second output connection line which are located in the display region and the non-display region, and the first output connection line and the second output connection line extend at least partially along the second direction;

the first output connection line is electrically connected with the first output signal line and the pixel drive circuit, respectively; and the second output connection line is electrically connected with the second output signal line and the pixel drive circuit, respectively.

8. The display substrate according to claim 7, wherein the drive circuit layer further comprises: a third output connection line and a fourth output connection line, and the third output connection line and the fourth output connection line extend at least partially along the second direction;

the third output connection line is electrically connected with the first initial power supply line and the pixel drive circuit, respectively; and the fourth output connection line is electrically connected with a second initial power supply line and the pixel drive circuit, respectively.

9. The display substrate according to claim 4, wherein a boundary of the display region comprises an arc-shaped boundary, and a non-display region located outside the arc-shaped boundary is referred to as a rounded corner region;

the scan drive circuit comprises a plurality of scan shift registers and a plurality of dummy scan shift registers, wherein the plurality of scan shift registers are cascaded, and the plurality of dummy scan shift registers are interspersed between the plurality of scan shift registers; and at least a part of the plurality of dummy scan shift registers are located in the rounded corner region.

10. The display substrate according to claim 9, wherein the scan shift register comprises: a plurality of transistors and a plurality of capacitors; and an orthographic projection of the initial power supply line, which is overlapped with the scan drive circuit, on the base substrate is at least partially overlapped with an orthographic projection of the plurality of capacitors on the base substrate.

11. The display substrate according to claim 10, wherein a distance between a boundary of the initial power supply line, which is overlapped with the scan drive circuit, away from the display region and the display region is less than a distance between a boundary of at least one of the plurality of capacitors away from the display region and the display region.

12. The display substrate according to claim 10, wherein a number of transistors in the dummy scan shift register is less than or equal to a number of transistors in the scan shift register; and a width of the dummy scan shift register is less than or equal to a width of the scan shift register.

13. The display substrate according to claim 12, wherein a distance between a boundary of the second clock signal line, located on a side of the dummy scan shift register, away from the display region and a boundary, close to the display region, of an initial power supply line, close to the display region, of the at least one initial power supply line is less than a distance between a boundary of the second clock signal line, located on a side of the scan shift register, away from the display region and a boundary, close to the display region, of an initial power supply line, close to the display region, of the at least one initial power supply line.

14. The display substrate according to claim 10, wherein the drive circuit layer comprises a semiconductor layer, a first conductive layer, a second conductive layer, a third conductive layer, and a fourth conductive layer which are stacked sequentially;

the semiconductor layer at least comprises active layers of a plurality of transistors;

the first conductive layer at least comprises control electrodes of the plurality of transistors and first electrode plates of the plurality of capacitors;

the second conductive layer at least comprises second electrode plates of the plurality of capacitors, a first output signal line and a third output signal line;

the third conductive layer at least comprises a second power supply line, a first electrode and second electrode of at least one transistor, and a fourth output signal line; and the fourth conductive layer at least comprises the first initial signal line, a second initial signal line, and the first power supply line.

15. The display substrate according to claim 14, wherein the drive circuit layer further comprises: a fifth conductive layer located on a side of the fourth conductive layer away from the base substrate; and the fifth conductive layer at least comprises a first output connection line, a second output connection line, a third output connection line and a fourth output connection line;

or wherein the drive circuit layer further comprises: a sixth conductive layer located between the second conductive layer and the third conductive layer;

the second output signal line comprises a plurality of first output sub-segments and a plurality of second output sub-segments, wherein adjacent first output sub-segments are electrically connected through a second output sub-segment, adjacent second output sub-segments are electrically connected through a first output sub-segment, an orthographic projection of a second output sub-segment on the base substrate is at least partially overlapped with an orthographic projection of a first output sub-segment connected electrically to the second output sub-segment on the base substrate, and an orthographic projection of a first output sub-segment on the base substrate is at least partially overlapped with an orthographic projection of a second output sub-segment connected electrically to the first output sub-segment on the base substrate; and the first output sub-segments are located in the second conductive layer, and the second output sub-segments are located in the sixth conductive layer.

16. The display substrate according to claim 14, wherein the initial power supply line is of a single-layer structure, and the initial power supply line is located in the fourth conductive layer;
or
the initial power supply line comprises: a first initial sub-segment and a second initial sub-segment connected to each other, and an orthographic projection of the first initial sub-segment on the base substrate is at least partially overlapped with an orthographic projection of the second initial sub-segment on the base substrate; and
the first initial sub-segment is located in the third conductive layer, and the second initial sub-segment is located in the fourth conductive layer.

17. The display substrate according to claim 14, wherein the first clock signal line and the second clock signal line are of single-layer structures, and the first clock signal line and the second clock signal line are located in the fourth conductive layer;
or
a clock signal line comprises a first clock sub-segment and a second clock sub-segment connected to each other, wherein the clock signal line comprises a first clock signal line and a second clock signal line, and an orthographic projection of the first clock sub-segment on the base substrate is at least partially overlapped with an orthographic projection of the second clock sub-segment on the base substrate; and
the first clock sub-segment is located in the third conductive layer, and the second clock sub-segment, is located at a side of the fourth conductive layer close to the base substrate.

18. The display substrate according to claim 14, wherein the second output signal line is of a single-layer structure, and is located in the second conductive layer.

19. A display apparatus, comprising the display substrate according to claim 1.

\* \* \* \* \*